(12) United States Patent
Miwa et al.

(10) Patent No.: US 8,084,869 B2
(45) Date of Patent: Dec. 27, 2011

(54) SEMICONDUCTOR DEVICE AND METHOD FOR MANUFACTURING THE SAME

(75) Inventors: Takashi Miwa, Tokyo (JP); Michiaki Sugiyama, Tokyo (JP); Kazumasa Yanagisawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 377 days.

(21) Appl. No.: 12/478,837

(22) Filed: Jun. 5, 2009

(65) Prior Publication Data

US 2010/0019382 A1    Jan. 28, 2010

(30) Foreign Application Priority Data

Jul. 23, 2008 (JP) .................................. 2008-189663

(51) Int. Cl.
*H01L 23/29* (2006.01)
(52) U.S. Cl. . 257/778; 257/779; 257/734; 257/E23.021; 257/E21.499; 438/108
(58) Field of Classification Search .................. 257/712, 257/734, 737, 758, 759, 760, 777–784, E23.021, 257/E21.499; 438/106–108
See application file for complete search history.

(56) References Cited

U.S. PATENT DOCUMENTS

| 7,332,800 | B2 | 2/2008 | Kikuchi et al. |
| 7,879,655 | B2* | 2/2011 | Tsutsumi et al. ............. 438/124 |
| 2003/0042618 | A1* | 3/2003 | Nose et al. .................... 257/778 |
| 2004/0197959 | A1* | 10/2004 | Ujiie et al. .................... 438/118 |

FOREIGN PATENT DOCUMENTS

JP    2005-012037 A    1/2005

* cited by examiner

*Primary Examiner* — Hoa B Trinh
(74) *Attorney, Agent, or Firm* — Miles & Stockbridge P.C.

(57) ABSTRACT

A technique permitting the reduction in size of a semiconductor device is provided. In a BGA type semiconductor device with a semiconductor chip flip-chip-bonded onto a wiring substrate, bump electrodes of the semiconductor chip are coupled to lands formed at an upper surface of the wiring substrate. The lands at the upper surface of the wiring substrate are coupled electrically to solder balls formed on a lower surface of the wiring substrate. Therefore, the lands include first type lands with lead-out lines coupled thereto and second type lands with lead-out lines not coupled thereto but with vias formed just thereunder. The lands are arrayed in six or more rows at equal pitches in an advancing direction of the rows. However, a row-to-row pitch is not made an equal pitch. In land rows which are likely to cause a short-circuit, the pitch between adjacent rows is made large, while in land rows which are difficult to cause a short-circuit, the pitch between adjacent rows is made small. By so doing, both prevention of a short-circuit and improvement of the layout density of lands are attained at a time.

27 Claims, 27 Drawing Sheets

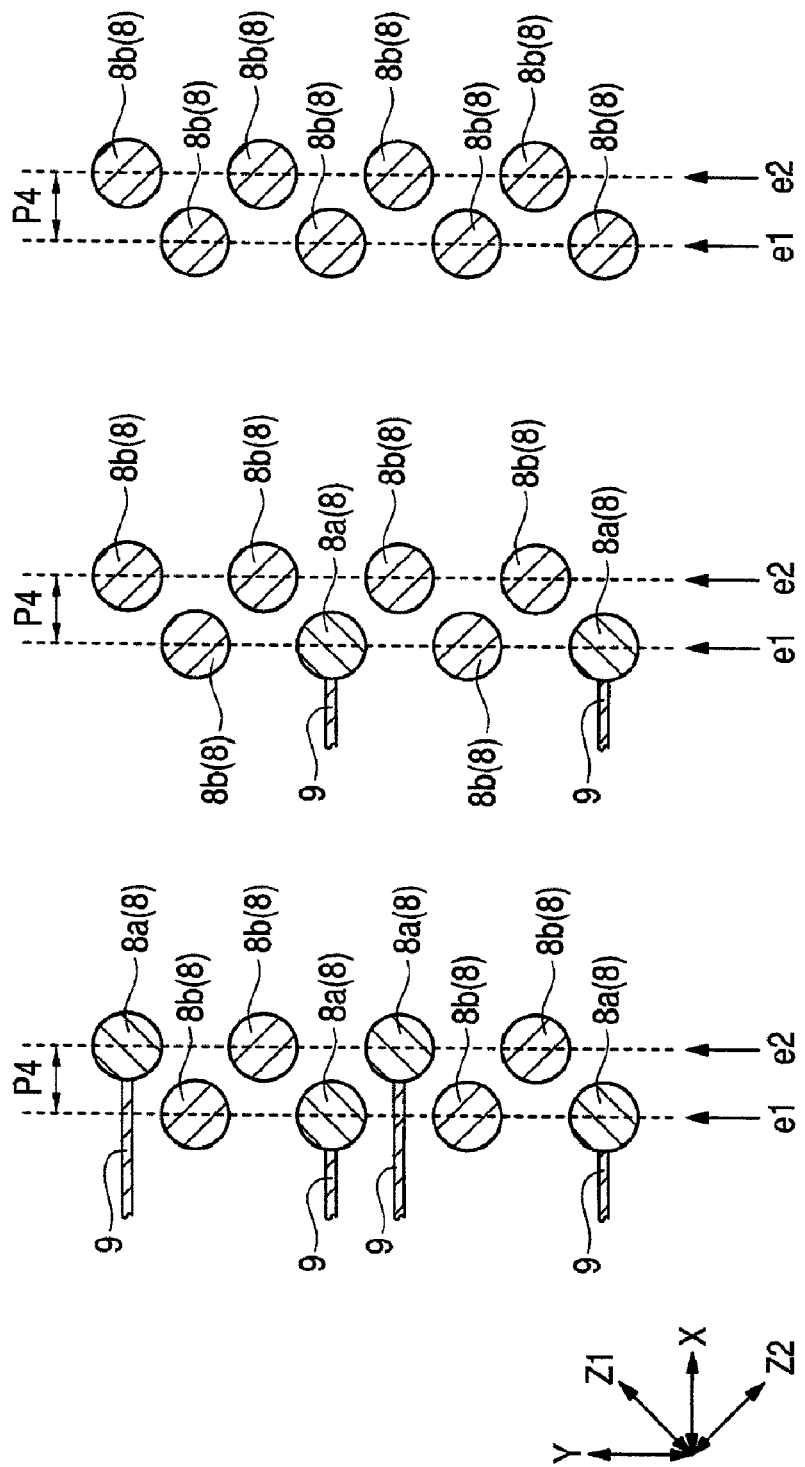

SEMICONDUCTOR DEVICE AND METHOD FOR MANUFACTURING THE SAME

CROSS-REFERENCE TO RELATED APPLICATIONS

The disclosure of Japanese Patent Application No. 2008-189663 filed on Jul. 23, 2008 including the specification, drawings and abstract is incorporated herein by reference in its entirety.

BACKGROUND OF THE INVENTION

The present invention relates to a semiconductor device and a method for manufacturing the same. Particularly, the present invention is concerned with a technique applicable effectively to a semiconductor device wherein a semiconductor chip is coupled to a wiring substrate by flip chip bonding and also applicable effectively to a method for manufacturing the semiconductor device.

A semiconductor device of a semiconductor package type is manufactured by coupling a semiconductor chip onto an upper surface of a wiring substrate by flip chip bonding, coupling bump electrodes of the semiconductor chip electrically to lands formed on the upper surface of the wiring substrate, sealing the coupled portions between the bump electrodes of the semiconductor chip and the lands of the wiring substrate with resin, and coupling solder balls to a back surface of the wiring substrate.

In Japanese Unexamined Patent Publication No. 2005-12037 (Patent Literature 1) there is disclosed a technique wherein plural lands for flip chip bonding on a multilayer printed circuit board are of plural diameters and are formed at plural pitches.

[Patent Literature 1]
Japanese Unexamined Patent Publication No. 2005-12037

SUMMARY OF THE INVENTION

Studies made by the present inventors have revealed the following.

With higher function and smaller size, the number of terminals of a semiconductor chip increases, but an outline size of the semiconductor chip tends to become smaller. In such a semiconductor chip, if bump electrodes are formed on only the peripheral portion of a main surface of the semiconductor chip, the number of terminals becomes insufficient. For this reason, bump electrodes are arranged in an area array fashion over the whole of the main surface of the semiconductor chip. In a wiring substrate on which a semiconductor chip is flip-chip-mounted, the array of plural lands on an upper surface of the wiring substrate corresponds to the array of plural bump electrodes on the semiconductor chip because the bump electrodes on the semiconductor chip are coupled to the lands on the wiring substrate upper surface. Therefore, when bump electrodes are arranged in an area array fashion over the whole of a main surface of a semiconductor chip, the array of lands on a wiring substrate with the semiconductor chip mounted thereon also takes an area array shape.

On a back surface of the wiring substrate there are arranged bump electrodes serving as external terminals. The bump electrodes on the back surface of the wiring substrate and the lands on the upper surface of the wiring substrate are coupled together electrically through wiring lines (lead-out lines) provided in the wiring substrate and wiring lines (via lines) formed within vias. Therefore, it is necessary that the lead-out lines be coupled respectively to the lands arranged in an area array fashion on the upper surface of the wiring substrate and that on the upper surface of the wiring substrate the lead-out lines be drawn out (distributed) up to the exterior of the area-arrayed region of the lands.

In the case where the lands are arranged in an area array fashion, it is necessary that the lead-out lines be passed between lands and that therefore the land-to-land pitch be widened to a certain extent. However, if an attempt is made to draw out all the lands toward the outside of the area-arrayed region of the lands with use of only the lead-out lines formed in a surface layer (first layer) of the wiring substrate, the number of lead-out lines passing between lands becomes larger, thus giving rise to the necessity of enlarging the land-to-land pitch. Particularly, the number of lead-out lines passing between lands becomes maximum at the outermost periphery lands in the area array region, that is, the land-to-land pitch at the outermost periphery of the area array is widened to an extent permitting passage of plural lead-out lines through that pitch. This causes an increase in size of the semiconductor chip and in the outline size of the wiring substrate, thus resulting in an increase in size (increase in area) of the semiconductor device.

Therefore, it is desired to make some improvement to the configuration (wiring layout) of lands in the wiring substrate so that the increase in size of the semiconductor chip and wiring substrate can be suppressed even if the number of lands increases.

It is an object of the present invention to provide a technique which permits reduction in size of a semiconductor device.

The above and other objects and novel features of the present invention will become apparent from the following description and the accompanying drawings.

The following is a brief description of typical modes of the present invention as disclosed herein.

In one aspect of the present invention there is provided a semiconductor device wherein a semiconductor chip is flip-chip-bonded onto a wiring substrate and wherein a plurality of first terminals for flip chip bonding are provided at an upper surface of the wiring substrate. At the upper surface of the wiring substrate, the first terminals are arranged in six or more rows at equal pitches in an advancing direction of the rows, but the row-to-row pitch is not equal. As to rows of terminals which are likely to cause a short-circuit, the pitch between adjacent rows is made large, while as to rows of terminals which are difficult to cause a short-circuit, the pitch between adjacent rows is made small.

In another aspect of the present invention there is provided a semiconductor device comprising a wiring substrate, the wiring substrate having a first main surface with a plurality of first terminals arranged thereover, and a semiconductor chip, the semiconductor chip having a second main surface with a plurality of first electrodes arranged thereover, the semiconductor chip being mounted over the first main surface of the wiring substrate through a plurality of salient electrodes. The first electrodes of the semiconductor chip are coupled respectively to the first terminals of the wiring substrate electrically through the salient electrodes. The wiring substrate has a plurality of wiring layers including a first wiring layer and a second wiring layer underlying the first wiring layer. The first terminals are provided in the first wiring layer in six or more rows. The first terminals are arranged regularly in an advancing direction of the rows and adjacent rows are deviated from each other. The first terminals include first type terminals to which first lead-out lines provided in the first wiring layer are coupled and second type terminals with first vias formed thereunder, the second type terminals being coupled to the second wiring layer electrically through the vias. As to the row-to-row pitch of the first terminals arranged in six or more rows, the pitch between adjacent rows which are in a first relation or a third relation is larger than the pitch between adjacent rows which are in a first relation. In the adjacent rows which are in the first relation, the first lead-out lines do not pass between the first terminals adjacent each other in between two adjacent rows, and the second type terminals are not present in at least one of two adjacent rows. In the adjacent rows which are in the second relation, the first lead-out lines pass between the first terminals adjacent each other in between two adjacent rows, and in adjacent rows which are in the third relation, the second type terminals are present in both adjacent rows.

In a further aspect of the present invention there is provided a semiconductor device comprising a wiring substrate, the wiring substrate having a first main surface, a plurality of first terminals formed in a chip mounting area over the first main surface, a first back surface positioned on the side opposite to the first main surface, and a plurality of lands formed over the first back surface, and a semiconductor chip, the semiconductor chip having a second main surface, a plurality of first electrodes formed over the second main surface, and a plurality of salient electrodes formed over the first electrodes, the semiconductor chip being mounted in the chip mounting area over the first main surface of the wiring substrate. The first terminals include a first terminal group wherein the first terminals are arranged in a row, a second terminal group wherein the first terminals are arranged in a row and which is disposed at a more inside position in the chip mounting area than the first terminal group, and a third terminal group wherein the first terminals are arranged in a row and which is disposed at a more inside position in the chip mounting area than the second terminal group. The first terminals in the first terminal group correspond to first-row terminals, the first terminals in the second terminal group correspond to second-row terminals, and the first terminals in the third terminal group correspond to third-row terminals. The second-row terminals in the second terminal group are positioned between the first-row terminals adjacent each other in the first terminal group and the third-row terminals in the third terminal group are positioned between the second-row terminals adjacent each other in the second terminal group. The distance between the first terminal group and the second terminal group is longer than the distance between the second terminal group and the third terminal group.

An effect obtained by the typical modes of the present invention as disclosed herein will be outlined below.

It is possible to reduce the size of the semiconductor device.

BRIEF DESCRIPTION OF THE DRAWINGS

FIG. 20 is a diagram explaining adjacent rows which are in a third relation to each other;

DETAILED DESCRIPTION OF PREFERRED EMBODIMENTS

Figure 1:
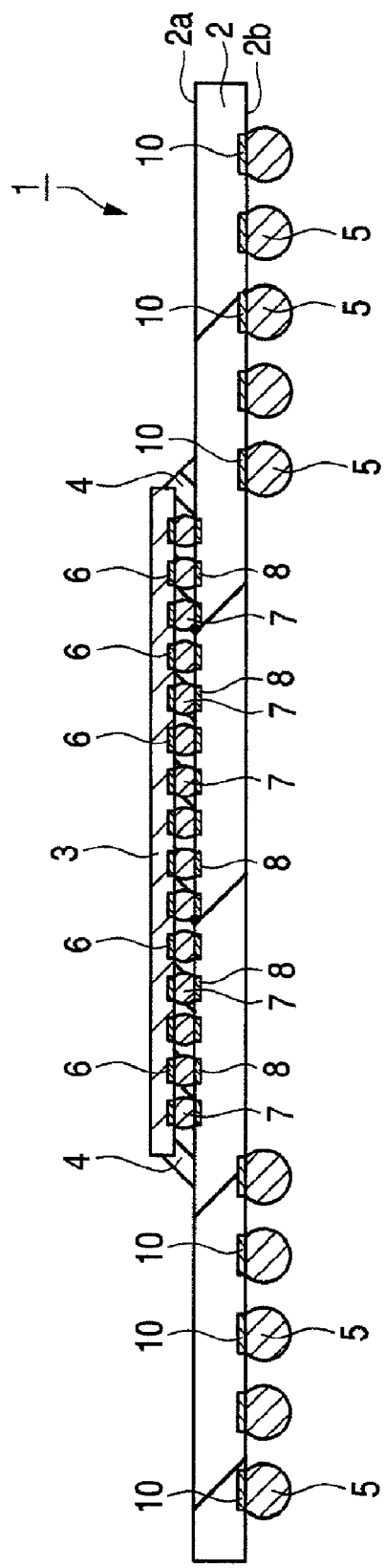
FIG. 1 is a sectional view of a semiconductor device according to a first embodiment of the present invention.

In connection with embodiments of the present invention which will be described below, a division will be made into plural sections or modes where required for the sake of convenience, but unless otherwise mentioned, the divided sections or modes are not independent of each other but are in a relation such that one is a modification, details or a supplementary explanation of part or the whole of the other. In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to. Further, it goes without saying that in the following embodiments their constituent elements (including constituent steps) are not always essential unless otherwise mentioned and except the case where they are considered essential basically obviously. Likewise, in the following embodiments, when reference is made to the shapes and a positional relation of constituent elements, those substantially closely similar to or resembling such shapes, etc., are also included unless otherwise mentioned and except the case where a negative answer is evident basically. This is also true of the foregoing numerical value and range.

Embodiments of the present invention will be described below in detail with reference to the drawings. In all of the drawings for illustrating the embodiments, portions having the same functions are identified by the same reference numerals and repeated explanations thereof will be omitted. In the following embodiments, explanations of the same or similar portions will not be repeated in principle except where such explanations are specially required.

Further, in the drawings used in the embodiments, even sectional or plan views may be hatched to make them easier to see.

First Embodiment

A semiconductor device and a method (a manufacturing process) for manufacturing the same according to a first embodiment of the present invention will be described below with reference to the drawings.

Figure 2:
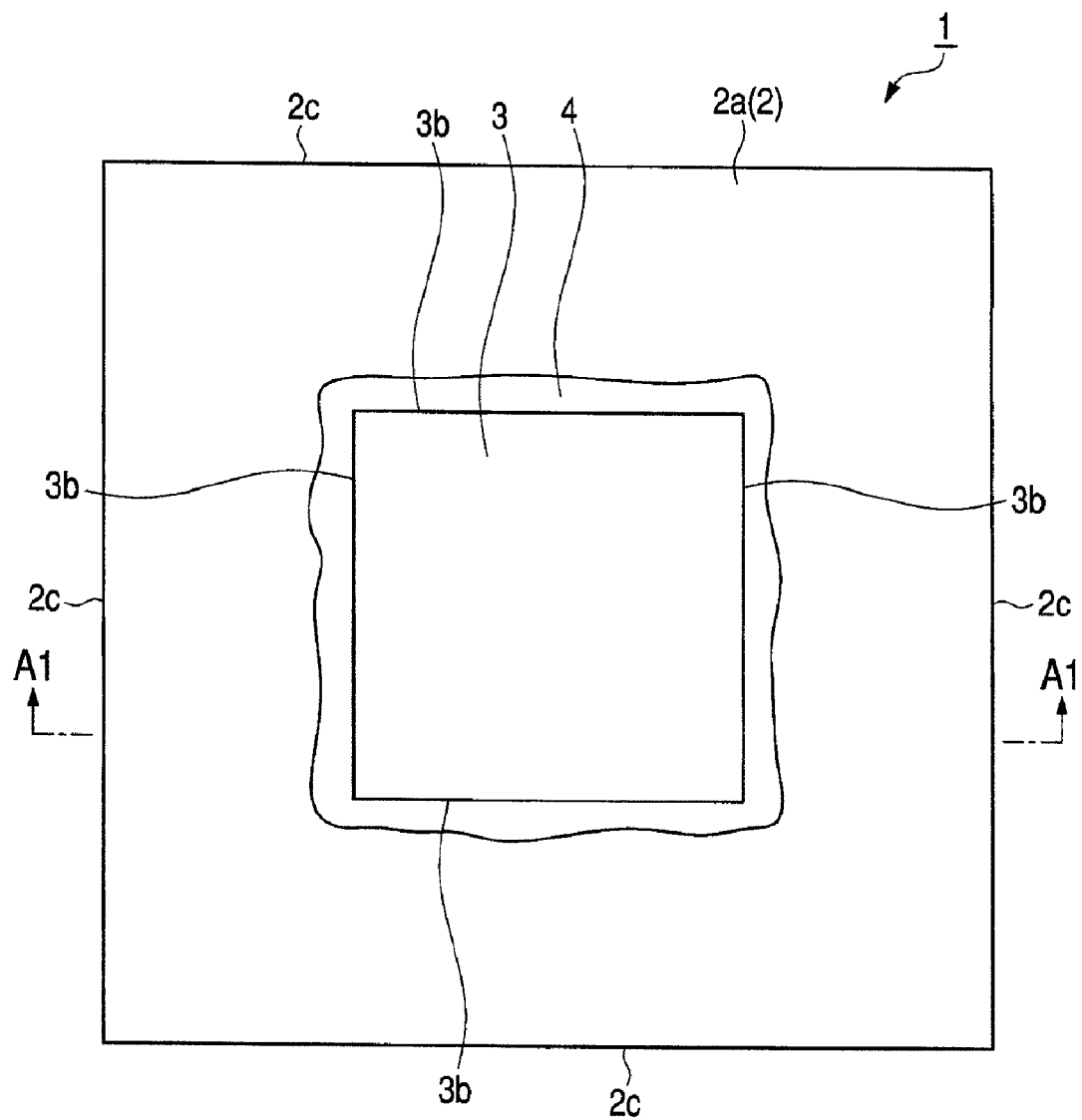
FIG. 2 is a top view of the semiconductor device of the first embodiment.
Figure 3:
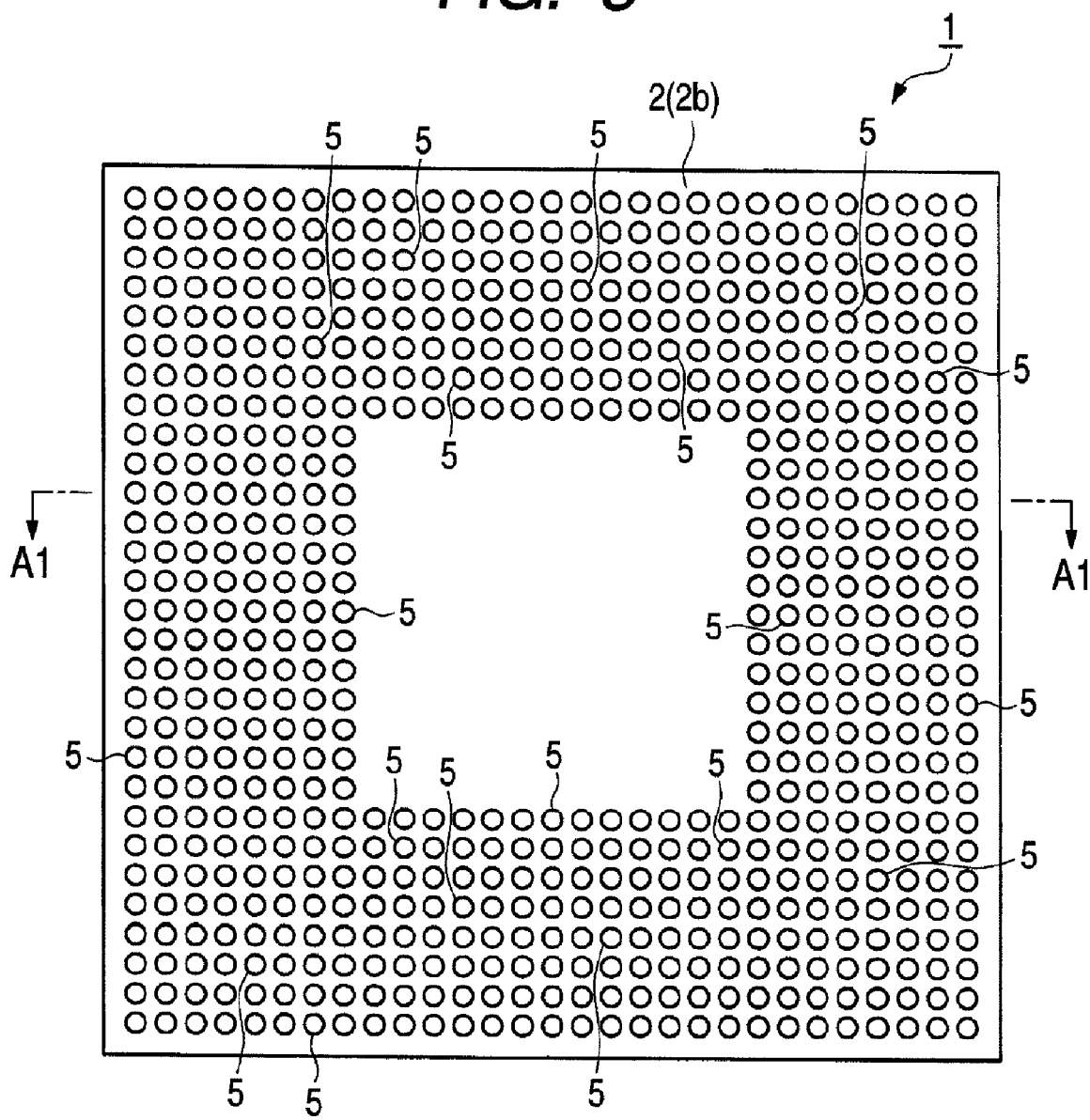
FIG. 3 is a bottom view of the semiconductor device of the first embodiment.
Figure 4:
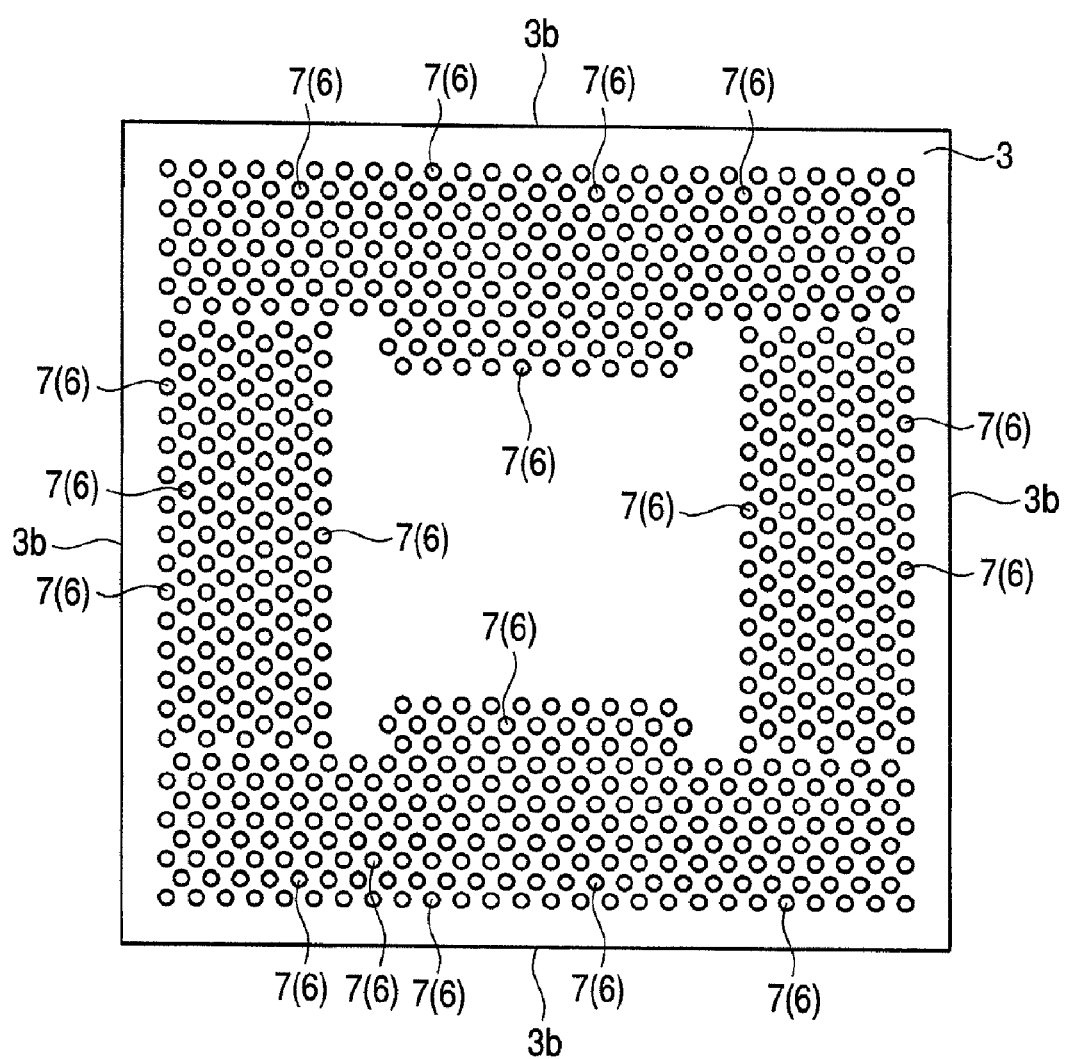
FIG. 4 is a plan view of a semiconductor chip used in the semiconductor device of the first embodiment.
Figure 5:
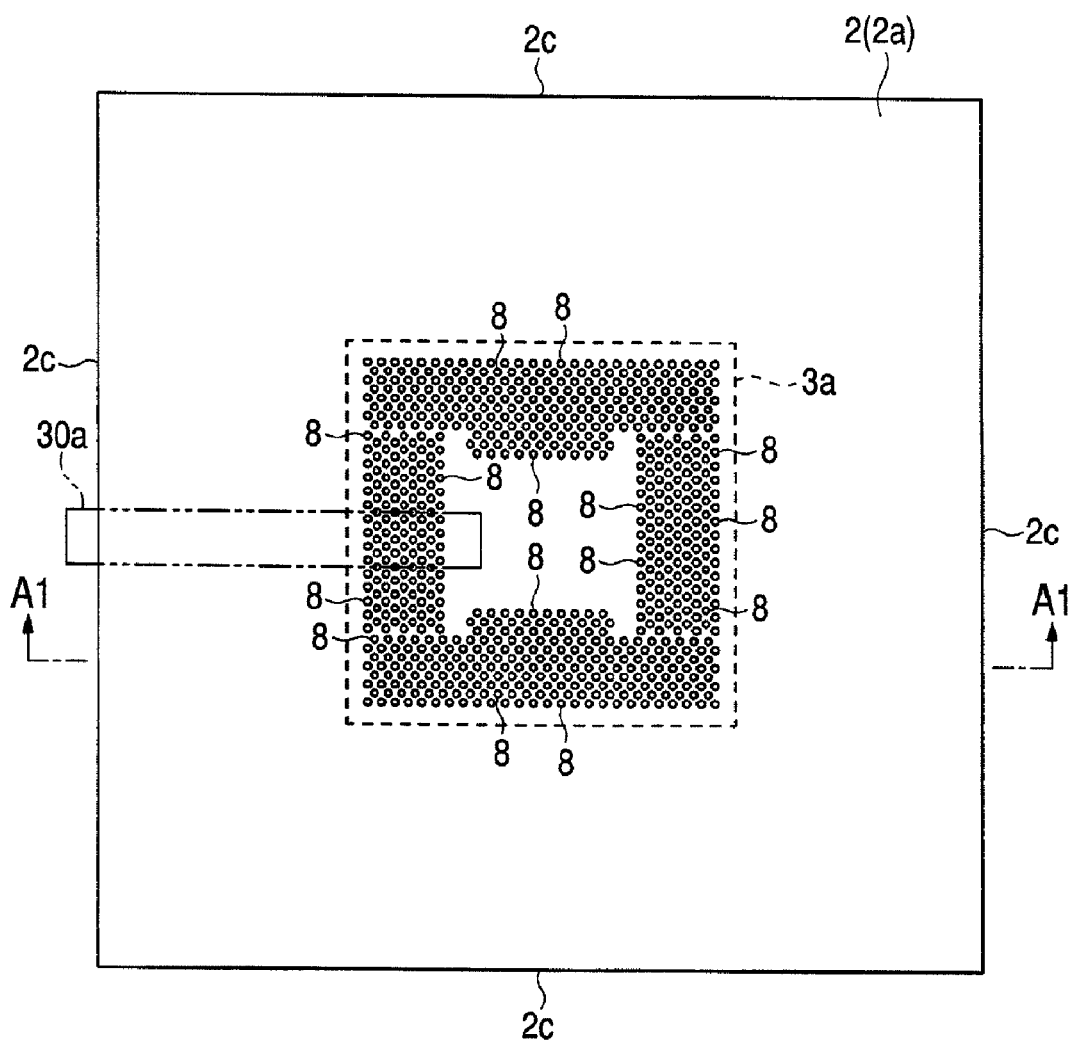
FIG. 5 is a top view of a wiring substrate used in the semiconductor device of the first embodiment.
Figure 6:
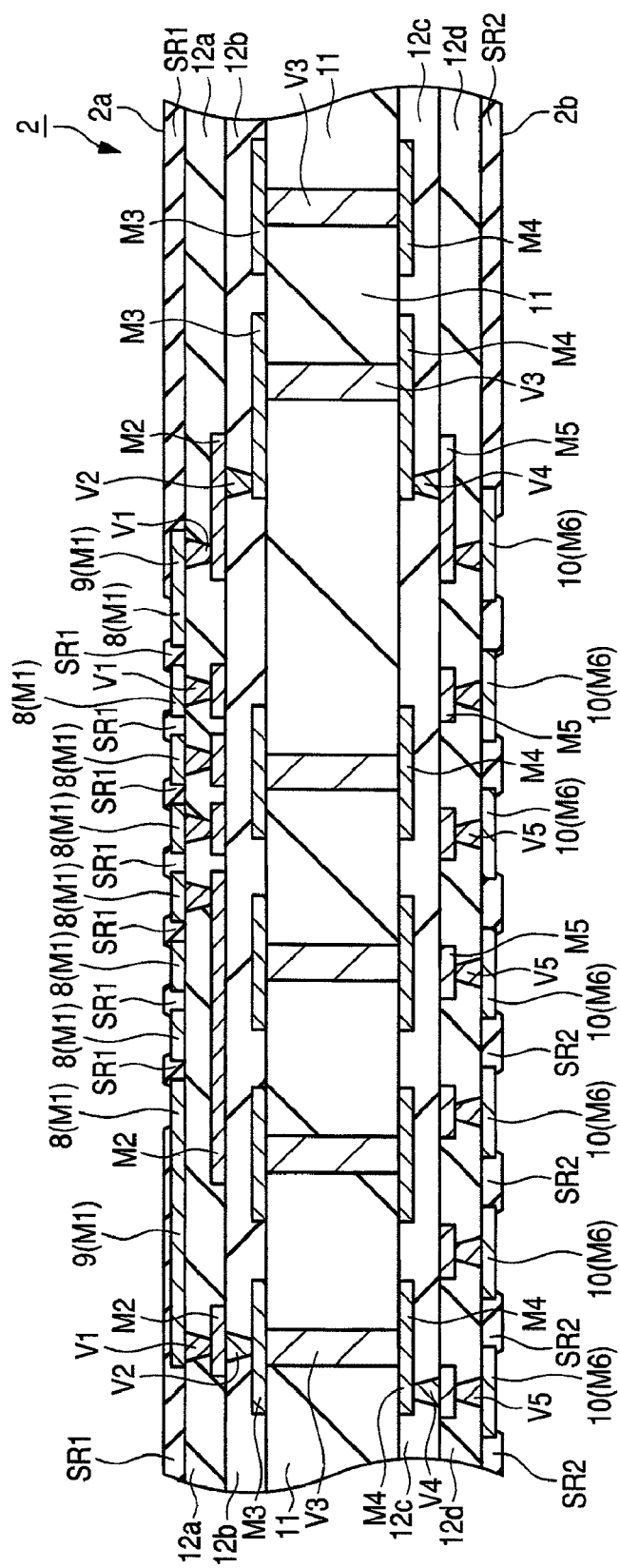
FIG. 6 is a sectional view of a principal portion of the wiring substrate used in the semiconductor device of the first embodiment.

FIG. 1 is a sectional view (entire sectional view, side face sectional view) of a semiconductor device 1 according to a first embodiment of the present invention, FIG. 2 is a top view (plan view) of the semiconductor device 1, and FIG. 3 is a bottom view (back view) of the semiconductor device 1. The section of the semiconductor device 1 taken on line A1-A1 in FIGS. 2 and 3 substantially corresponds to FIG. 1. FIG. 4 is a plan view of a semiconductor chip 3 used in the semiconductor device 1, showing a main surface of the chip on the side opposed to a wiring substrate 2. FIG. 5 is a top view (plan view) of the wiring substrate 2 used in the semiconductor device 1, showing a main surface (upper surface 2a) of the wiring substrate on the side on which the semiconductor chip 3 is mounted. FIG. 6 is a sectional view of a principal portion of the wiring substrate 2. Also in FIG. 5 there appears line A1-A1 at a position corresponding to the line A1-A1 shown in FIGS. 2 and 3. Therefore, the section of the wiring substrate 2 taken on line A1-A1 in FIG. 5 substantially corresponds to the section of the wiring substrate 2 in the semiconductor device 1 shown in FIG. 1.

The semiconductor device 1 of this embodiment shown in FIGS. 1 to 3 is a semiconductor package type semiconductor device.

As shown in FIGS. 1 to 3, the semiconductor device 1 of this embodiment includes a wiring substrate 2, a semiconductor chip 3 mounted (disposed) on an upper surface 2a of the wiring substrate 2, a resin portion (underfill resin) 4 filled between the semiconductor chip 3 and the wiring substrate 2, and plural solder balls (external terminals, bump electrodes, solder bumps) 5 provided on a lower surface 2b of the wiring substrate 2.

A planar shape of the semiconductor chip 3 intersecting the thickness thereof is quadrangular (square). For example, the semiconductor chip 3 is fabricated by forming various semiconductor elements or semiconductor integrated circuits on a main surface of a semiconductor substrate (semiconductor wafer) made of single crystal silicon as an example and subsequently separating the semiconductor substrate into individual semiconductor chips by dicing or the like.

Plural pad electrodes (electrodes, surface electrodes) 6 are formed on a surface (a main surface on the semiconductor element-forming side) of the semiconductor chip 3 and plural bump electrodes (salient electrodes) 7 as salient electrodes are formed on the pad electrodes 6 respectively. The pad electrodes 6 and the bump electrodes 7 formed thereon coupled electrically through for example an internal wiring layer of the semiconductor chip 3 to a semiconductor element or a semiconductor integrated circuit formed in the interior or a surface layer portion of the semiconductor chip 3. The bump electrodes 7 are salient electrodes and function as packaging electrodes for coupling the semiconductor chip 3 onto the wiring substrate 2 by flip chip bonding. For example, the solder electrodes 7 are solder bumps or gold bumps. In the semiconductor chip 3, a main surface on the side where the pad electrodes 6 (and the bump electrodes 7 thereon) are formed is designated a surface of the semiconductor chip 3, while a main surface on the side opposite to the main surface (i.e., the surface) where the pad electrodes 6 (and the bump electrodes 7 thereon) are formed is designated a back surface of the semiconductor chip 3.

In this embodiment it is not that the pad electrodes 6 and the bump electrodes 7 thereon are formed at only the peripheral portion (peripheral edge portion) of the semiconductor chip 3, but they are arranged in an area array fashion over the entire surface of the semiconductor chip 3, as shown in FIG. 4. This array can cope with an increase in the number of terminals of the semiconductor chip which is attributable to the tendency to a higher function and also can cope with the reduction in size (reduction of the area) of the semiconductor chip.

The semiconductor chip 3 is mounted on the upper surface 2a of the wiring substrate 2 by flip chip bonding. More specifically, the semiconductor chip 3 is mounted (packaged) on the upper surface 2a of the wiring substrate 2 (a chip mounting area 3a thereof) through the bump electrodes 7 in such a manner that the back surface (the main surface opposite to the main surface where the bump electrodes 7 are formed) of the semiconductor chip 3 faces upwards and the surface (the main surface where the bump electrodes 7 are formed) of the semiconductor chip 3 confronts the upper surface 2a of the wiring substrate 2. Thus, the semiconductor chip 3 is face-down-bonded to the upper surface 2a of the wiring substrate 2.

The bump electrodes 7 on the surface of the semiconductor chip 3 are bonded (coupled) electrically to plural lands (terminals, substrate-side terminals, electrodes, conductive land portions) 8 formed on the upper surface 2a of the wiring substrate 2. That is, the pads 6 on the surface of the semiconductor chip 3 are bonded (coupled) electrically through the bump electrodes 7 to the lands 8 formed on the upper surface 2a of the wiring substrate 2. Therefore, the semiconductor integrated circuit formed on the semiconductor chip 3 is electrically coupled to the lands 8 on the upper surface 2a of the wiring substrate 2 through the pad electrodes 6 and the bump electrodes 7.

The resin portion 4 as underfill resin filled between the semiconductor chip 3 and the upper surface 2a of the wiring substrate 2. With the resin portion 4, a burden on the bump electrodes 7 caused by the difference in thermal expansion coefficient between the semiconductor chip 3 and the wiring substrate 2 can be lessened. The resin portion 4 is formed of a resin material (e.g., a thermosetting resin material) such as, for example, epoxy resin or silicone resin and it may contain a filler. As the filler in the resin portion 4 there may be used silica for example.

The wiring substrate 2 has a quadrangular (square) plane shape in a direction crossing its thickness direction. The wiring substrate 2 has the upper surface (surface) 2a as one main surface and the lower surface (back surface) 2b as a main surface opposite to the upper surface 2a. As shown in FIG. 5, in the chip mounting area 3a on the upper surface 2a of the wiring substrate 2 there are arranged the lands 8 at an array corresponding to the array of the pad electrodes 6 (and the bump electrodes 7 thereon) formed on the surface of the semiconductor chip 3. By making the array of the lands on the upper surface 2a of the wiring substrate 2 the same as the array of the pad electrodes 6 (and the bump electrodes 7 thereon) formed on the surface of the semiconductor chip 3, it is possible to mount the semiconductor chip 3 on the upper surface 2a of the wiring substrate 2 by flip chip bonding and couple the pad electrodes 6 on the surface of the semiconductor chip 3 and the lands 8 on the upper surface 2a of the wiring substrate 2 electrically with each other through the bump electrodes 7. The chip mounting area 3a corresponds to the area where the semiconductor chip 3 is mounted on the upper surface 2a of the wiring substrate 2, i.e., the area where the semiconductor chip 3 planarly overlaps the upper surface 2a of the wiring substrate 2.

The wiring substrate 2 is a multilayer printed circuit board (multilayer substrate) formed by stacking and integrating plural insulator layers (dielectric layers) and plural wiring layers (conductor layers, conductor pattern layers) with each other. Preferably, it can be fabricated by a build-up method. The lands 8 on the upper surface 2a of the wiring substrate 2 are coupled electrically to terminals 10 on the lower surface 2b of the wiring substrate 2 through wiring lines (e.g., lead-out lines 9, 39 and 49 to be described later) of the wiring substrate 2 and wiring lines (via lines) formed in the interiors of vias. In FIG. 6, six wiring layers (conductor layers, conductor pattern layers, wiring patterns) M1, M2, M3, M4, M5, M6 and five insulator layers (insulating layers 12a, 12b, core layer 11 and insulating layers 12c, 12d in the illustrated example) are stacked alternately to form the wiring substrate 2. However, the number of insulator layers and that of wiring layers to be stacked together are not limited to the above numbers. Various changes may be made as necessary.

For example, as shown in FIG. 6, on an upper surface of an insulating core layer (base material layer, insulating layer) for of a glass epoxy resin there are formed (stacked) a wiring layer M3, an insulating layer (build-up layer) 12b, a wiring layer M2, an insulating layer (build-up layer) 12a and a wiring layer M1 in this order successively from the side close to the core layer 11. On a lower surface of the core layer 11 there are formed (stacked) a wiring layer M4, an insulating layer (build-up layer) 12c, a wiring layer M5, an insulating layer (build-up layer) 12d and a wiring layer M6 in this order successively from the side close to the core layer 11. In the wiring substrate 2, therefore, the wiring layers M1-M6 are arranged in the order of M1, M2, M3, M4, M5 and M6 from the upper surface 2a side toward the lower surface 2b side. The wiring layers M1-M6 are each formed by a metallic layer such as, for example, a copper (Cu) layer with a required pattern. The insulating layers (build-up layers) 12a, 12b, 12c and 12d are formed of a resin material for example.

The wiring layer (first wiring layer) M1 and the wiring layer (second wiring layer) M2 are coupled together electrically through vias (first vias) V1 formed in the insulating layer 12a lying between the wiring layers M1 and M2. The wiring layer (second wiring layer) M2 and the wiring layer (third wiring layer) M3 are coupled together electrically through vias (second vias) V2 formed in the insulating layer 12b lying between the wiring layers M2 and M3. The wiring layer (third wiring layer) M3 and the wiring layer (fourth wiring layer) M4 are coupled together electrically through vias V3 formed in the core layer 11 lying between the wiring layers M3 and M4. The wiring layer (fourth wiring layer) M4 and the wiring layer (fifth wiring layer) M5 are coupled together electrically through vias V4 formed in the insulating layer 12c lying between the wiring layers M4 and M5. The wiring layer (fifth wiring layer) M5 and the wiring layer (sixth wiring layer) M6 are coupled together electrically through vias V6 formed in the insulating layer 12d lying between the wiring layers M5 and M6.

The vias (V1-V6) are holes (through holes) formed in the insulating layers. A conductor film (conductor layer, wiring, via line) is formed on a side wall of each of the holes or the interior of each of the holes is filled up with a conductor film (conductor layer, wiring, via line). Each of the holes with a conductor film (conductor layer, wiring, via line) included therein is here designated via. Therefore, a via formed in an insulating layer can function so as to couple wiring layers (conductor layers) on both upper and lower surfaces of the insulating layer electrically with each other through the conductor film (conductor layer, wiring, via line) present on the side wall or in the interior of the hole which configures the via.

The lands 8 and lead-out lines (first lead-out lines) 9 are formed on the upper surface 2a of the wiring substrate 2 by the top wiring layer (first wiring layer) M1 out of the wiring layers M1-M6 of the wiring substrate 2. Therefore, the lands 8 and the lead-out lines 9 are formed by the same electric conductor which forms the wiring layer M1. The lands 8 function as terminals (substrate-side terminals, electrodes) for coupling between the pad electrodes 6 and the bump electrodes 7 of the semiconductor chip 3, namely, as terminals for flip chip bonding. The lead-out lines 9 are integrally coupled at one ends thereof to the lands 8. At the upper surface 2a of the wiring substrate 2 the lead-out lines 9 can function as wiring lines for drawing out (distributing) the lands 8 to the exterior of the massed area of the lands 8.

As a top layer (a top layer on the upper surface 2a side) of the wiring substrate 2 there is formed a solder resist layer (insulating layer, insulating film) SR1 which is an insulating layer. The lands 8 are exposed from apertures (corresponding to apertures 34 to be described later) of the solder resist layer SR1. On the other hand, the lead-out lines 9 are covered with the solder resist layer SR1. That is, at the upper surface 2a of the wiring substrate 2, the solder resist layer SR1 is formed on the insulating layer 12a so as to cover the wiring layer M1 other than the lands 8, the lands 8 being exposed from the apertures (corresponding to apertures 34 to be described later) of the solder resist layer SR1. With the solder resist layer SR1, the wiring layer M1 other than the lands 8 can be prevented from being exposed and shorted. The solder resist layer SR1 can also function a protective film for the wiring layer M1 (including the lead-out lines 9) other than the lands 8. A plating film may be formed on the exposed portion of each land 8 exposed from the associated aperture of the solder resist layer SR1, whereby the bonding between the lands 8 and the bump electrodes 7 can be done more accurately.

Plural terminals (external coupling terminals, electrodes, lands, conductive land portions) 10 are formed at the lower surface 2b of the wiring substrate 2 by the bottom wiring layer M6 out of the wiring layers M1-M6 of the wiring substrate 2. Therefore, the terminals 10 are formed by conductors which form the wiring layers M6. The terminals 10 function as terminals for coupling the solder balls 5 serving as external terminals (external coupling terminals) of the semiconductor device 1. As the bottom layer (the top layer on the lower surface 2b side) of the wiring substrate 2 there is formed a solder resist layer (insulating layer, insulating film) SR2 which is an insulating layer. The terminals 10 are exposed from apertures formed in the solder resist layer SR2. A plating film may be formed on the exposed portion of each terminal 10 exposed from the associated aperture of the solder resist layer SR2, whereby the bonding between the terminals 10 and the solder balls 5 can be done more accurately.

At the lower surface 2b of the wiring substrate 2 the terminals 10 are arranged in an array fashion for example and solder balls (ball electrodes, salient electrodes, electrodes, external terminals, external coupling terminals) 5 are coupled (formed) as bump electrodes onto the terminals 10 respectively. Therefore, the solder balls 5 are arranged for example in an array fashion on the lower surface 2b of the wiring substrate 2. The solder balls 5 can function as external terminals (external coupling terminals) of the semiconductor device 1.

The pad electrodes 6 of the semiconductor chip 3 are electrically coupled to the lands 8 respectively on the upper surface 2a of the wiring substrate 2 through the bump electrodes 7. Moreover, the pad electrodes 6 are electrically coupled through the wiring layers M1-M6 and vias V1-V5 of the wiring substrate to the terminals 10 on the lower surface 2b of the wiring substrate 2 and further to the solder balls 5 which are coupled to the terminals 10.

The following description is now provided about a semiconductor device manufacturing method (manufacturing process) according to this embodiment.

Figure 7:
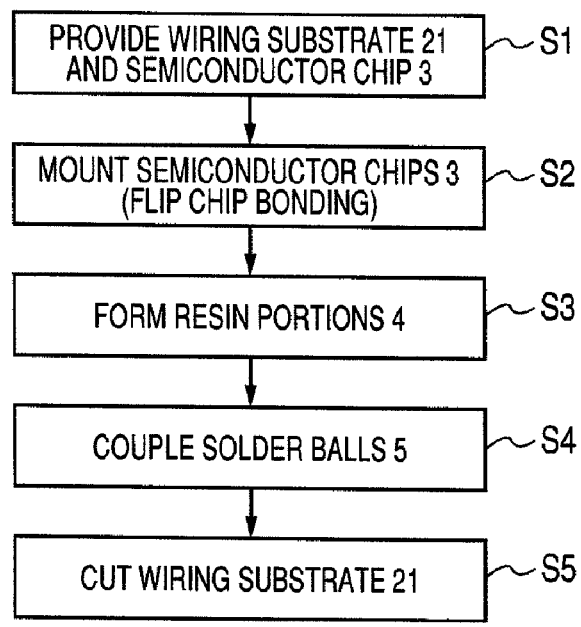
FIG. 7 is a manufacturing process flow chart showing manufacturing steps for the semiconductor device of the first embodiment.

FIG. 7 is a manufacturing process flow chart showing manufacturing steps for the semiconductor device of this embodiment. FIGS. 8 to 12 are sectional views during manufacture of the semiconductor device of this embodiment, showing sections corresponding to FIG. 1.

In this embodiment, individual semiconductor devices 1 are manufactured using a multi-device wiring substrate (wiring substrate matrix) 21 comprising a plurality of wiring substrates 2 (semiconductor device area 22) linked together in an array fashion. The wiring substrate 21 is a matrix of the plural wiring substrates 2. The wiring substrate 21 is cut in a cutting step to be described later into individual semiconductor device areas (substrate areas, unit substrate areas, device areas) 22, each of which corresponds to the wiring substrate 2 of the semiconductor device 1. In the wiring substrate 21, the semiconductor device areas 22, from each of which is formed one semiconductor device 1, are arranged in a matrix shape.

In each of FIGS. 8 to 12 there is shown a section of a region which corresponds substantially to one semiconductor device area 22.

Figure 8:
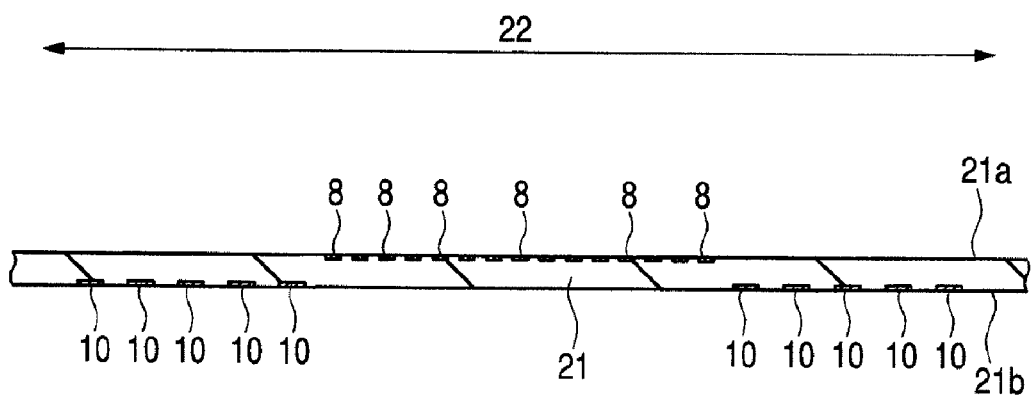
FIG. 8 is a sectional view during manufacture of the semiconductor device of the first embodiment.
Figure 9:
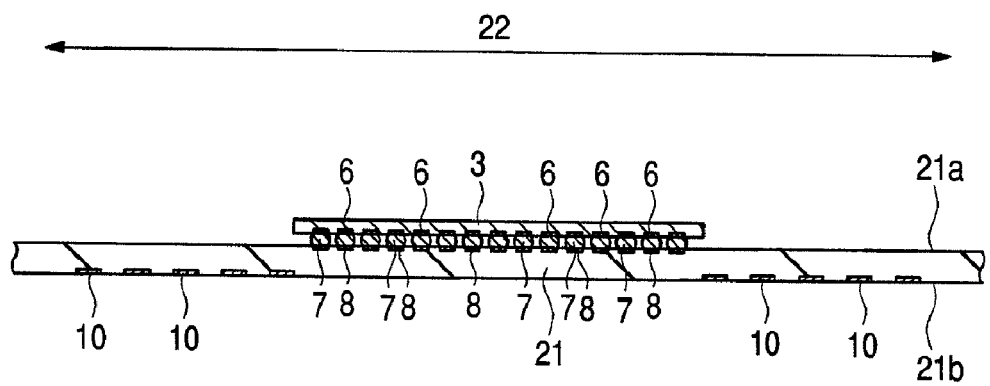
FIG. 9 is a sectional view during manufacture of the semiconductor device of the first embodiment, which follows FIG. 8.

First, a wiring substrate 21 and semiconductor chips 3 are provided (step S1). As shown in FIG. 8, the wiring substrate 21 provided in step 1 has a plurality of semiconductor device areas (unit substrate areas) 22 from which individual semiconductor devices 1 are to be manufactured. The wiring substrate 21 has an upper surface 21a and a lower surface 21b located on the side opposite to the upper surface 21a. On the upper surface 21a of each semiconductor device area 22 are formed plural lands 8, while plural terminals 10 are formed on the lower surface 21b of each semiconductor device area 22. The configuration of the wiring substrate 21 in each semiconductor device area 22 is the same as that of the wiring substrate 2. Also as to the layout of lands 8 and that of lead-out lines 9, which will be described in detail later, they are the same as those of the wiring substrate 2.

It is preferable that the wiring substrate 21 be fabricated by a build-up method so as to match a fine pitch wiring, provided no limitation is made thereto. For example, there also may be adopted printing process, sheet stacking process, semi-additive process, or additive process.

In each semiconductor chip 3, as noted above, pad electrodes 6 and bump electrodes 7 formed thereon are arranged in an area array fashion throughout the whole surface of the semiconductor chip. Therefore, for fabricating the semiconductor chip 3, a relocation wiring process (rewiring process) is performed after subjecting a semiconductor wafer to a wafer process.

In the wafer process, which is also called a front-end process, various semiconductor elements or semiconductor integrated circuits are formed on a main surface or a surface layer portion of a semiconductor wafer, likewise there are formed wiring layers (and pad electrodes) and a surface protecting film, followed by processing up to a state in which plural semiconductor chip regions formed on the semiconductor wafer can each be subjected to an electrical test with use of a probe or the like. At the end of the wafer process, plural pad electrodes are arranged near and along the four sides of each semiconductor chip area (the area which will become a semiconductor chip 3 later) on the semiconductor wafer.

The wafer process is followed by the relocation wiring process. The relocation wiring is for electric coupling between the pad electrodes formed in each of the semiconductor chip areas in the wafer process and packaging electrodes (the pad electrodes 6 in this embodiment) which are for mounting each of the semiconductor chips 3 obtained by dicing the wafer into individual semiconductor chip areas onto the wiring substrate 21. More specifically, in the relocation wiring process, the pad electrodes in each semiconductor chip area on the semiconductor wafer are drawn out (distributed) to the whole of the main surface of the semiconductor chip area through the relocation wiring and packaging electrodes (the pad electrodes 6 in this embodiment) are arranged in an area array fashion on the whole of the main surface of the semiconductor chip area. A relocation wiring 57 to be described later (shown in FIGS. 25 and 26 to be described later) corresponds to the relocation wiring described above. In the relocation wiring process, bump electrodes 7 are formed on the pad electrodes 6 respectively. Thereafter, the semiconductor wafer is separated (cut) into individual semiconductor chip areas by for example dicing, whereby individual semiconductor chips 3 are obtained.

In step S1, it is optional whether the wiring substrate 21 is first provided and then the semiconductor chip 3 is provided, or whether the semiconductor chip 3 is first provided and then the wiring substrate 21 is provided, or whether both wiring substrate 21 and the semiconductor chip 3 are provided at a time.

Thus, in step S1 there are provided the wiring substrate 21 having an upper surface 21a with lands 8 arranged for each of the semiconductor device areas 22 and semiconductor chips each having a surface with plural bump electrodes (salient electrodes) 7 arranged thereon.

After the wiring substrate 21 and the semiconductor chips 3 are provided in step S1, a flip chip bonding process is performed to mount the semiconductor chips 3 on the semiconductor device areas 22 respectively which are formed on the upper surface 21a of the wiring substrate 21 (step S2).

In the flip chip bonding process (step S2), each semiconductor chip 3 is face-down-bonded onto the upper surface 21a of the wiring substrate 21 in such a manner that the back surface side of the semiconductor chip faces up and the surface side thereof faces down (the upper surface 21a side of the wiring substrate 21). Alignment is made so that the bump electrodes 7 of the semiconductor chip 3 confront the lands 8 (the lands 8 to be coupled to the bump electrodes 7) formed on the upper surface 21a of the wiring substrate 21. As noted above, the surface of the semiconductor chip is the main surface on the side where the pad electrodes 6 and the bump electrodes 7 are formed, while the back surface of the semiconductor chip 3 is the main surface on the side opposite to the side where the pad electrodes 6 and the bump electrodes 7 are formed. In the case where the bump electrodes 7 are gold bumps, the semiconductor chip 3 is pressed to the wiring substrate 21 side, urging (pushing) and thereby compression-bonding the gold bumps which form the bump electrodes 7 against the lands 8 of the wiring substrate 21. At this time, by applying heat when pressing the semiconductor chip 3 to the wiring substrate 21 it is also possible to thermocompression-bonding the bump electrodes 7 to the lands 8. In the case where the bump electrodes 7 are solder bumps, the solder bumps as the bump electrodes 7 are melted and resolidified by solder reflow (heat treatment) to couple (solder) the bump electrodes 7 to the lands 8.

Thus, in step S2, each semiconductor chip 3 is mounted onto the upper surface 21a of the wiring substrate 21 through the bump electrodes (salient electrodes) 7 and the bump electrodes 7 of the semiconductor chip 3 are coupled electrically to the lands 8 of the wiring substrate 21. As a result, the pad electrodes 6 of the semiconductor chip 3 are coupled (bonded) electrically through the bump electrodes 7 to the lands 8 in each semiconductor device area of the wiring substrate 21.

Figure 10:
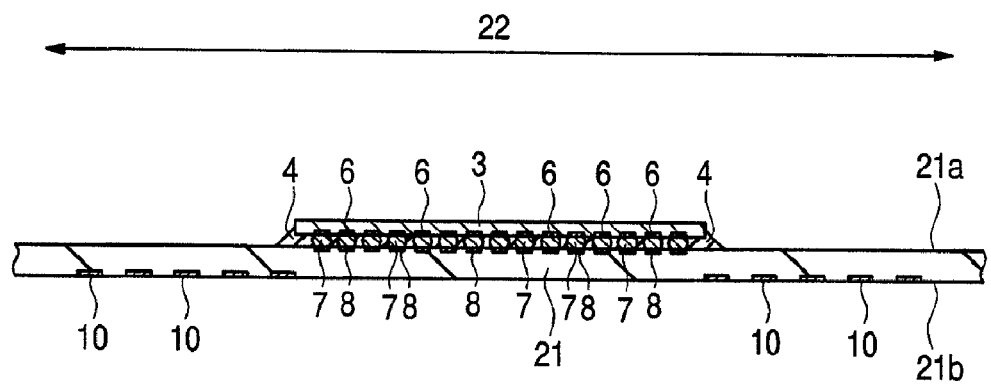
FIG. 10 is a sectional view during manufacture of the semiconductor device of the first embodiment, which follows FIG. 9.

Next, as shown in FIG. 10, a resin portion 4 as underfill resin is formed to fill between each semiconductor chip 3 and the wiring substrate 21 (step S3).

For example, a resin portion 4 can be formed of a hardened resin material by filling (injecting) a resin material, which may contain a filler, between the semiconductor chip 3 and the upper surface 21a of the wiring substrate 21 and then hardening the resin material with heating for example. There may be adopted another method wherein, prior to flip chip bonding, a resin material, which may contain a filler, is applied beforehand to a to-be-chip-mounted area (an area where the semiconductor chip 3 is to be mounted later) of each semiconductor device area 22 on the upper surface 21a of the wiring substrate 21. Thereafter, the bump electrodes 7 of the semiconductor chip 3 are coupled to the lands 8 on the upper surface 21a of the wiring substrate 21 by flip chip bonding and then the resin material hardened to form a resin portion 4.

Figure 11:
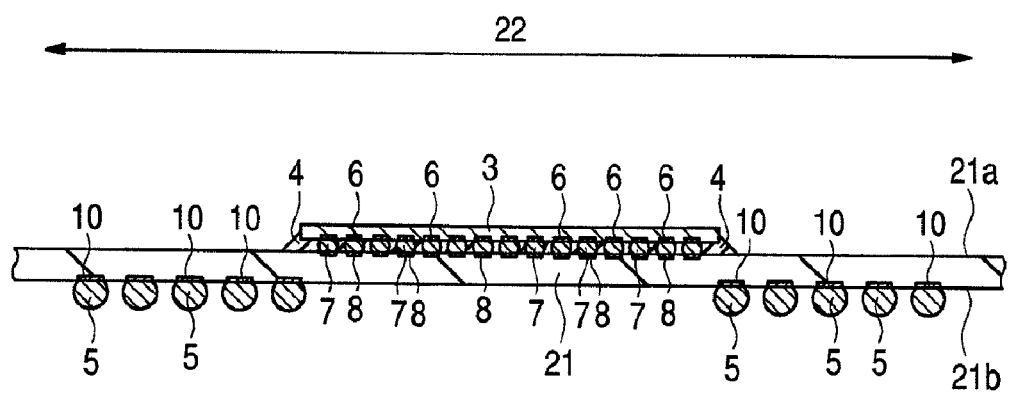
FIG. 11 is a sectional view during manufacture of the semiconductor device of the first embodiment, which follows FIG. 10.

Next, as shown in FIG. 11, the solder balls 5 are coupled (bonded, formed) to the terminals 10 on the lower surface 21b of the wiring substrate 21 (step S4).

In the process of coupling the solder balls 5 (step S4), for example, the lower surface 21b of the wiring substrate 21 is faced up, then solder balls 5 are arranged (mounted) onto the terminals 10 respectively in each of the semiconductor device areas 22 on the lower surface 21b of the wiring substrate 21, then are fixed temporarily using flux for example, followed by reflow (solder reflow, heat treatment) to melt the solder, whereby the solder balls 5 and the terminals 10 on the lower surface 21b of the wiring substrate 21 can be bonded together. Thereafter, a washing process is performed if necessary, whereby flux, etc. adhered to the surfaces of the solder balls 5 can be removed. In this way the solder balls 5 as external terminals (external coupling terminals) of the semiconductor device 1 are bonded (formed).

Although in this embodiment a description has been given above about the case where the solder balls 5 as external terminals of the semiconductor device 1 are bonded, no limitation is made thereto. For example, instead of the solder balls 5, external terminals (bump electrodes, solder bumps) of solder may be formed in the semiconductor device 1 by supplying solder onto the terminals 10 in accordance with a printing method. In this case, there may be adopted a method wherein solder is supplied onto the terminals 10 in each of the semiconductor device area 22 on the lower surface 21b of the wiring substrate 21, followed by solder reflow, to form external terminals (bump electrodes, solder bumps) of solder on the terminals 10 respectively.

It is also possible to form external terminals (bump electrodes) onto the terminals 10 respectively by plating.

In this way, in step S4, external coupling terminals (here the solder balls 5) are formed on the terminals 10 respectively in each of the semiconductor device areas 22 on the lower surface 21b of the wiring substrate 21.

Next, cutting of the wiring substrate 21 is performed (step S5).

Figure 12:
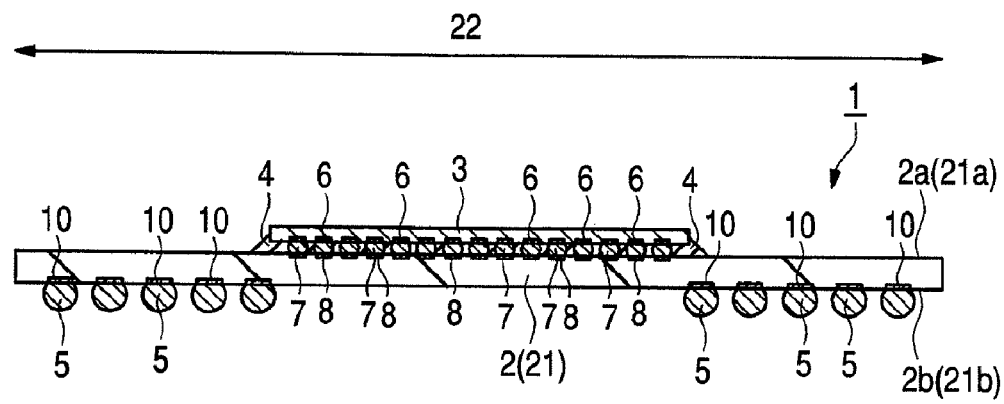
FIG. 12 is a sectional view during manufacture of the semiconductor device of the first embodiment, which follows FIG. 11.

By the cutting process of step S5, as shown in FIG. 12, the wiring substrate 21 is cut along cutting regions between the semiconductor device areas, whereby the semiconductor device areas 22 are cut off (diced) into individual (diced) semiconductor devices 1. That is, the wiring substrate 21 is cut and divided into the semiconductor device areas 22 and the semiconductor devices 1 are formed from the semiconductor device areas 22 respectively. Each semiconductor substrate 21 resulting from cutting and separation (division) into each semiconductor device area 22 by the cutting process of step S5 corresponds to the wiring substrate 2.

In this way the semiconductor device 1 is manufactured.

Next, a more detailed description will be given about the wiring substrate 2 used in the semiconductor device 1 of this embodiment.

Figure 13:
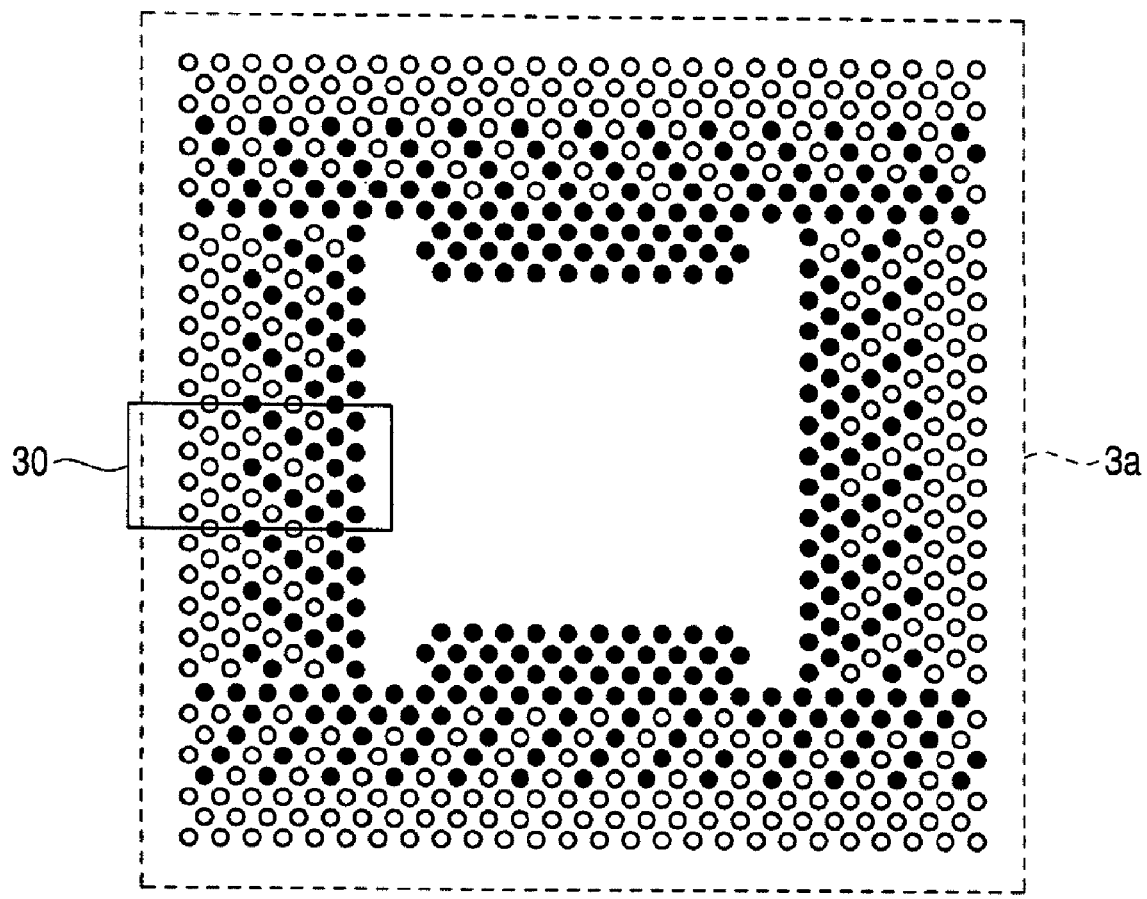
FIG. 13 is a plan view of a principal portion of the wiring substrate used in the semiconductor device of the first embodiment.
Figure 14:
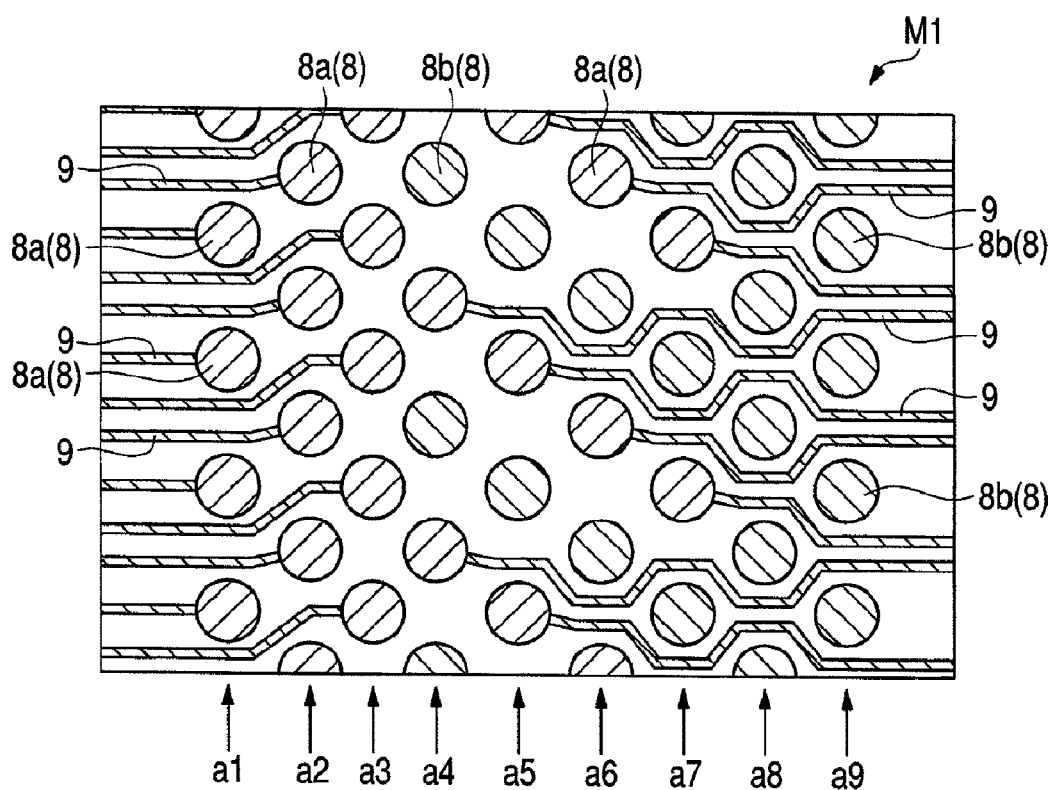
FIG. 14 is a partial enlarged plan view of FIG. 13.
Figure 15:
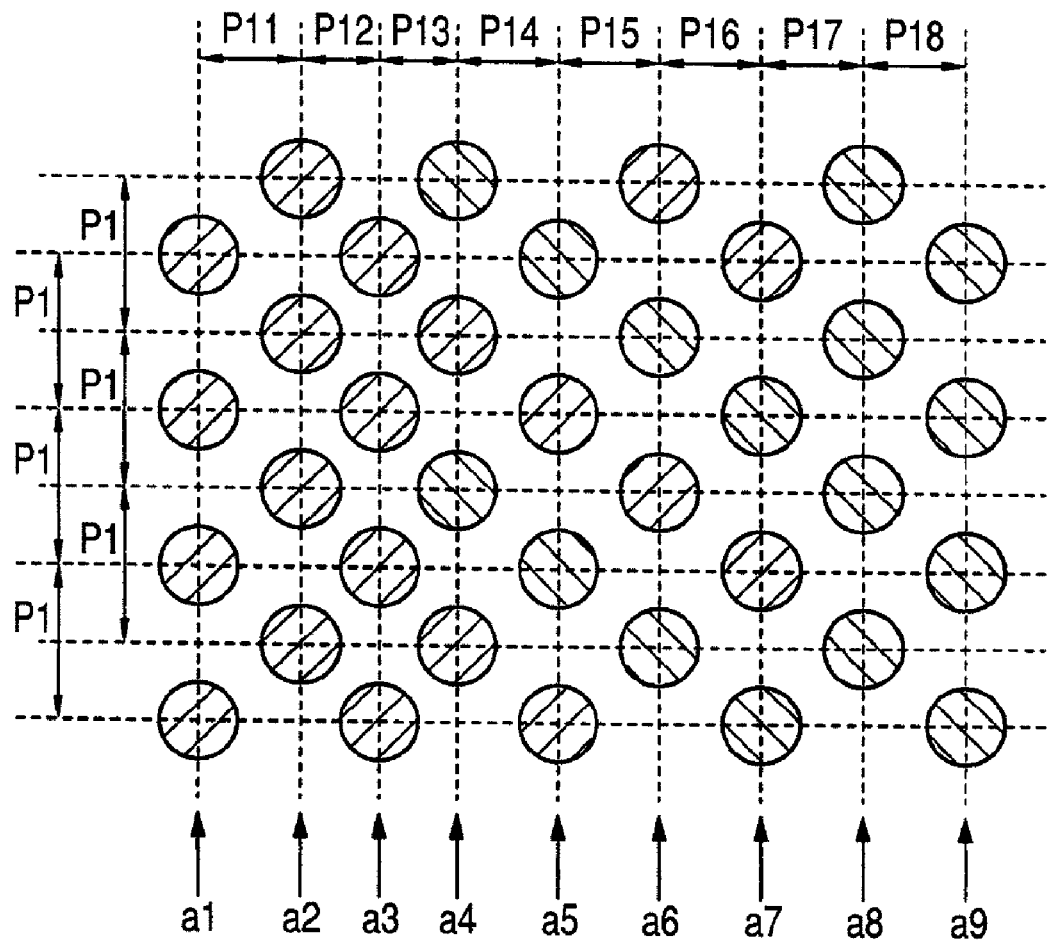
FIG. 15 is a diagram explaining an array of lands in the wiring substrate used in the semiconductor device of the first embodiment.
Figure 16:
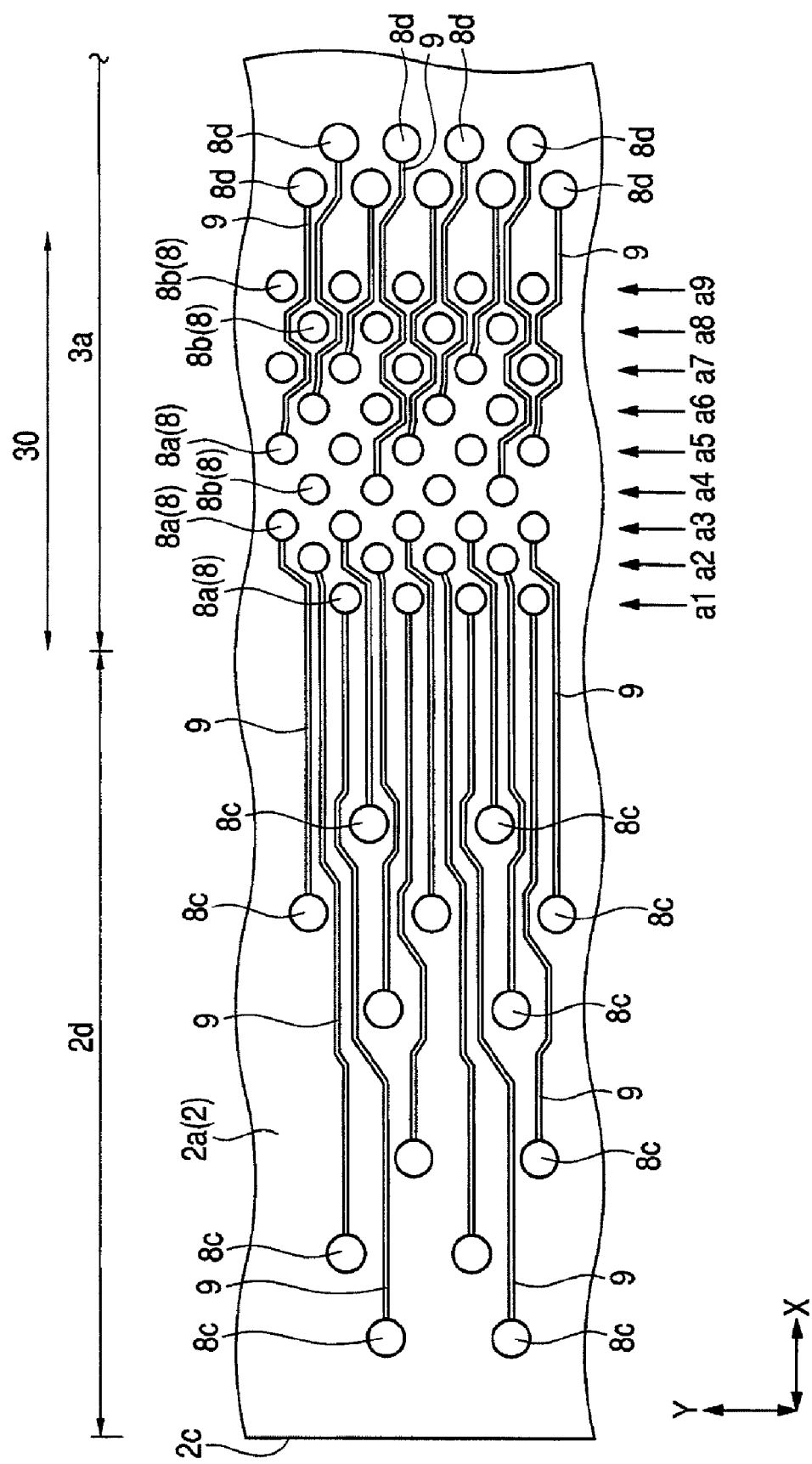
FIG. 16 is a plan view of a principal portion of the wiring substrate used in the semiconductor device of the first embodiment.

FIG. 13 is a plan view of a principal portion of the wiring substrate 2, showing on a larger scale the array of lands 8 in the chip mounting area 3a shown in FIG. 5. In FIG. 13, of the lands 8, those of a first type to be described later are represented by white circles (open circles), while those of a second type are represented by black circles (solid circles). FIG. 14 is a partial enlarged plan view of FIG. 13, showing on a larger scale a region 30 which is enclosed with a full line in FIG. 13. In FIG. 14, the top solder resist layer SR1 of the wiring substrate 2 is seen through and there is shown a layout of the top wiring layer M1 (here the lands 8 and lead-out lines 9) out of the wiring layers M1-M6 of the wiring substrate 2. FIG. 14 is a plan view, but for easier understanding, patterns (here the lands 8 and lead-out lines 9) of the wiring layer M1 are hatched, provided lands 8 of the first type are hatched in the same direction and so are lands 8b of the second type in such a manner that the hatching of the first type lands 8a and that of the second type lands 8b extend in directions opposite to each other. Actually, the first and second type lands 8a, 8b and the lead-out lines 9 are formed of the same conductor material in the same layer because they are formed by the same wiring layer M1. The first type lands 8a and the lead-out lines 9 are hatched differently, but actually each first type land 8a and the lead-out line 9 coupled thereto are formed integrally. The lead-out lines 9 are actually covered with the solder resist layer SR1. FIG. 15 is a diagram explaining an array of lands 8 in the wiring substrate 2. The array of lands 8 in the region corresponding to FIG. 14 is taken out and shown in FIG. 15. In FIG. 15, though it is a plan view, the first and second type lands 8a, 8b are hatched like FIG. 14, while the lead-out lines 9 are not shown. FIG. 16 is a plan view of a principal portion of the wiring substrate 2, showing on a larger scale a region 30a which is enclosed with a dash-double dot line in FIG. 5. The region shown in FIG. 16 (the region 30a in FIG. 5) includes the region shown in FIG. 14 (the region 30 in FIG. 13), but is wider in X direction. The left end in FIG. 16 corresponds to a side (end) 2c of the wiring substrate 2. Also in FIG. 16, like FIG. 14, the top solder resist layer SR1 of the wiring substrate 2 is seen through and there is shown a layout of the top wiring layer M1 (here the lands 8, 8c, 8d and lead-out lines 9) out of the wiring layers M1-M6 of the wiring substrate 2, but with no hatching.

As is seen from a comparison between FIG. 4 and FIGS. 5, 13, on the upper surface 2a (more specifically, the chip mounting area 3a) of the wiring substrate 2, the lands (first terminals) 8 are arrayed in a layout corresponding to the layout of the pad electrodes 6 (i.e., the layout of the bump electrodes 7 formed on the pad electrodes 6) on the surface of the semiconductor chip 3. That is, in the upper surface 2a (more specifically, the chip mounting area 3a) of the wiring substrate 2, the lands 8 has the same array as a transferred array (the array of the bump electrodes 7) of the pad electrodes 6 on the surface of the semiconductor chip 3. Consequently, the pad electrodes 6 of the semiconductor chip 3 can be arranged in opposition to the lands 8 respectively of the wiring substrate 2 and it is possible to couple the pad electrodes 6 of the semiconductor chip 3 and the lands 8 of the wiring substrate 2 with each other through the bump electrodes 7. Thus, in the semiconductor device 1, the mutually coupled pad electrodes 6, bump electrodes 7 and lands 8 are arranged at planarly overlapping positions.

In the semiconductor 3, as noted above, it is not that the pad electrodes 6 and the bump electrodes 7 formed thereon are provided at only the peripheral portion (peripheral edge portion) of the surface of the semiconductor chip 3, but they are arranged in an area array fashion throughout the whole surface of the semiconductor chip 3, as shown in FIG. 4. The lands 8 are arranged in an area array fashion in the chip mounting area 3a on the upper surface 2a of the wiring substrate 2, as shown in FIGS. 5 and 13.

It is necessary that the pad electrodes 6 of the semiconductor chip 3 be coupled electrically to the external terminals of the semiconductor device 1. It is therefore necessary that the lands 8 of the wiring substrate 2 as terminals for flip chip bonding be coupled electrically to the terminals 10 (and the solder balls 5 formed on the terminals 10) at the lower surface 2b of the wiring substrate 2.

At the upper surface 2a of the wiring substrate 2 the lands 8 as terminals for flip chip bonding are arrayed in a massed state in the chip mounting area 3a, while at the lower surface 2b of the wiring substrate 2 the terminals 10 are arrayed over a wider area than the arrayed area of the lands on the upper surface 2. That is, the array pitch of the terminals 10 at the lower surface 2b of the wiring substrate 2 is larger than that of the lands at the upper surface 2a of the wiring substrate 2. Since the solder balls 5 are coupled onto the terminals 10 respectively, the array of the terminals 10 at the lower surface 2b of the wiring substrate 2 is the same as that of the solder balls 5 at the lower surface 2b of the wiring substrate 2.

Thus, the lands 8 at the upper surface 2a of the wiring substrate 2 and the terminals 10 at the lower surface 2b of the lands 8 are not arranged at planarly overlapping positions. Therefore, with vias (vias V1-V5 in the illustrated example) along provided in the wiring substrate 2, the lands 8 at the upper surface 2a of the wiring substrate 2 and the terminals 10 at the lower surface 2b of the wiring substrate cannot be coupled together electrically. For coupling the lands 8 and the terminals 10 together electrically it is necessary that the lands 8 be drawn out (distributed) in a direction parallel to both upper surface 2a and lower surface 2b of the wiring substrate 2 with use of lead-out lines (wiring patterns) provided in at least one of the wiring layers M1-M6. The following two routes (a first route and a second route) are available to meet this requirement.

According to a first route, at the upper surface 2a of the wiring substrate 2, the lands 8 are drawn out (distributed) using lead-out lines 9 in the same layer as that of the lands 8 up to a position away from the massed area (land array area) of the lands 8, then are coupled electrically through vias V1 to the wiring layer M2 underlying the wiring layer M1 at the position away from the land array area, and are further coupled electrically through vias V2-V5 and wiring layers M3-M6 to the terminals 10 formed by the wiring layer M6. In this case, the lands 8 may be drawn out using the lead-out lines 9 provided in the wiring layer M1 and then may be further distributed using wiring patterns (lead-out lines) in one or more layers out of the wiring layers M2-M6 which underlie the lead-out lines 9 (wiring layer M1).

As the first route there is a route in which the lead-out lines 9 are drawn out from the lands 8 respectively toward the outside of the chip mounting area 3a, then are distributed to the underlying wiring layers through vias and thereafter coupled electrically to the terminals formed by the wiring layer M6, or a route in which the lead-out lines 9 are drawn out from the lands respectively toward the inside of the chip mounting area 3a, then are distributed to the underlying wiring layers through vias and thereafter coupled electrically to the terminals 10 formed by the wiring layer M6. As will be described later, the way of drawing out the first type lands 8a in a first row a1 to a third row a3 corresponds to the former and the way of drawing out the first type lands 8a in a fourth row a4 to subsequent rows corresponds to the latter.

According to a second route, at the upper surface 2a of the wiring substrate 2, the lands 8 are coupled electrically to the wiring layer M2 which underlies the lands 8 (wiring layer M1) directly (that is, without going through the lead-out lines 9) and through vias V1 formed under the lands 8, then are further coupled electrically through vias V2-V5 and wiring layers M3-M6 to the terminals 10 formed by the wiring layer M6. In this case, the lead-out lines 9 formed by the same wiring layer M1 as that of the lands 8 are not coupled to the lands 8, but vias V1 are disposed just under the lands 8 and the lands are drawn out using the lead-out lines (wiring patterns) provided in one or more of the wiring layers M2-M6 which underlie the lands 8 (wiring layer M1).

Thus, in the wiring substrate 2, it is necessary to couple the lands 8 electrically to the terminals 10. Therefore, a design is made while selecting whether the lead-out lines 9 are to be coupled to the lands 8 in accordance with the first route or the vias V1 are to be disposed just under the lands 8 in accordance with the second route.

Of the lands 8 provided in the chip mounting area 3a on the upper surface 2a of the wiring substrate 2, those with lead-out lines (first lead-out lines) 9 coupled thereto in accordance with the foregoing first route are here designated first type lands (first type terminals) and indicated at 8a, while the lands 8 with vias (first vias) V1 disposed just thereunder in accordance with the foregoing second route are here designated second type lands (second type terminals) and indicated at 8b. Thus, the second type lands 8b are so-called pads-on-via. Vias V1 are not formed just under the first type lands (first type terminals) 8a with lead-out lines 9 coupled thereto in accordance with the foregoing first route, and the lead-out lines 9 are not coupled to the second type lands (second type terminals) 8b with vias V1 formed just thereunder in accordance with the foregoing second route. The lead-out lines 9 and the lands 8 are conductor patterns provided in the wiring layer M1 (patterns of the wiring layer M1). The first type lands 8a and the lead-out lines 9 coupled thereto are formed integrally.

In this embodiment, as shown in FIGS. 5 and 13-15, plural lands 8 for flip chip bonding are formed in the chip mounting area 3a on the upper surface 2a of the wiring substrate 2, but the lands 8 are arrayed in six or more rows along each side of the chip mounting area 3a. An advancing direction of the arrayed rows of the lands 8 is parallel to each side of the chip mounting area 3a, namely, parallel to each side (side face) 3b of the semiconductor chip 3 mounted on the wiring substrate 2. Moreover, since the semiconductor chip 3 is mounted on the wiring substrate 2 in such a manner that the sides 3b of the semiconductor chip 3 and the sides 2c of the wiring substrate 2 are parallel to each other, the advancing direction of the arrayed rows of the lands 8 at the upper surface 2a of the wiring substrate 2 is a direction along (parallel) to each side (side face) 2c of the wiring substrate 2.

In the case where the lands 8 are arrayed in n rows (n is an integer of six or more) in the chip mounting area 3a on the upper surface 2a of the wiring substrate 2, the rows are here designated first row, second row, . . . , $n^{th}$ row in order from the outer periphery side of the semiconductor chip 3 mounted in the chip mounting area 3 toward the inner periphery side (central side) of the chip.

The lands 8 (first terminals) are arrayed in plural rows in the chip mounting area 3a on the upper surface 2a of the wiring substrate 2. In this case, each row can be regarded as a land group (terminal group, terminal rows) of lands 8 arrayed in rows. That is, each of the first row a1 to ninth row a9 to be described later can be regarded as a land group (terminal group, terminal rows) of lands 8 (first terminals) arrayed in rows.

In FIGS. 14 and 15 there is shown a case where plural lands 8 are arrayed in a total of nine rows, i.e., first row (first-row terminal group, first terminal group) a1, second row (second-row terminal group, second terminal group) a2, third row (third-row terminal group, third terminal group) a3, fourth row (fourth-row terminal group, fourth terminal group) a4, fifth row (fifth-row terminal group, fifth terminal group) a5, sixth row (sixth-row terminal group, six terminal group) a6, seventh row (seventh-row terminal group, seventh terminal group) a7, eighth row (eighth-row terminal group, eighth terminal group) a8, and ninth row (ninth-row terminal group, ninth terminal group) a9. In FIGS. 14 and 15, the advancing direction of arrayed rows (here the first row a1 to the ninth row a9) of the lands 8 is represented by direction Y, while the direction orthogonal to the direction Y is represented by direction X. Although the directions Y and X are orthogonal to each other, both directions are parallel to the upper surface 2a of the wiring substrate 2. Therefore, the direction Y is a direction which is along (parallel to) sides (side faces) of the semiconductor chip 3 mounted on the wiring substrate 2, also along (parallel) to sides of the chip mounting area 3a, and further along (parallel) to sides (side aces) of the wiring substrate 2.

The second row a2 is arranged more inside the chip mounting area 3a than the first row a1, the third row a3 is arranged more inside the chip mounting area 3a than the second row a2, the fourth row a4 is arranged more inside the chip mounting area 3a than the third row a3, and the fifth row a5 is arranged more inside the chip mounting area 3a than the fourth row a4. The sixth row a6 is arranged more inside the chip mounting area 3a than the fifth row a5, the seventh row a7 is mounted more inside the chip mounting area 3a than the sixth row a6, the eighth row a8 is arranged more inside the chip mounting area 3a than the seventh row a7, and the ninth row a9 is arranged more inside the chip mounting area 3a than the eighth row a8.

In this embodiment the following considerations are given to the array of the lands 8 and the layout of the lead-out lines 9 in the wiring substrate 2.

The lands 8 provided at the upper surface 2a of the wiring substrate are arrayed in six or more rows (here a total of nine rows, i.e., the first row a1 to the ninth row a9). In each row (each of the first row a1 to the ninth row a9) the lands 8 are arrayed regularly at equal pitches in the advancing direction (here the direction Y) of the rows, but the arrays of adjacent rows are deviated from each other. That is, the lands 8 belonging to adjacent rows do not overlap each other (do not match each other, are deviated) when looking in the direction (direction X) orthogonal to the advancing direction (direction Y) of the rows.

More particularly, as shown in FIGS. 14 and 15, the lands (first-row terminals) 8 belonging to the first row (first-row terminal group) a1 and the lands (second-row terminals) 8 belonging to the second row (second-row terminal group) a2 do not overlap each other when looking in the direction (direction X) orthogonal to the advancing direction (direction Y) of the rows. Likewise, the lands (second-row terminals) 8 belonging to the second row (second-row terminal group) a2 and the lands (third-row terminals) 8 belonging to the third row (third-row terminal group) a3 do not overlap each other when looking in the direction (direction X) orthogonal to the advancing direction (direction Y) of the rows. The lands (third-row terminals) 8 belonging to the third row (third-row terminal group) a3 and the lands (fourth-row terminals) 8 belonging to the fourth row (fourth-row terminal group) a4 do not overlap each other when looking in the direction (direction X) orthogonal to the advancing direction (direction Y) of the rows. The lands 8 (fourth-row terminals) 8 belonging to the fourth row (fourth-row terminal group) a4 and the lands (fifth-row terminals) 8 belonging to the fifth row (fifth-row terminal group a5 do not overlap each other when looking in the direction (direction X) orthogonal to the advancing direction (direction Y) of the rows. The lands (fifth-row terminals) 8 belonging to the fifth row (fifth-row terminal group) a5 and the lands (six-row terminals) 8 belonging to the sixth row (sixth-row terminal group) a6 do not overlap each other when looking in the direction (direction X) orthogonal to the advancing direction (direction Y) of the rows. The lands (six-row terminals) 8 belonging to the sixth row (sixth-row terminal group) a6 and the lands (seventh-row terminals) 8 belonging to the seventh row (seventh-row terminal group) a7 do not overlap each other when looking in the direction (direction X) orthogonal to the advancing direction (Y) of the rows. The lands (seventh-row terminals) 8 belonging to the seventh row (seventh-row terminal group) a7 and the lands (eighth-row terminals) 8 belonging to the eighth row (eighth-row terminal group) a8 do not overlap each other when looking in the direction (direction X) orthogonal to the advancing direction of the rows. Further, the lands (eighth-row terminals) 8 belonging to the eighth row (eighth-row terminal group) a8 and the lands (ninth-row terminals) 8 belonging to the ninth row (ninth-row terminal group) a9 do not overlap each other when looking in the direction (direction X) orthogonal to the advancing direction (direction Y) of the rows.

In other words, in an array of six or more rows (here a total of nine rows, i.e., the first row a1 to the ninth row a9) of lands 8, between adjacent lands 8 belonging to each row there is positioned a land 8 belonging to the row adjacent to that row when looking in the direction (direction X) orthogonal to the advancing direction (direction Y) of the rows. More specifically, between adjacent lands 8 in the first row a1 there is positioned a land 8 belonging to the second row a2 adjacent to the first row a1, and between adjacent lands 8 in the second row a2 there is position a land 8 belonging to the third row a3 adjacent to the second row a2, when looking in the direction X. Between adjacent lands 8 in the third row a3 there is positioned a land belonging to the fourth row a4 adjacent to the third row a3, and between adjacent lands 8 in the fourth row a4 there is positioned a land 8 belonging to the fifth row a5 adjacent to the fourth row a4, when looking in the direction X. Between adjacent lands 8 in the fifth row a5 there is positioned a land 8 belonging to the sixth row a6 adjacent to the fifth row a5, and between adjacent lands 8 in the sixth row a6 there is positioned a land 8 belonging to the seventh row a7 adjacent to the sixth row a6, when looking in the direction X. Further, between adjacent lands 8 in the seventh row a7 there is positioned a land 8 belonging to the eighth row a8 adjacent to the seventh row a7, and between adjacent lands 8 in the eighth row a8 there is positioned a land 8 belonging to the ninth row a9 adjacent to the eighth row a8. Thus, the lands 8 can also be regarded as being arrayed in a zigzag fashion. With such an array, it is possible to enhance the layout density of lands 8 and increase the distance between adjacent lands 8.

The above array can further be described as follows. Each land 8 (second-row terminal) in the second row a2 (second terminal group) is positioned between adjacent lands 8 (first-row terminals) in the first row a1, and each land 3 (third-row terminal) in the third row a3 (third terminal group) is positioned between adjacent lands 8 (second-row terminals) in the second row a2 (second terminal group), when looking in the direction X. Likewise, each land 8 (fourth-row terminal) in the fourth row a4 (fourth terminal group) is positioned between adjacent lands 8 (third-row terminals) in the third row a3 (third terminal group, and each land 8 (fifth-row terminal) in the fifth row a5 (fifth terminal group) is positioned between adjacent lands 8 (fourth-row terminals) in the fourth row a4 (fourth terminal group), when looking in the direction X). Each land 8 (sixth-row terminal) in the sixth row a6 (sixth terminal group) is positioned between adjacent lands 8 (fifth-row terminals) in the fifth row a5 (fifth terminal group), and each land 8 (seventh-row terminal) in the seventh row a7 (seventh terminal group) is positioned between adjacent lands (sixth-row terminals) in the sixth row a6 (sixth terminal group), and each land 8 (eighth-row terminal) in the eighth row a8 (eighth terminal group) is positioned between adjacent lands 8 (seventh-row terminals) in the seventh row a7 (seventh terminal group), when looking in the direction X. Each land 8 (eight-row terminal) in the eighth row a8 (eighth terminal group) is positioned between adjacent lands 8 (seventh-row terminals) in the seventh row a7 (seventh terminal group), and each land 8 (ninth-row terminal) in the ninth row a9 (ninth terminal group) is positioned between adjacent lands 8 (eighth terminals) in the eighth row a8 (eighth terminal group).

In an array of six or more rows (here a total of nine rows, i.e., the first row a1 to the ninth row a9) of lands 8, the lands 8 in each row are arrayed at equal pitches (the same pitches) and also between different rows the pitch (array pitch, spacing) P1 of lands 8 is the same.

More particularly, in each of the first row a1 to the ninth row a9, the lands 8 are arrayed at equal pitches. Further, the pitch P1 of lands 8 in the first row a1, the pitch P1 of lands 8 in the second row a2, the pitch p1 of lands 8 in the third row a3, the pitch P1 of lands 8 in the fourth row a4, the pitch P1 of lands 8 in the fifth row a5, the pitch P1 of lands 8 in the sixth row a6, the pitch P1 of lands 8 in the seventh row a7, the pitch P1 of lands 8 in the eighth row a8, and the pitch P1 of lands 8 in the ninth row a9, are the same. In an array of six or more rows (here a total of nine rows, i.e., the first row a1 to the ninth row a9), the pitch P1 of lands 8 in each row corresponds to the distance from the center of a land 8 to the center of a land 8 adjacent thereto both belonging to the same row, as is seen also from FIG. 15.

In other words, the distance between adjacent lands 8 (first-row terminals) in the first row a1 (first terminal group) is equal to the distance between adjacent lands 8 (second-row terminals) in the second row a2 (second terminal group), the distance between adjacent lands 8 (third-row terminals) in the third row a3 (third terminal group), the distance between adjacent lands 8 (fourth-row terminals) in the fourth row a4 (fourth terminal group), and the distance between adjacent lands 8 (fifth-row terminals) in the fifth row a5 (fifth terminal group). Further, the distance between adjacent lands 8 (first-row terminals) in the first row a1 (first terminal group) is also equal to the distance between adjacent lands 8 (sixth-row terminals) in the sixth row a6 (sixth terminal group), the distance between adjacent lands 8 (seventh-row terminals) in the seventh row a7 (seventh terminal group), the distance between adjacent lands (eighth-row terminals) in the eighth row a8 (eighth terminal group), and the distance between adjacent lands 8 (ninth-row terminals) in the ninth row a9 (ninth terminal group).

Regarding how to deviate the arrays of adjacent rows from each other in an array of six or more rows (here a total of nine rows, i.e., the first row a1 to the ninth row a9) of lands, it is preferable that the arrays be shifted by only a half pitch (½ pitch, i.e., P½). It follows that at the middle (center) between adjacent lands 8 in each row there is positioned a land belonging to an adjacent row. Consequently, it is possible to not only enhance the layout density of lands 8 but also maximize the distance between adjacent lands 8.

More particularly, at the middle between adjacent lands 8 belonging to the first row a1 there is positioned a land 8 in the second row a2 adjacent to the first row a1, when looking in X direction. Likewise, at the middle between adjacent lands 8 belonging to the second row a2 there is positioned a land 8 in the third row a3 adjacent to the second row a2, when looking in X direction. At the middle between adjacent lands 8 belonging to the third row a3 there is positioned a land 8 in the fourth row a4 adjacent to the third row a3, when looking in X direction. At the middle between adjacent lands 8 belonging to the fourth row a4 there is positioned a land 8 in the fifth row a5 adjacent to the fourth row a4, when looking in X direction. Further, at the middle between adjacent lands 8 belonging to the fifth row a5 there is positioned a land 8 in the sixth row a6 adjacent to the fifth row a5, when looking in X direction. At the middle between adjacent lands belonging to the sixth row a6 there is positioned a land 8 in the seventh row a7 adjacent to the sixth row a6, when looking in X direction. At the middle between adjacent lands 8 belonging to the seventh row a7 there is positioned a land 8 in the eighth row a8 adjacent to the seventh row a7, when looking in X direction. At the middle between adjacent lands 8 belonging to the eighth row a8 there is positioned a land 8 in the ninth row a9 adjacent to the eighth row a8, when looking in X direction.

Thus, in an array of six or more rows (here a total of nine rows, i.e., the first row a1 to the ninth row a9) of lands 8, the lands 8 in alternate rows overlap (match) each other in the direction (X direction) orthogonal to the advancing direction (Y direction) of the rows. More specifically, the lands 8 belonging to the first row a1, the lands 8 belonging to the third row a3, the lands 8 belonging to the fifth row a5, the lands 8 belonging to the seventh row a7, and the lands 8 belonging to the ninth row a9, overlap (match) one another in the direction (X direction) orthogonal to the advancing direction (Y direction) of the rows. Likewise, the lands 8 belonging to the second row a2, the lands 8 belonging to the fourth row a4, the lands 8 belonging to the sixth row a6, and the lands 8 belonging to the eighth row a8, overlap (match) one another in the direction (X direction) orthogonal to the advancing direction (Y direction) of the rows.

Figure 17:
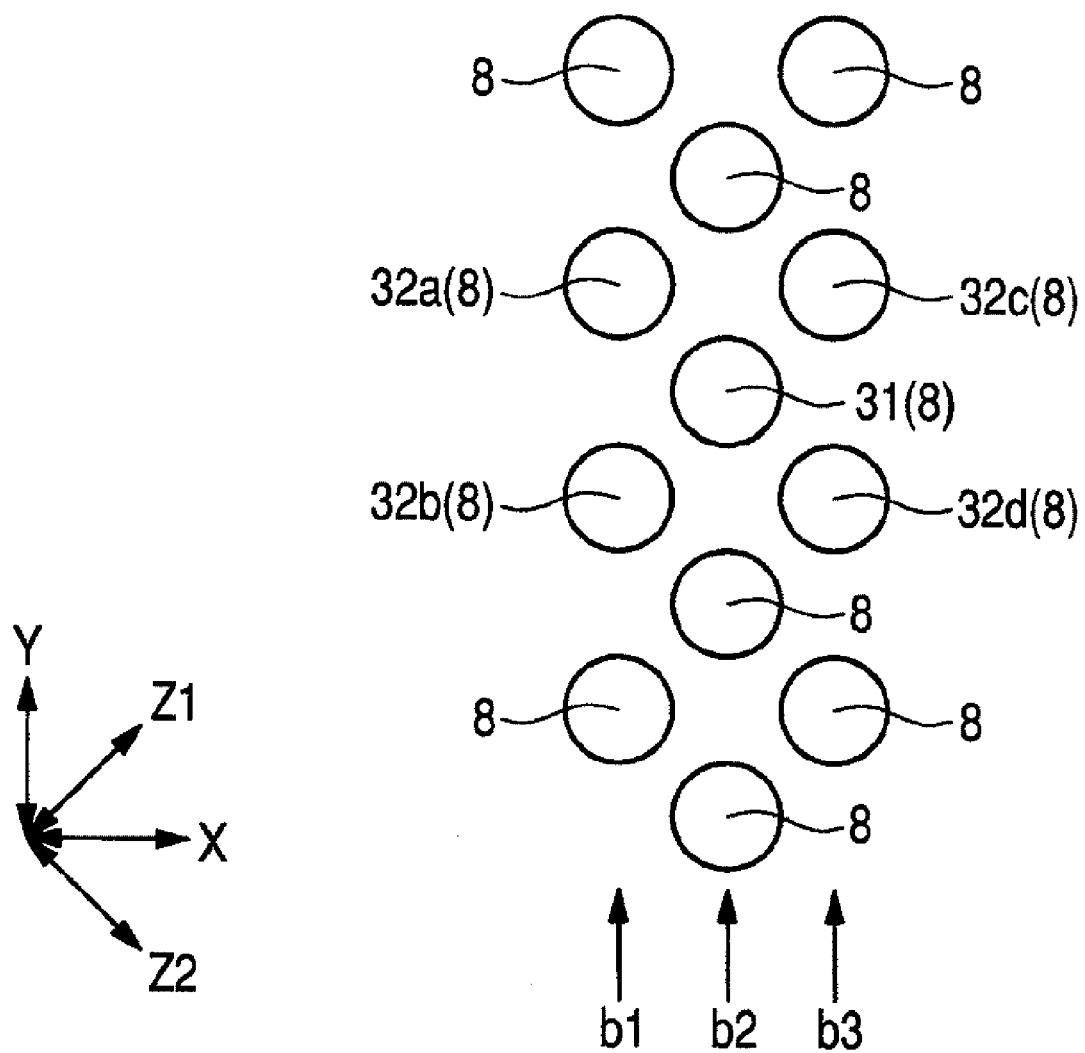
FIG. 17 is a diagram explaining a relation of adjacency of lands.

FIG. 17 is a diagram explaining a relation of adjacency of lands 8, in which arbitrary three rows (indicated at b1, b2 and b3 in FIG. 17) are extracted and shown from an array of six or more rows (here a total of nine rows, i.e., the first row a1 to the ninth row a9) of lands. In FIG. 17, for ease of understanding, both first and second type lands 8a, 8b are shown together as lands 8 without making any distinction between the two.

As noted above, since adjacent rows in the array of lands 8 are deviated by a half pitch from each other, with respect a land 8 in a certain row, another land 8 positioned nearest to that land 8 does not belong to the same row, but belongs to an adjacent row. That is, another land lying at a position nearest to a certain land 8 (here it is assumed to be a land 31 in FIG. 17) is a land 32a, 32b, 32c, or 32d, belonging to the row b1 or b3 next to the row b2 to which the land 31 belongs, and adjacent thereto in an oblique direction (Z1 or Z2 in FIG. 17) when looking in the advancing direction (Y direction) of the rows. This is because in the array of lands 8 the arrays of adjacent rows are deviated a half pitch from each other and therefore an adjacent direction (a nearest adjacent direction) of a land 8 is neither the advancing direction (Y direction) of the rows nor the direction (X direction) orthogonal to the advancing direction of the rows, but is an oblique direction (Z1 or Z2) between both directions (Y and X directions).

In the present invention, lands (first terminals) 8 adjacent to each other between two adjacent rows indicate lands 8 belonging to the adjacent rows respectively and adjacent to each other in Z1 or Z2 direction. For example, lands 31 and 32a are adjacent each other between two adjacent rows b1 and b2, lands 31 and 32b are adjacent each other between two adjacent rows b1 and b2, lands 31 and 32c are adjacent each other between two adjacent rows b2 and b3, and lands 31 and 32d are adjacent each other between two adjacent rows b2 and b3.

If a lead-out line 9 passes between the lands 31 and 32a or between the land 31 and 32b, the two adjacent rows b1 and b2 satisfy a second relation to be described later, and if a lead-out line 9 passes between the lands 31 and 32c or between the lands 31 and 32d, the two adjacent rows b2 and b3 satisfy the second relation to be described later.

Since the distance between adjacent lands 8 in Z1 or Z2 direction is larger than the row-to-row pitch (row-to-row distance), it becomes easier to pass a lead-out line 9 between adjacent lands 8. The directions Z1 and Z2 are parallel to the upper surface 2a of the wiring substrate 2 and the angle thereof relative to the directions X and Y is approximately 45°. Moreover, the directions Z1 and Z2 are substantially orthogonal to each other, but the row-to-row pitches of lands 8 are not equal as will be described later, so in a certain row there can be a case where the angle between the direction Z1 or Z2 and the direction X or Y somewhat differs from 45°.

If the distance (most adjacent distance, most proximate distance) between adjacent lands in the oblique direction (Z1 or Z2) extending between both the row advancing direction (Y direction) and the direction (X direction) orthogonal thereto is made too short, there will occur easily a short-circuit between the lands 8 and a lead-out line 9 or between lands 8 as will be described later. Conversely, if the said distance is made too long, the layout density of lands 8 will be deteriorated and it will become impossible to cope with an increase in the number of terminals.

According to this embodiment, the row-to-row pitch in the array of lands 8 is not made an equal pitch, but the pitch between adjacent rows is made large in land rows which are likely to cause a short-circuit, thereby making large the distance of adjacent lands 8 between two adjacent rows is made long, while in land rows difficult to generate a short-circuit the pitch between adjacent rows is made short, thereby attaining both prevention of a short-circuit and improvement in layout density of lands 8 at a time.

According to this embodiment, therefore, in the array of lands 8 in the chip mounting area 3a on the upper surface 2a of the wiring substrate 2, the row-to-row pitch is not made an equal pitch, but a design is made so that the pitch between adjacent rows which are in a second or third relation to be described later is larger than the pitch between adjacent rows which are in a first relation to be described later. A description will be given below about the first, second and third relations.

Figure 21:
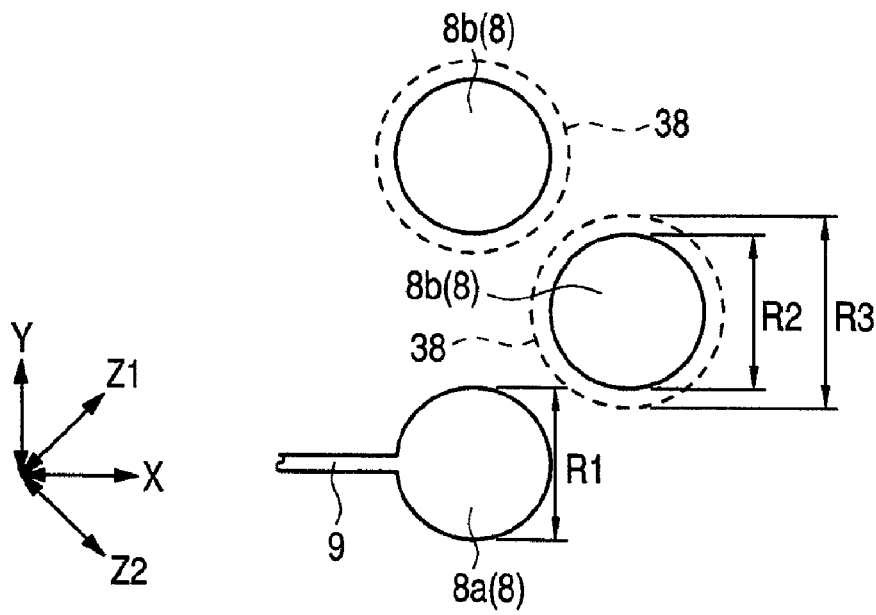
FIG. 21 is a partial enlarged plan view of the wiring substrate used in the semiconductor device of the first embodiment.
Figure 22:
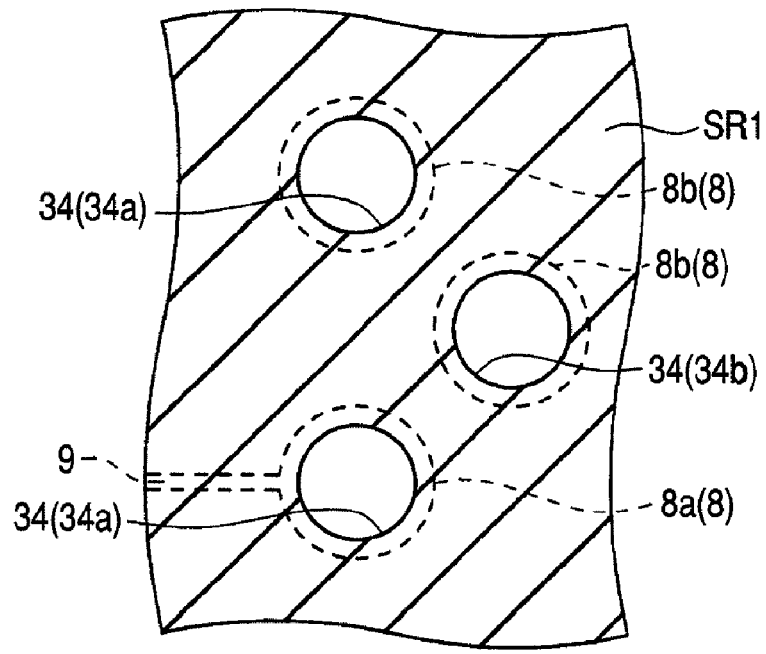
FIG. 22 is a partial enlarged plan view of the wiring substrate used in the semiconductor device of the first embodiment.

FIG. 18 is a diagram explaining adjacent rows which are in a first relation. FIG. 19 is a diagram explaining adjacent rows which are in a second relation. FIG. 20 is a diagram explaining adjacent rows which are in a third relation. FIG. 21 is a partial enlarged plan view of a certain area shown in FIG. 14, in which there are illustrated a first type land 8a, a lead-out line 9 coupled thereto, and second type lands 8b. In FIG. 21 are also shown, with dotted lines, outline positions of lands 38 which are coupled electrically to the second type lands 8b through vias positioned under (just under) the lands 8b. FIG. 22 is a plan view of the same area as FIG. 21, but the area covered with the solder resist layer SR1 is hatched. In FIG. 22, the solder resist layer SR1 is formed in the hatched area and outline positions of the first type land 8a, second type lands 8b and lead-out line 9, which underlie the solder resist layer SR1, are indicated with dotted lines.

A description will now be given about the first relation. According to this embodiment, in the case where in two adjacent rows in the array of lands 8 a lead-out line 9 does not pass between adjacent lands 8 (adjacent lands 8 in Z1 or Z2 direction) in between the two adjacent rows and there is no second type land 8 (a land with via V1 disposed thereunder) in at least one of the two adjacent rows, the adjacent rows are designated adjacent rows which are in the first relation. Therefore, in adjacent rows which are in the first relation, a lead-out line 9 does not pass between adjacent lands 8 (lands 8 adjacent each other in Z1 or Z2 direction) in between the two adjacent rows and there is no second type land 8 in at least one of the two adjacent rows. In the first relation, that there is no second type land 8b in at least one of the two adjacent rows means that there can be two cases, one being a case (the case of FIG. 18(a)) where there is no second type land 8b in both adjacent rows and the other being a case (the case of FIG. 18(b)) where there is no second type land 8b in one of the two adjacent rows, but a second type land 8b is present in the other row.

Figure 18A:
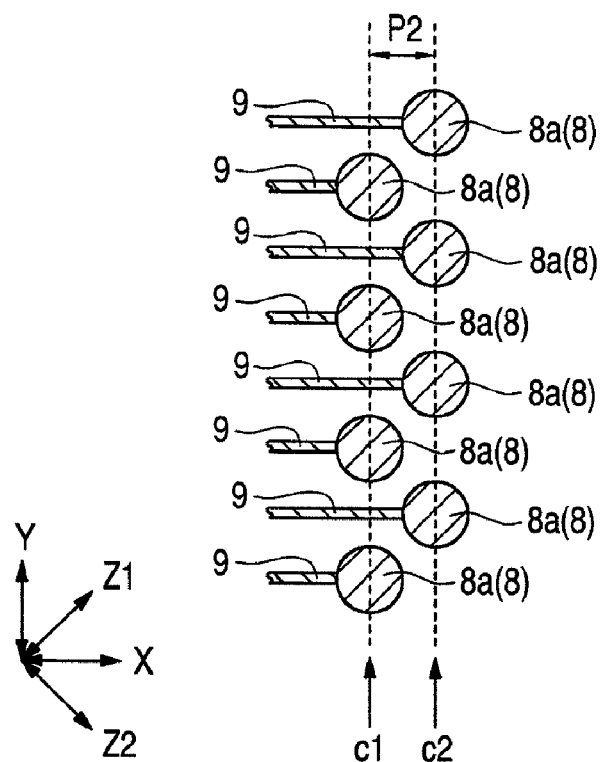
FIG. 18 is a diagram explaining adjacent rows which are in a first relation to each other.
Figure 18B:
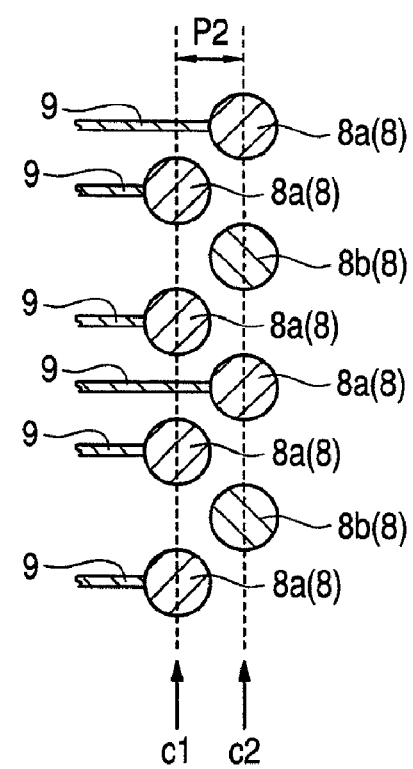

In FIGS. 18(a) and 18(b) there is shown an example of two adjacent rows c1 and c2 which satisfy the first relation. In FIGS. 18(a) and 18(b), a lead-out line 9 does not pass between adjacent lands 8 (lands 8 adjacent each other in Z1 or Z2 direction) in between two adjacent rows c1 and c2. In FIG. 18(a) there is no second type land 8b in both rows c1 and c2, while in FIG. 18(b) there is a second type land 8b in the row c2, but there is no second type land 8b in the row (a row close to the outside of the land array area) c1. Thus, the two adjacent rows c1 an c2 satisfy the first relation.

FIG. 18(a) corresponds for example to the relation between the second row (second-row terminal group) a2 and the third row (third-row terminal group) a3 in FIG. 14, while FIG. 18(b) corresponds for example to the relation between the third row (third-row terminal group) a3 and the fourth row (fourth-row terminal group) a4 in FIG. 14.

A description will be given about the second relation. According to this embodiment, in the case where in the array of lands 8 a lead-out line 9 passes between adjacent lands 8 (lands 8 adjacent each other in Z1 or Z2 direction) in between two adjacent rows, the adjacent rows are designated adjacent rows which are in the second relation. Therefore, in adjacent rows which are in the second relation, a lead-out line 9 passes between adjacent lands 8 (lands 8 adjacent each other in Z1 or Z2 direction) in between the two adjacent rows.

Figure 19A:
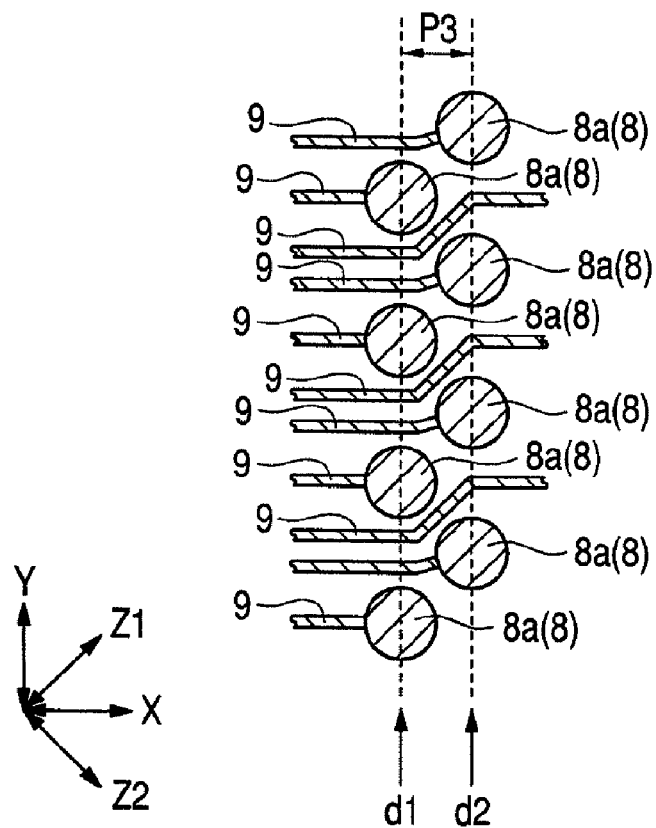
FIG. 19 is a diagram explaining adjacent rows which are in a second relation to each other.
Figure 19B:
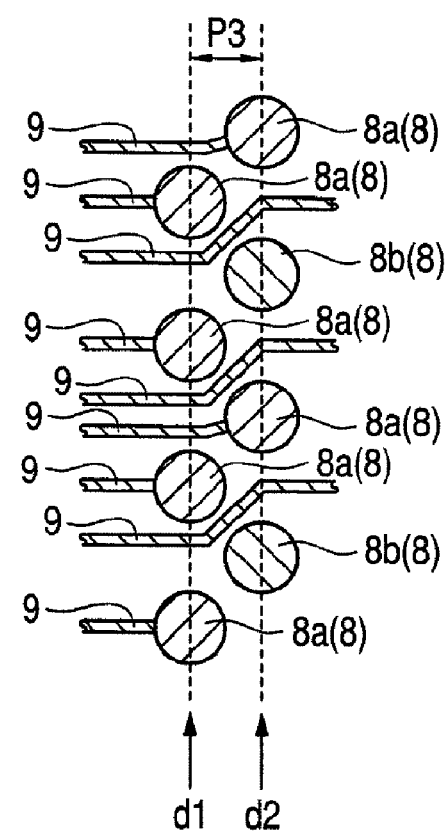

In FIGS. 19(a) and 19(b) there is shown an example of two adjacent rows d1 and d2 which satisfy the second relation. In FIGS. 19(a) and 19(b), a lead-out line 9 passes between adjacent lands 8 in between two adjacent rows d1 and d2. The configuration of FIG. 19 will now be described more concretely. In FIG. 19(a), a lead-out line 9 (here a lead-out line 9 coupled to a land 8 in another row not shown in FIG. 19) passes between a land 8 (here a first type land 8a) belonging to the row d1 and a land 8 (here a first type land 8a) adjacent to that land 8 in Z2 direction and belonging to the row d2. In FIG. 19(b), a lead-out line 9 (here a lead-out line 9 coupled to a land 8 in another row not shown in FIG. 19) passes between a land 8 (here a first type land 8a) belonging to the row d1 and a land 8 (here a first type land 8a or a second type land 8b) adjacent to that land 8 in Z2 direction and belonging to the row d2. Thus, the two adjacent rows d1 and d2 satisfy the second relation.

FIG. 19(a) corresponds for example to the relation between the first row (first-row terminal group) a1 and the second row (second-row terminal group) a2 in FIG. 14, while FIG. 19(b) corresponds for example to the relation between the fifth row (fifth-row terminal group) a5 and the sixth row (sixth-row terminal group) a6 in FIG. 14, provided both first and second type lands 8a, 8b are mixed in the fifth and sixth rows a5, a6 shown in FIG. 14.

A description will now be given about the third relation. According to this embodiment, in the case where in the array of lands 8 second type lands 8b (lands 8 with vias V1 disposed thereunder) are present (lie) in both adjacent rows, the adjacent rows are designated adjacent rows which are in the third relation. Therefore, in adjacent rows which are in the third relation, second type lands 8b are present (lie) in both adjacent rows. In the third relation, that second type lands 8b are present in both adjacent rows means that there can be the following three cases: a case where both adjacent rows are configured by only second type lands 8b, a case where one of the two adjacent rows is configured by only second type lands 8b, while in the other row there are mixed both first and second type lands 8a, 8b, and a case where both first and second type lands 8a, 8b are mixed in the two adjacent rows.

In FIGS. 20(a), 20(b) and 20(c) there is shown an example of two rows e1 and e2 which satisfy the third relation. In FIGS. 20(a), 20(b) and 20(c), second type lands 8b are present in both rows e1 and e2. The configuration of FIG. 20(a) will now be described more concretely. Second type lands 8b and first type lands 8a are mixed in the row e1 and so are in the row e2. The configuration of FIG. 20(b) will now be described more concretely. Second type lands 8b and first type lands 8a are mixed in the row e1, while only second type lands 8b are present in the row e2. The configuration of FIG. 20(c) will now be described more concretely. Only second type lands 8b are present in the row e1 and so are in the row e2. Thus, the two adjacent rows e1 and e2 satisfy the third relation.

FIG. 20(a) corresponds for example to the relation between the fourth row (fourth-row terminal group) a4 and the fifth row (fifth-row terminal group) a5 in FIG. 14.

As is seen from a comparison among the first, second and third relations, when adjacent rows (two adjacent rows) satisfy the first relation, the adjacent rows can satisfy neither the second nor the third relation. When adjacent rows satisfy the second relation, the adjacent rows cannot satisfy the first relation. Further, when adjacent rows satisfy the third relation, the adjacent rows cannot satisfy the first relation. However, when adjacent rows satisfy the second relation, there can be a case where the adjacent rows satisfy the third relation and a case where the adjacent rows do not satisfy the third relation. When adjacent rows satisfy the third relation, there can be a case where the adjacent rows satisfy the second relation and a case where the adjacent rows do not satisfy the third relation.

In the array of lands 8, there are a case where a short-circuit is likely to occur and a case where a short-circuit is difficult to occur, in two adjacent rows, depending on the relation between the two adjacent rows. When two adjacent rows are in the second or the third relation (when satisfying one or both of the second and third relations), a short-circuit is more likely to occur than when they are in the first relation. This is for the following reason.

When two adjacent rows are in the second relation (for example in the case of rows d1 and d2 in FIG. 19), that is, when a lead-out line 9 passes between adjacent lands 8 (lands 8 adjacent each other in Z1 or Z2 direction) in between two adjacent rows, a short-circuit is likely to occur. In this case, since a lead-out line 9 passes between adjacent lands 8 in an adjacent direction (a nearest adjacent direction, here the direction Z1 or Z2), the lead-out line 9 passing between a narrow gap (spacing) between the adjacent lands is apt to approach either land 8, so that a short-circuit is liable to occur.

When two adjacent rows are in the third relation (for example in the case of rows e1 and e2 in FIG. 20), that is, when second type lands 8b are present in both adjacent rows, there occurs a portion where second type lands 8b are next to each other in an adjacent direction (a nearest adjacent direction, here the direction Z1 or Z2) in the two adjacent rows, and a short circuit is likely to occur in the wiring layer M2 (between lands 38) positioned just under the said portion. This is for the following reason.

Each land 8 is a circular conductor pattern (a circular terminal). More particularly, a planar shape of each first type land 8a is circular and that of each second type land 8b is also circular. For example, as shown also in FIG. 21, the diameter R2 of each second type land 8b formed in the wiring layer M1 is almost equal to the diameter R1 of each first type land 8a, (R2≈R1). Each second type land 8b provided in the wiring layer M1 is coupled electrically through a via V1 formed under (just under) the second type land 8*b* to a land (terminal, second terminal, electrode, conductive land portion) 38 provided in the underlying wiring layer M2 and positioned under (just under) the second type land 8*b*. That is, the via V1 and the land 38 in the wiring layer M2 are disposed under (just under) each second type land 8*b* provided in the wiring layer M1, and these vertically overlapping second type land 8*b*, via V1 and land 38 are coupled together electrically. In FIG. 21, an outline position of the land 38 is indicated with a dotted line. By thus coupling the second type land 8*b* in the wiring layer M1 electrically to the land 38 in the wiring layer M2 through the via V1 located just under the land 8*b*, a wiring line (a lead-out line formed by the wiring layer which underlies the wiring layer M1) coupled electrically to the second type land 8*b* can be drawn out up to a predetermined position (outside the chip mounting area 3*a*) with use of the wiring layer which underlies the wiring layer M1. A planar shape of the land 38 is also circular.

Accordingly, it is necessary that the via (via wiring) V1 be formed on the land 38 in the wiring layer M2 (and under the second type land 8*b* in the wiring layer M1). In forming the via V1, a hole is formed in the insulating layer 12*a* for example by the radiation of laser light and wiring is formed in the interior (side wall) of the hole to ensure conduction between the wiring layers M1 and M2. When forming the via V1, laser light is radiated toward the land 38 in the wiring layer M2 to form a hole (a hole for the via V1) in the insulating layer 12*a*. But, taking the positional accuracy into account, it is preferable to make large the diameter R3 of the land 38 formed in the wiring layer M2 so that laser light is sure to be radiated to the land 38 provided in the wiring layer M2 (so that the hole for the via V1 is sure to be positioned on the land 38). On the other hand, it is not necessary to make large the diameter R2 of the second type land 8*b* in the wiring layer M1 because there is no such restriction thereon. Therefore, it is preferable that the diameter R3 of the land 38 in the wiring layer M2 be made larger than the diameter R2 of the second type land 8*b* in the wiring layer M1, (R3>R2). Thus, in this embodiment, although planar shapes of the first and second type lands 8*a*, 8*b* and the land 38 are circular, the diameter R3 of the land 38 in the wiring layer M2 is preferably larger than the diameter R2 of the second type land 8*b* in the wiring layer M1, (R3>R2).

As shown in FIGS. 20 and 21, if second type lands 8*b* are adjacent each other in an adjacent direction (Z1 or Z2 direction), the lands 38 positioned just under the second type lands 8*b* are also next to each other in the adjacent direction (Z or Z2 direction) as shown also in FIG. 21 because the lands 38 are disposed just under the second type lands 8*b*. In this case, even if the spacing between the second type lands 8 adjacent each other in the adjacent direction (Z1 or Z2 direction) is wide enough to prevent the occurrence of a short-circuit, the adjacent lands 38 become easier to approach and contact each other in the adjacent direction (Z1 or Z2 direction) because the diameter R3 of each land 38 in the wiring layer M2 is larger than the diameter R2 of each second type land 8*b* in the wiring layer M1 (R3>R2). Consequently, a short-circuit is more likely to occur between the adjacent lands 38.

Therefore, in the case where lands 8 adjacent each other in an adjacent direction (a nearest adjacent direction, here Z1 or Z2 direction) are both second type lands 8*b*, the lands 38 become easier to approach and contact each other in the wiring layer M2 because the diameter of each land 38 is larger than that of each second type land 8*b* (R3>R2). Consequently, even if the lands 8 formed in the wiring layer M1 are almost equal in size (R2≈R1), a short-circuit is apt to occur between adjacent lands 38. On the other hand, since each first type land 8*a* is drawn out by a lead-out line 9, a via V1 and a land 38 are not disposed just under the first type land 8*a*, and when at least one of adjacent lands 8 in the adjacent direction (Z1 or Z2 direction) in the wiring layer M1 is a first type land 8*b*, there does not occur the problem of a short-circuit between adjacent lands 38 in the wiring layer M2.

Thus, in the case where two adjacent rows are in the above second or third relation (when they satisfy one or both of the second and third relations), a short-circuit is easy to occur.

On the other hand, in the case where two adjacent rows are in the first relation (for example in the case of rows c1 and c2 in FIG. 18), a land 8 and a lead-out line 9 are difficult to contact each other because no lead-out line 9 passes between adjacent lands 8 in between two adjacent rows (i.e., lands 8 adjacent each other in Z1 or Z2 direction). In the case where two adjacent rows are in the first relation (for example in the case of rows c1 and c2), no second type land 8*b* is present in at least one of the two adjacent rows, so that there occurs no portion where second type lands 8*b* are adjacent each other in an adjacent direction (a nearest adjacent direction, here Z1 or Z2 direction) in the two adjacent row. Therefore, when two adjacent rows are in the first relation, lands 38 (larger in diameter than the lands 8) present just under the second type lands 8*b* are never adjacent each other in the adjacent direction (Z1 or Z2 direction) in the wiring layer M2, so that a short-circuit is difficult to occur in the wiring layer M2 (between lands 38).

Thus, when two adjacent rows are in the second or third relation, a short-circuit is easy to occur, while when two adjacent rows are in the first relation, a short-circuit is difficult to occur. In this embodiment, therefore, in adjacent rows (two adjacent rows) which are in the easily shorting second or third relation, the pitch between the adjacent rows is made large. As a result, the distance between adjacent lands 8 (i.e., lands 8 adjacent each other in Z1 or Z2 direction) in the two adjacent rows becomes large and a short-circuit between the lands and a lead-out line 9 becomes difficult to occur. Moreover, when the pitch between adjacent rows is made large, resulting in increase of the distance between lands 8 (i.e., lands 8 adjacent each other in Z1 or Z2 direction) in the two adjacent rows, the distance between lands 38 adjacent each other tin the adjacent direction (Z1 or Z2 direction) in the wiring layer M2 also becomes large, so that a short-circuit between adjacent lands 38 also becomes difficult to occur. On the other hand, in adjacent rows (two adjacent rows) which are in the first relation difficult to cause a short-circuit, the pitch between the adjacent rows is made small. As a result, it is possible to enhance the layout density of lands 8.

That is, in this embodiment, in the array of lands 8 in the chip mounting area 3*a* on the upper surface 2*a* of the wiring substrate 2, the pitch between rows in the land array is not made an equal pitch, but the pitch between adjacent rows which are in the second or third relation is set larger than the pitch between adjacent rows which are in the first relation. For example, the pitch P3 between rows d1 and d2 shown in FIG. 19 is set larger than the pitch P2 between rows c1 and c2 shown in FIG. 18, and the pitch P4 between rows e1 and e2 shown in FIG. 20 is set larger than the pitch P2 between rows c1 and c2 shown in FIG. 18 (i.e., P3>P2, P4>P2). Thus, in the array of lands in the chip mounting area 3*a* it is possible to prevent the occurrence of a short-circuit between a land 8 and a lead-out line 9 or between lands 38 while improving the layout density of lands 8 insofar as possible. Both preventing of a short-circuit and improvement of the layout density can be attained at a time. Accordingly, it is possible to cope with an increase in the number of pins (terminals) of the semiconductor device and attain the reduction in size (area) of the semiconductor device.

The pitch between rows (spacing between rows, distance between rows) in the array of lands 8 corresponds to the distance between an imaginary line joining the centers of lands 8 belonging to a certain row and an imaginary line joining the centers of lands 8 belong to a row adjacent to that row. The imaginary lines are indicated by dotted lines in FIGS. 18 to 20.

In adjacent rows which are in the second relation, a lead-out line 9 passes between lands adjacent each other in between two adjacent rows (i.e., lands 8 adjacent each other in Z1 or Z2 direction), but it is preferable to prevent two or more lead-out lines 9 from passing between lands 8 adjacent each other in two adjacent rows (i.e., lands 8 adjacent each other in Z1 or Z2 direction). That is, in this embodiment, the number of a lead-out line 9 passing between lands 8 adjacent each other in between two adjacent rows (i.e., lands 8 adjacent each other in Z1 or Z2 direction) is limited to unity or less. In adjacent rows which are in the second relation, the contact between a lead-out line 9 and a land 8 is prevented by making large the pitch between adjacent rows, but it is necessary that the larger the number or lead-out lines 9 each passing between adjacent lands 8 in the adjacent direction (Z1 or Z2), the larger should be the pitch between adjacent rows, with a consequent possibility that the layout density of lands 8 may be deteriorated. Therefore, in adjacent rows which are in the second relation, by restricting the number of a lead-out line 9 passing between adjacent lands 8 in between two adjacent rows (i.e., lands 8 adjacent each other in Z1 or Z2 direction) to one or less, it is possible to suppress an increase of the pitch between adjacent rows which are in the second relation, and both prevention of a short-circuit and improvement of the layout density of lands 8 can be attained at a time in a more exact manner. Consequently, it is possible to cope with an increase in the number of pins (terminals) of the semiconductor device and there accrues a greater advantage to the reduction in size (area) of the semiconductor device.

In an array of lands 8 arranged in six or more rows in the chip mounting area 3a, the number of lead-out lines 9 each passing between lands 8 (for example between lands 32a and 32b in FIG. 17) adjacent each other in an advancing direction (i.e., Y direction) of a row and within the same row becomes maximum in an outermost row (the first row a1) or in an innermost row (the ninth row a9). If this number of the lead-out lines is too large, there arises the necessity of increasing the pitch P1 of lands 8 in each row and there is the possibility that the layout density of lands 8 may be deteriorated. According to this embodiment, therefore, in the chip mounting area 3a on the upper surface 2a of the wiring substrate 2 it is preferable to prevent three or more lead-out lines 9 from passing between lands 8 adjacent each other in an advancing direction (i.e., Y direction) of a row and within the same row of lands 8 arrayed in six or more rows. As a result, it is possible to suppress an increase in the pitch P1 of lands 8 in each row and improve the layout density of lands 8. Consequently, it is possible to accurately cope with an increase in the number of pins (terminals) of the semiconductor device and there accrues a greater advantage to the reduction in size (area) of the semiconductor device.

More particularly, in this embodiment, as shown in FIG. 14, the number of lead-out lines 9 each passing between lands 8 adjacent each other in Y direction (i.e., in an advancing direction of a row) and within the same row, in each of the first row a1, sixth row a6, seventh row a7, eighth row a8 and ninth row a9, is two. Likewise, in each of the second row a2 and fifth row a5, the number of a lead-out line 9 passing between lands 8 adjacent each other in Y direction (i.e., in an advancing direction of a row) and within the same row is one. In each of the third row a3 and fourth row a4, the number of a lead-out line 9 passing between lands 8 adjacent each other in Y direction (i.e., in an advancing direction of a row) and within the same row is zero.

The pitch P1 of lands 8 in each row is fixed to a minimum required pitch permitting two lead-out lines 9 to pass between lands 8 adjacent each other in an advancing direction of a row (i.e., Y direction) and within the same row, (a minimum required pitch permitting passage of two lead-out lines 9 without causing a short-circuit), and row-to-row pitches P11-P18 are adjusted in accordance with the first to third relations, whereby it is possible to enhance the layout density of lands 8.

At the upper surface 2a of the wiring substrate 2 the wiring layer M1 is covered with the solder resist layer SR1 and the lead-out lines 9 are completely covered with the solder resist layer SR1. But the lands 8 are exposed from apertures 34 formed in the solder resist layer SR1, as shown in FIG. 22. The apertures 34 formed in the solder resist layer SR1 are positioned on the lands 8 respectively and have such a planar shape as is enclosed by each land 8 planarly, which shape is preferably a circular shape. Therefore, a planar shape of the portion of each land 8 exposed from the associated aperture 34 is also a circular shape. An aperture 34 (34b in FIG. 22) disposed on a second type land 8b and with the second type land 8b exposed therefrom and an aperture 34 (34a in FIG. 22) disposed on a first type land 8a and with the first type land 8a exposed therefrom are almost equal in size (diameter). That is, all of the apertures 34 formed in the solder resist layer SR1 and with flip chip bonding lands 8 exposed therefrom are equal in size (diameter). As a result, the coupling area of each bump electrode 7 becomes equal between the first and second type lands 8a, 8b. Consequently, the coupling strength for each bump electrode 7 can be made uniform and hence can be stabilized.

In addition to such a design concept of paying attention to the relation between adjacent rows and adjusting the row-to-row pitch in the array of lands 8 (making adjustment so that the pitch between adjacent rows which are in the second or third relation is larger than the pitch between adjacent rows which are in the first relation), the following considerations are given in this embodiment.

According to this embodiment, as shown also in FIGS. 13 to 15, in an array of six or more rows of lands 8 (here a total of nine rows, i.e., the first row a1 to the ninth row a9) in the chip mounting area 3a on the upper surface 2a of the wiring substrate 2, no second type land 8b is present in three outer periphery-side rows (here the first row a1, second row a2 and third row a3). That is, the lands 8 belong to three outer periphery-side rows (here the first row a1 to the third row a3) are not the second type lands 8b but the first type lands 8a with the first route applied thereto, and lead-out lines 9 are coupled thereto. Therefore, no via V1 is formed just under each land 8 belonging to the three outer periphery-side rows (the first row a1 to the third row a3). Lead-out lines 9 coupled to the lands 8 (the first type lands 8a) belonging to the three outer periphery-side rows (the first row a1 to the third row a3) extend (are drawn out) from the first type lands 8 toward the outer periphery of the wiring substrate 2 (in a direction away from the chip mounting area 3a, toward the outside of the chip mounting area 3a).

The lands 8 belonging to the outer periphery-side rows are easier to be drawn out toward the outer periphery (in a direction away from the chip mounting area 3a) with use of lead-out wiring lines 9. As noted above, therefore, in the three outer periphery-side rows (the first row a1 to the third row a3), the second route is not applied and no second type land 8b is present, and by drawing out the lands 8 (the first type lands 8a) in three outer periphery-side rows toward the outer periphery (toward the outside of the chip mounting area 3a) with use of lead-out lines 9, it is possible to effect an efficient distribution of the lead-out lines 9.

The lead-out lines 9 coupled to the lands 8 (the first type lands 8a) in the three outer periphery-side rows (the first row a1 to the third row a3) and extended (drawn out) toward the outer periphery, as shown in FIG. 16, are coupled to lands (terminals, substrate-side terminals, electrodes, conductive land portions) disposed in the outer periphery-side area (outside the chip mounting area 3a) rather than the chip mounting area 3a on the upper surface 2a of the wiring substrate 2. That is, the lands 8 (the first type lands 8a) disposed in the chip mounting area 3a and belonging to the first row a1 to the third row a3 and the lands 8c disposed in an outer periphery-side area 2d rather than the chip mounting area 3a are coupled together electrically using lead-out lines 9. Like the lands 8 and the lead-out lines 9, lands 8c are also formed by the wiring layer M1. However, the lands 8c are not terminals for flip chip bonding, but are covered with the solder resist layer SR1. The lands 8c are coupled electrically to the wiring layers M2 through vias V1 formed under (just under) the lands 8c and are also coupled electrically through vias V2-V5 and wiring layers M3-M6 to the terminals 10 formed at the lower surface 2b of the wiring substrate 2 and further to the solder balls 5 coupled onto the terminals 10.

On the other hand, in an array of six or more rows (here a total of nine rows, i.e., the first row a1 to the ninth row a9) of lands in the chip mounting area 3a, second type lands 8b are present (lie) in inner periphery-side rows (the fourth and subsequent rows, here the fourth row a4 to the ninth row a9) located more inside than the three outer periphery-side rows. That is, in the other rows (the fourth row a4 to the ninth row a9) than the three outer periphery-side rows (the first row a1 to the third row a3), the foregoing first or second route is applied to each land 8 and a lead-out line 9 is coupled to the land 8 or a via V1 is formed just under the land.

In the case where all the lands 8 are made the first type lands 8a and lead-out lines 9 are coupled thereto in the inner periphery-side rows (the fourth and subsequent rows, here the fourth row a4 to the ninth row a9) located more inside than the three outer periphery-side rows, the number of lead-out lines 9 passing between lands 8 becomes too large and it becomes difficult to pass the lead-out lines 9 between lands 8.

Therefore, when the number of rows in the array of lands 8 is large, it is preferable that a second type land 8b be present in each of the inner periphery-side rows (the fourth and subsequent rows, here the fourth row a4 to the ninth row a9) located more inside than the three outer periphery-side rows. As a result, it is possible to suppress the number of lead-out lines 9 passing between lands 8 and both prevention of a short-circuit and improvement of the layout density of lands 8 can be attained at a time in a more exact manner. Thus, in the inner periphery-side rows (the fourth and subsequent rows, here the fourth row a4 to the ninth row a9) located more inside than the three outer periphery-side rows, there can be a case where both first and second type lands 8a, 8b are mixed and a case where no first type land 8a is present and each row is configured by only second type lands 8b.

As described above, in the three outer periphery-side rows (the first row a1 to the third row a3), the lands 8 (the first type lands 8a) are drawn out toward the outer periphery (i.e., toward the outside of the chip mounting area 3a) with use of lead-out lines 9. Therefore, if an attempt is made to draw out the lead-out lines 9 toward the outer periphery which lead-out lines are coupled to the first type lands 8a belonging to the inner periphery-side rows (the fourth and subsequent rows, here the fourth row a4 to the ninth row a9) located more inside than the three outer periphery-side rows, the number of lead-out lines 9 passing between lands 8 becomes too large and it becomes difficult to pass lead-out lines 9 between lands 8.

On the other hand, in this embodiment, as shown also in FIG. 14, the lead-out lines 9 coupled to the first type lands 8a belonging to the inner periphery-side rows (the fourth and subsequent rows, here the fourth row a4 to the ninth row a9) located more inside than the three outer periphery-side rows extend (are drawn out) from the first type lands 8a toward the inner periphery of the wiring substrate 2 (toward the inner periphery of the chip mounting area 3a, toward the inside of the chip mounting area 3a). Consequently, the lead-out lines 9 coupled to the first type lands 8a belonging to the inner periphery-side rows (the fourth and subsequent rows, here the fourth row a4 to the ninth row a9) located more inside than the three outer periphery-side rows can be drawn out efficiently and it is possible to suppress the number of lead-out lines 9 passing between lands 8. Thus, both prevention of a short-circuit and improvement of the layout density of lands 8 can be attained at a time in a more exact manner.

As shown in FIG. 16, the lead-out lines 9 coupled to the first type lands 8a belonging to the inner periphery-side rows (the fourth and subsequent rows, here the fourth row a4 to the ninth row a9) located more inside than the three outer periphery-side rows and extended toward the inner periphery (toward the inside of the chip mounting area 3a) are coupled to lands (terminals, substrate-side terminals, electrodes, conductive land portions) 8d disposed in an inner periphery-side (inside) area more inside than the lands 8-arrayed area in the chip mounting area 3a. That is, the first type lands 8a belonging to the inner periphery-side rows (the fourth and subsequent rows, here the fourth row a4 to the ninth row a9) located more inside than the three outer periphery-side rows out of the lands 8 for flip chip bonding, and the land 8d disposed in a more inner periphery-side (inside) area than the lands 8-arrayed area in the chip mounting area 3a, are coupled together electrically with use of lead-out lines 9. Like the lands 8 and the lead-out lines 9, the lands 8d are also formed by the wiring layer M1, but the lands 8d are not flip chip bonding terminals, but are covered with the solder resist layer SR1. The lands 8d are coupled electrically to the wiring layer M2 through vias V1 disposed under (just under) the lands 8d, also coupled electrically through vias V2-V5 and wiring layers M3-M6 to the terminals 10 at the lower surface 2b of the wiring substrate 2 and further coupled electrically to the solder balls 5 coupled onto the terminals 10. For example, through vias V1 disposed under (just under) the lands 8d and further through lands (the same lands as lands 38b to be described later) in the wiring layer M2 and vias V2, the lands 8d in the wiring layer M1 can be coupled electrically to lands (the same lands as lands 48 to be described later) and the same lead-out lines as lead-out lines 49 to be described later can be coupled to the lands in the wiring layer M3 and drawn out (distributed) toward the outer periphery.

Thus, the semiconductor device 1 has plural solder balls (external terminals) disposed on the lower surface 2b of the wiring substrate 2 and coupled electrically to plural lands 8 respectively at the upper surface 2a of the wiring substrate 2. Of the lands 8, the first type lands 8a are coupled electrically to the solder balls (external terminals) 5 through lead-out lines 9, while of the lands 8, the second type lands 8b are coupled electrically to the solder balls (external terminals) 5 through vias V1.

A more concrete configuration of the first row a1 to the ninth row a9 will now be described. As shown in FIG. 14, in the first row a1, second row a2 and third row a3, the second type lands 8b are not arrayed, but the first type lands 8a with lead-out lines 9 coupled thereto are arrayed. In the fourth row a4, fifth row a5, sixth row a6 and seventh row a7, the first type lands 8a with lead-out lines 9 coupled thereto and the second type lands 8b with vias V1 disposed just thereunder are arrayed alternately in the advancing direction (Y direction) of the rows. In the eighth row a8 and ninth row a9, the first type lands 8a are not arrayed, but the second type lands 8b with vias V1 disposed just thereunder are arrayed. The lead-out lines 9 coupled to the first type lands 8a in the first row a1, second row a2 and third row a3 are drawn out toward the outer periphery (in a direction away from the chip mounting area 3a), while the lead-out lines 9 coupled to the first type lands 8a in the fourth row a4, fifth row a5, sixth row a6 and seventh row a7 are drawn out toward the inner periphery (toward the inner periphery or the inside of the chip mounting area 3a).

In the first row a1 and second row a2, no second type land 8b is present, but lead-out lines 9 pass each between adjacent lands 8 (adjacent in Z1 or Z2 direction) in the first row a1 and second row a2. Therefore, the first row a1 and the second row a2 are in the foregoing second relation. In the second row a2 and third row a3, no second type land 8b is present, nor does any lead-out line 9 pass between adjacent lands 8 (adjacent in Z1 or Z2 direction) in the second row a2 and third row a3. Therefore, the second row a2 and the third row a3 are in the foregoing first relation. In other words, lead-out terminals 9 are formed between the lands 8 (first-row terminals) in the first row a1 and the lands 8 (second-row terminals) in the second row a2 (i.e., between the lands 8 adjacent each other in Z1 or Z2 direction), while no lead-out terminal 9 is formed between the lands 8 (second-row terminals) in the second row a2 and the lands 8 (third-row terminals) in the third row a3 (i.e., between the lands 8 adjacent each other in Z1 or Z2 direction).

In the fourth row a4, second type lands 8b are present, while in the third row a3, there is no second type land 8b, nor does any lead-out line 9 pass between adjacent lands 8 (adjacent in Z1 or Z2 direction) in the third row a3 and fourth row a4. Therefore, the third row a3 and the fourth row a4 are in the foregoing first relation. In other words, no lead-out line 9 is formed between the lands 8 (third-row terminals) in the third row a3 and the lands 8 (fourth-row terminals) in the fourth row a4 (i.e., between the lands 8 adjacent each other in Z1 or Z2 direction).

Further, no lead-out line 9 passes between adjacent lands 8 (adjacent in Z1 or Z2 direction) in the fourth row a4 and the fifth row a5, but second type lands 8b are present in both fourth row a4 and fifth row a5. Therefore, the fourth row a4 and the fifth row a5 are in the foregoing third relation.

On the other hand, lead-out lines 9 pass each between adjacent lands 8 (adjacent in Z1 or Z2 direction) in the fifth row a5 and sixth row a6, and second type lands 8b are present in both fifth row a5 and sixth row a6. Therefore, the fifth row a5 and the sixth row a6 satisfy both the foregoing second and third relations. Lead-out lines 9 pass each between adjacent lands 8 (adjacent in Z1 or Z2 direction) in the sixth row a6 and seventh row a7, and second type lands 8b are present in both sixth row a6 and seventh row a7. Therefore, the sixth row a6 and the seventh row a7 satisfy both the foregoing second and third relations. Lead-out lines 9 pass each between adjacent lands 8 (adjacent in Z1 or Z2 direction) in the seventh row a7 and eighth row a8, and second type lands 8b are present in both seventh row a7 and eighth row a8. Therefore, the seventh row a7 and the eighth row a8 satisfy both the foregoing second and third relations. Lead-out lines 9 pass each between adjacent lands 8 (adjacent in Z1 or Z2 direction) in the eighth row a8 and ninth row a9, and second type lands 8 are present in both eighth row a8 and ninth row a9. Therefore, the eighth row a8 and the ninth row a9 satisfy both the foregoing second and third relations. That is, in the fifth row a5 and the rows which follow, adjacent rows satisfy both the foregoing second and third relations.

As noted above, in the array of lands 8 in the chip mounting area 3a on the upper surface 2a of the wiring substrate 2, the pitch between adjacent rows which are in the second or third relation is set larger than the pitch between adjacent rows which are in the first relation. Accordingly, the pitch P12 between the second row a2 and the third row a3 and the pitch P13 between the third row a3 and the fourth row a4, which are in the first relation, are set smaller than all of the following pitches which are in the second or third relation, i.e., the pitch P11 between the first row a1 and the second row a2, the pitch P14 between the fourth row a4 and the fifth row a5, the pitch P15 between the fifth row a5 and the sixth row a6, the pitch P16 between the sixth row a6 and the seventh row a7, the pitch P17 between the seventh row a7 and the eighth row a8, and the pitch P18 between the eighth row a8 and the ninth row a9. That is, P12, P13<P11, P14, P15, P16, P17, P18. In other words, the pitch P12 between the second row a2 and the third row a3 and the pitch P13 between the third row a3 and the fourth row a4, which are in the first relation, are set smaller than the other adjacent row-to-row pitches. By so doing, both prevention of a short-circuit and improvement in the layout density of lands 8 can be attained at a time.

In other words, moreover, the distance (pitch P11) between the first row a1 (first terminal group) and the second row a2 (second terminal group) is larger than the distance (pitch P12) between the second row a2 (second terminal group) and the third row a3 (third terminal group) and the distance (pitch P13) between the third row a3 (third terminal group) and the fourth row a4 (fourth terminal group), (P11>P12, P13). The distance (pitch P14) between the fourth row a4 (fourth terminal group) and the fifth row a5 (fifth terminal group) is larger than the distance (pitch P12) between the second row a2 (second terminal group) and the third row a3 (third terminal group) and the distance (pitch P13) between the third row a3 (third terminal group) and the fourth group a4 (fourth terminal group), (P14>P12, P13). The distance (pitch P15) between the fifth row a5 (fifth terminal group) and the sixth row a6 (sixth terminal group) is larger than the distance (pitch P12) between the second row a2 (second terminal group) and the third row a3 (third terminal group) and the distance (pitch P13) between the third row a3 (third terminal group) and the fourth row a4 (fourth terminal group), (P15>P12, P13). The distance (pitch P16) between the sixth row a6 (sixth terminal group) and the seventh row a7 (seventh terminal group) is larger than the distance (pitch P12) between the second row a2 second terminal group) and the third row a3 (third terminal group) and the distance (pitch P13) between the third row a3 (third terminal group) and the fourth row a4 (fourth terminal group), (P16>P12, P13). The distance (pitch P17) between the seventh row a7 (seventh terminal group) and the eighth row a8 (eighth terminal group) is larger than the distance (pitch P12) between the second row a2 (second terminal group) and the third row a3 (third terminal group) and the distance (pitch P13) between the third row a3 (third terminal group) and the fourth group a4 (fourth terminal group), (P17>P12, P13). Further, the distance (pitch P18) between the eighth row a8 (eighth terminal group) and the ninth row a9 (ninth terminal group) is larger than the distance (pitch P12) between the second row a2 (second terminal group) and the third row a3 (third terminal group) and the distance (pitch P13) between the third row a3 (third terminal group) and the fourth row a4 (fourth terminal group), (P18>P12, P13).

Figure 23:
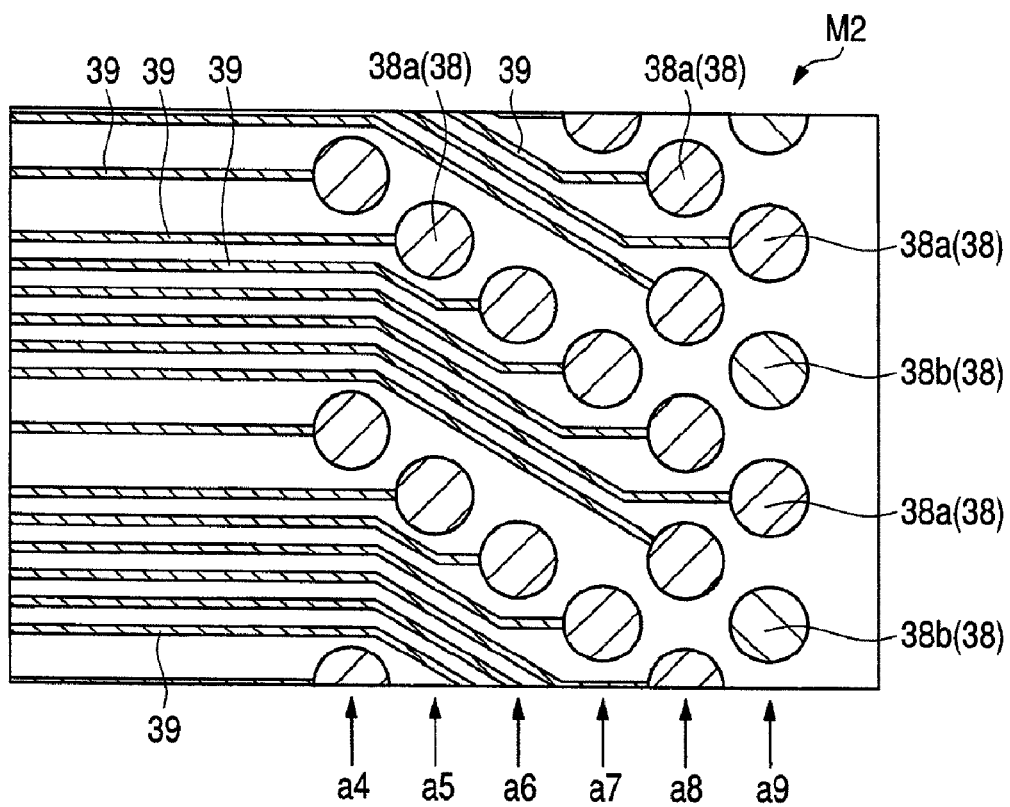
FIG. 23 is a plan view showing a layout of a wiring layer in the wiring substrate used in the semiconductor device of the first embodiment.
Figure 24:
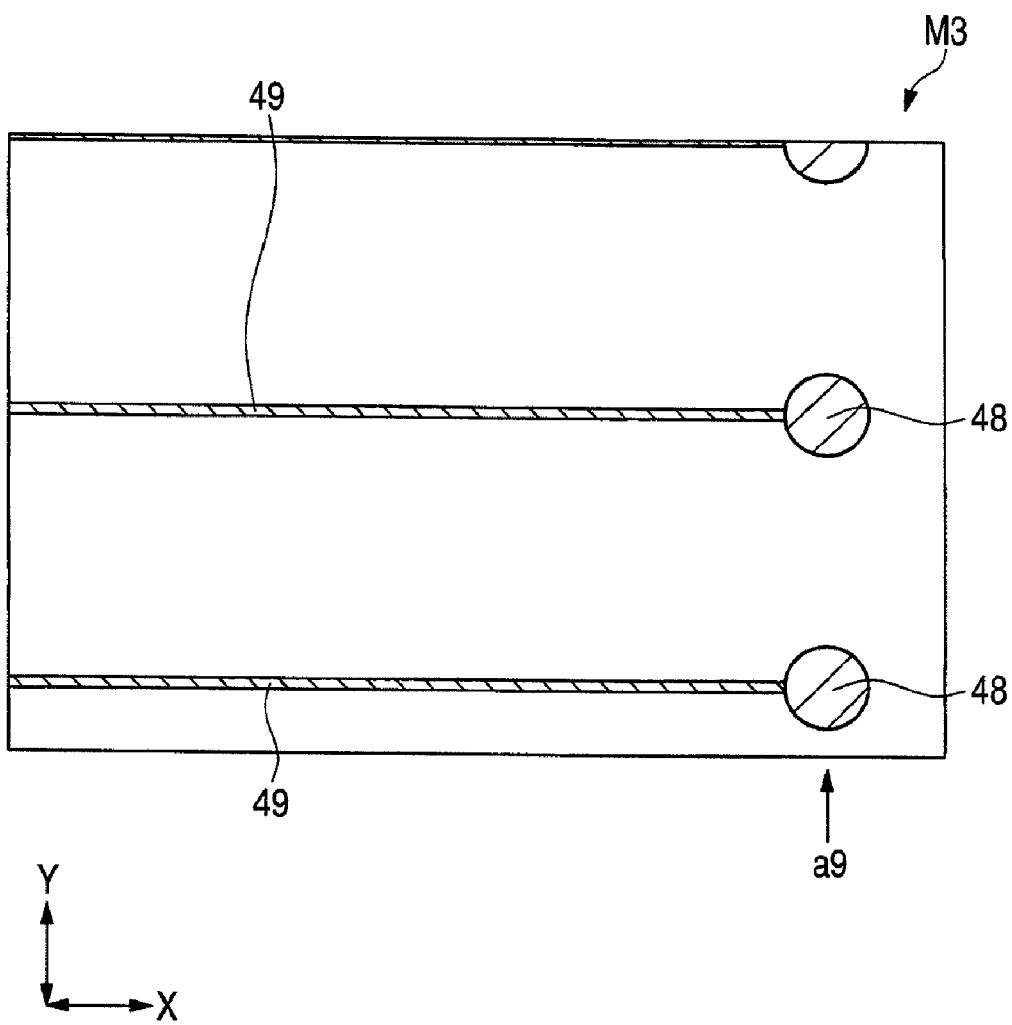
FIG. 24 is a plan view showing a layout of another wiring layer used in the semiconductor device of the first embodiment.

FIG. 23 is a plan view showing a layout of the wiring layer M2 in the same area as FIG. 14. Although FIG. 23 is a plan view, patterns (here lands 38 and lead-out lines 39) in the wiring layer M2 are hatched for ease of understanding. In FIG. 23, of the lands 38, lands 38a are hatched in the same direction and likewise lands 38b are hatched in the same direction, provided the lands 38a and 38b are hatched in directions opposite to each other. Actually, the lands 38a, 38b and lead-out lines 39 are formed by the same wiring layer M2 and hence formed of the same conductor material. Although the lands 38a and the lead-out lines 39 coupled thereto are hatched differently, both are actually formed integrally. FIG. 24 is a plan view showing a layout of the wiring layer M3 in the same area as FIG. 14. Although FIG. 24 is a plan view, patterns (here lands 48 and lead-out lines 49) in the wiring layer M3 are hatched for ease of understanding. Although in FIG. 24 the lands 48 and the lead-out lines 49 coupled thereto are hatched differently, both are actually formed integrally in the same layer using the same conductor material.

The second type lands 8b provided in the wiring layer M1 are coupled electrically through vias V1 formed just thereunder to lands (terminals, second terminals, electrodes, conductive land portions) 38 provided in the underlying wiring layer M2. On the other hand, the first type lands 8a are drawn out using lead-out lines 9. Therefore, vias V1 and lands 38 are disposed under (just under) the second type lands 8b, but neither a via V1 nor a land 38 is disposed under (just under) each first type land 8a. The lands 38 in the wiring layer M2 include lands 38a to which are coupled lead-out lines 39 provided in the wiring layer M2 and lands 38b which are coupled electrically to the underlying wiring layer M3 through vias V2 provided just thereunder. More specifically, the lands (second terminals) 38 in the wiring layer M2 include lands (third type terminals) 38a to which are coupled lead-out lines (second lead-out lines) 39 provided in the second wiring layer M2 and lands (fourth type terminals) 38b which are coupled electrically through vias (second vias) V2 formed thereunder to the wiring layer M3 underlying the wiring layer M2.

According to this embodiment the following considerations are given to facilitate distribution of the lead-out lines 39 in the wiring layer M2.

As shown in FIG. 14, in the wiring layer M1, in the fourth row a4 and subsequent three or more rows (the fourth row a4 to the seventh row a7 in FIG. 14), first type lands 8a and second type lands 8b are arranged alternately in the advancing direction (Y direction) of the rows, and second type lands 8b are arranged in an oblique direction (Z1 or Z2 direction, Z2 direction in FIG. 14) relative to the advancing direction of the rows.

The second type lands 8b arranged in the fourth row a4 and subsequent three or more rows in an oblique direction (Z1 or Z2 direction, Z2 direction in FIG. 14) relative to the advancing direction of the rows are coupled electrically through vias V1 to the lands 38a provided in the wiring layer M2. Lead-out lines 39 provided in the wiring layer M2 are coupled to the lands 38a. The lead-out lines 39 extend from the lands 38a toward the outer periphery of the wiring substrate 2 (in a direction away from the chip mounting area 3a, toward the outside of the chip mounting area 3a).

As shown in FIG. 14, in the fourth row a4 and subsequent three or more rows, if first type lands 8a and second type lands 8b are arranged alternately in the advancing direction (Y direction) of the rows and second type lands 8b are arranged in an oblique direction (Z1 or Z2 direction) relative to the advancing direction of the rows, then in the wiring layer M2 the lands 38a are arranged side by side, while under the first type lands 8a there is formed a vacant area free of land 38. Lead-out lines 39 coupled to the juxtaposed lands 38a can be drawn out toward the outer periphery (toward the outside of the chip mounting area 3a) with use of the area which underlies the first type lands 8a (the vacant area free of land 38). Therefore, it becomes easier to distribute the lead-out lines 39 in the wiring layer M2. Consequently, in the wiring layer M2, the lands 38a can be drawn out efficiently using the lead-out lines 39 and the lands 8 for flip chip bonding can be electrically coupled efficiently to the terminals 10 at the lower surface 2b of the wiring substrate 2 while suppressing the number of wiring layers in the wiring substrate 2.

Of the lands 38 (those to which the second type lands 8b are coupled electrically through vias V1) in the wiring layer M2, the lands 38b with lead-out lines 39 not coupled thereto are coupled electrically to lands (terminals, electrodes, conductive land portions) 48 provided in the wiring layer M3 through vias V2 formed just under the lands 38b. As shown in FIG. 24, lead-out lines 49 provided in the wiring layer M3 are coupled to the lands 48 provided in the wiring layer M3, and with the lead-out lines 49, the lands 48 are drawn out (distributed). In the wiring layer M1, the first type lands 8a are drawn out by the lead-out lines 9, while in the wiring layer M2, the lands 38a are drawn out by the lead-out lines 39. Therefore, although the vias V2 and the lands 48 in the wiring layer M3 are disposed under (just under) the lands 38b in the wiring layer M2, they are not disposed under (just under) the first type lands 8a in the wiring layer M1, nor are they disposed under (just under) the lands 38a in the wiring layer M2. Consequently, the total number of the lands 48 in the wiring layer M3 is fairly small in comparison with that of the lands 8 for flip chip bonding, and in the wiring layer M3 the lands 48 can be drawn out relatively easily using lead-out lines 49. Of the lands 48 in the wiring layer M3, those (the lands 48 with lead-out lines 39 not coupled thereto) incapable of being drawn out by lead-out lines 49 can also be coupled electrically to lands (not shown) provided in the wiring layer M4 through vias V3 formed just under the lands 48.

In the case where the number of rows of lands 8 in the wiring layer M1 is larger than nine rows, the lands 8 in the tenth and subsequent rows (corresponding to the inner periphery-side rows located more inside than the ninth row a9) are coupled as the second type lands 8b to the lands 38 in the wiring layer M2 through vias V1 and further coupled to the lands 48 in the wiring layer M3 through vias V2. The lands 48 coupled through vias V1, lands 38b and vias V2 to the lands 8 in the tenth and subsequent rows (corresponding to the inner periphery-side rows located more inside than the ninth row a9) can be drawn out by coupling thereto the lead-out lines 49 in the wiring layer M3 or can be coupled to the lands in an underlying wiring layer (the wiring layer M4 or a still lower wiring layer) and then drawn out using the lead-out lines in that wiring layer. In this way it is also possible to cope with an increase in the number of rows of lands 8.

Figure 25:
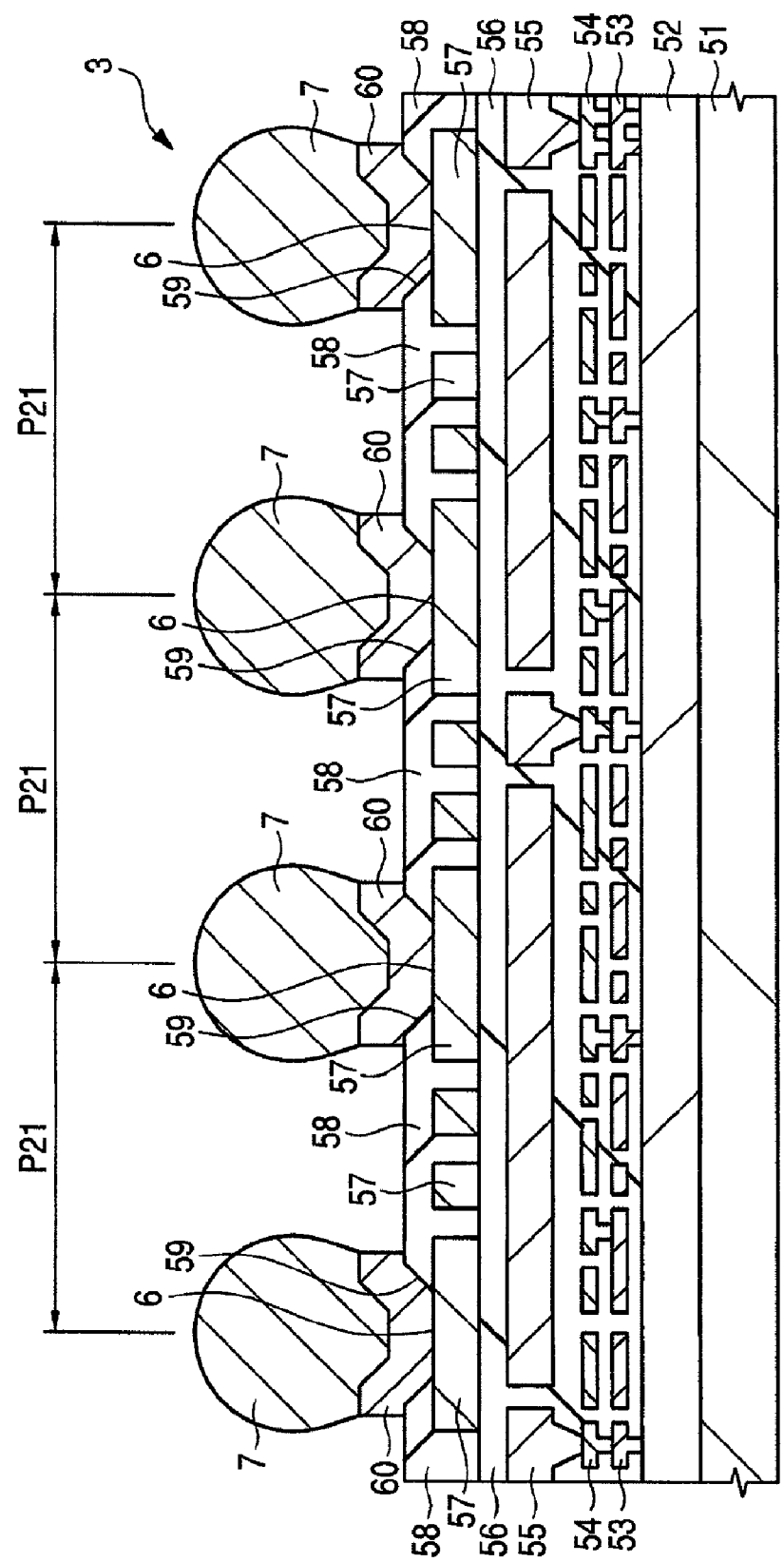
FIG. 25 is a sectional view of a principal portion of the semiconductor chip used in the semiconductor device of the first embodiment.
Figure 26:
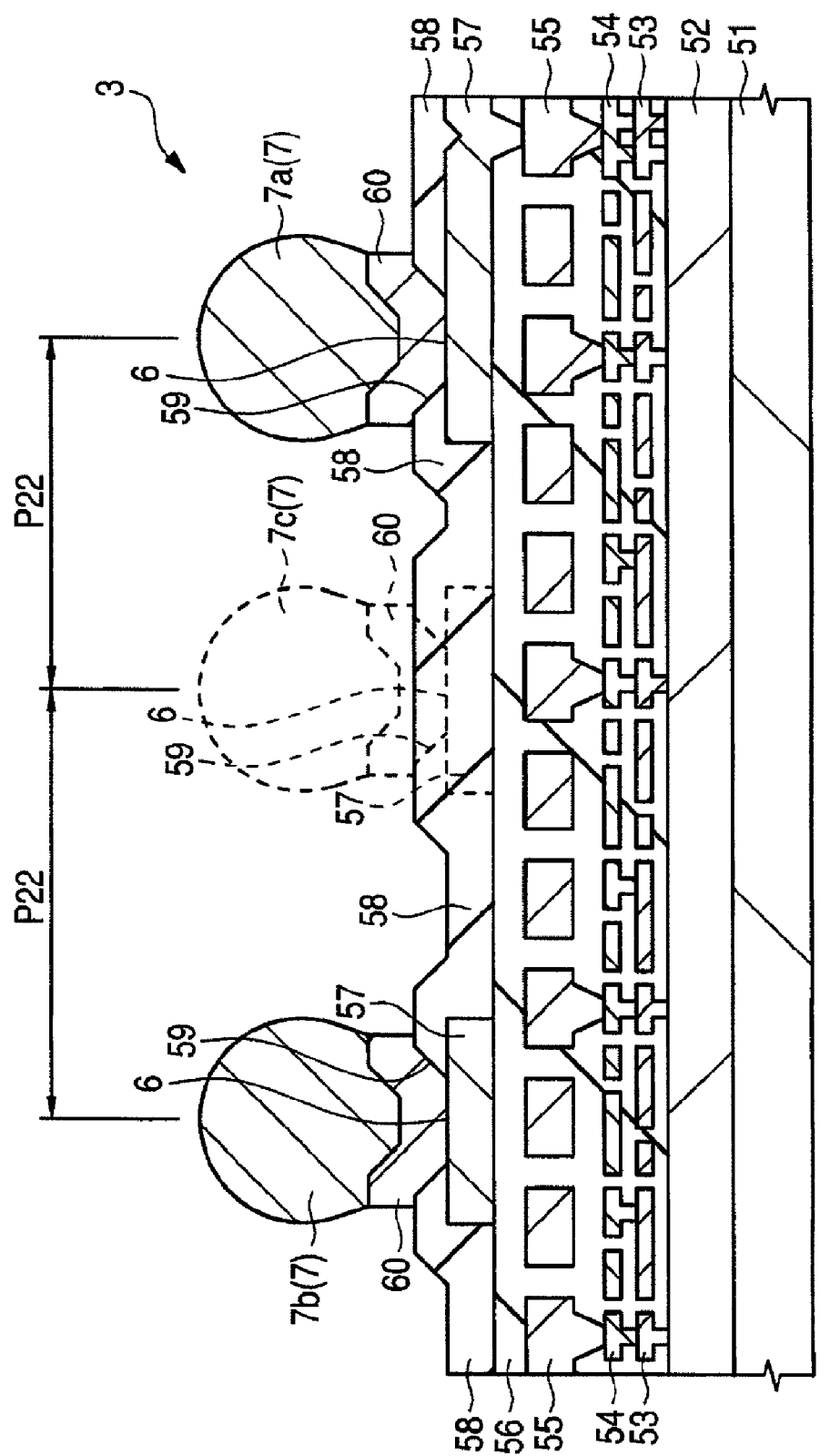
FIG. 26 is a sectional view of a principal portion of the semiconductor chip used in the semiconductor device of the first embodiment.

FIGS. 25 and 26 are each a sectional view of a principal portion of the semiconductor chip 3. The semiconductor chip 3 shown in FIGS. 25 and 26 is in a state before being mounted (packaged) onto the wiring substrate 2 (21).

A semiconductor element is formed on a semiconductor substrate 51 which configures the semiconductor chip 3, but in FIGS. 25 and 26, for simplification of the drawings, a semiconductor element-formed area on the semiconductor substrate 51 is shown schematically as a semiconductor element-forming area 52. Wiring layers 53, 54, 55 and interlayer dielectric film are formed alternately on the semiconductor forming area 52 to form a multilayer interconnection structure. In FIGS. 25 and 26 the interlayer dielectric film which forms the multilayer interconnection structure is shown schematically by an insulation layer 56. Relocation wiring lines 57 are formed on the multilayer interconnection structure and a protective film (surface protecting film, protective resin film) 58 is formed on the relocation wiring lines 57, using polyimide resin for example. The protective film 58 is formed with apertures 59 for exposing the relocation wiring lines 57 partially therefrom. Pad electrodes 6 are formed by the relocation wiring lines 57 exposed from the apertures 59 of the protective film 58. A UBM (under bump metal) film 60 is formed as a bump substrate film on each pad electrode 6 and a bump electrode 7 is formed on the UBM film 60. The UBM film 60 is provided for improving the adhesion (bonding strength) between the bump electrode 7 and the pad electrode 6 and it is a metallic film formed by a plating method for example. Therefore, the bump electrode 7 is formed on the pad electrode 6 through the UBM film 60. The semiconductor chip 3 is thus configured.

FIG. 25 shows a section taken in an advancing direction of rows (in a direction parallel to the sides 3b of the semiconductor chip 3) in the array of bump electrodes 7 on the surface of the semiconductor chip 3, while FIG. 26 shows a section taken in a direction perpendicular to the advancing direction of rows (in a direction orthogonal to the sides 3b of the semiconductor chip 3). In the array of bump electrodes 7 in the semiconductor chip 3, like the array of lands 8 in the semiconductor substrate 2, the arrays of adjacent rows are deviated a half pitch from each other, so that only the bump electrodes 7 in alternate rows ought to appear in the section of FIG. 26, but for ease of understanding, a bump electrode 7c (and the structure of the underlying pad electrode 6) which belongs to a row located between the row of bump electrodes 7a and the row of bump electrodes 7b is seen through and indicated with a dotted line.

As described above, in the array of lands 8 in the chip mounting area 3a on the upper surface 2a of the wiring substrate 2, the lands 8 are arranged at equal pitches in each row, but the pitch between rows of lands 8 is not made an equal pitch, but is designed so that the pitch between adjacent rows which are in the foregoing second or third relation is larger than the pitch between adjacent rows which are in the foregoing first relation. The array of lands 8 for flip chip bonding at the upper surface 2a of the wiring substrate 2 corresponds to the layout of pad electrodes 6 at the surface of the semiconductor chip 3 (i.e., the layout of pad electrodes 7 formed on the pad electrodes 6), so that in the array of pad electrodes 6 (bump electrodes 7) at the surface of the semiconductor chip 3, the pad electrodes 6 (bump electrodes 7) are arranged at equal pitches in each row, but the row-to-row pitch is not an equal pitch.

That is, as shown in FIG. 25, in the direction parallel to the sides 3b of the semiconductor chip 3, the bump electrodes 7 are arranged at equal pitches and the pitch (array pitch, spacing) P21 between bump electrodes 7 is the same. Since the array of lands 8 at the upper surface 2a of the wiring substrate 2 and that of bump electrodes 7 at the surface of the semiconductor chip 3 are the same, the pitch p21 between bump electrodes at the surface of the semiconductor chip 3 becomes equal to the above pitch P1 of lands 8 at the upper surface 2a of the wiring substrate 2, (P21=P1).

On the other hand, as shown in FIG. 26, in the direction orthogonal to a side of the semiconductor chip 3, the row-to-row pitch (array pitch, spacing) P22 of bump electrodes 7 is not the same. Since the array of lands at the upper surface 2a of the wiring substrate 2 and that of bump electrodes 7 at the surface of the semiconductor chip 3 are the same, the row-to-row pitch P22 of bump electrodes 7 at the surface of the semiconductor chip 3 is equal to the corresponding row-to-row pitch (any of the above pitches P11, P12, P13, P14, P15, P16, P17 and P18) of lands 8 at the upper surface 2a of the wiring substrate 2.

Figure 27:
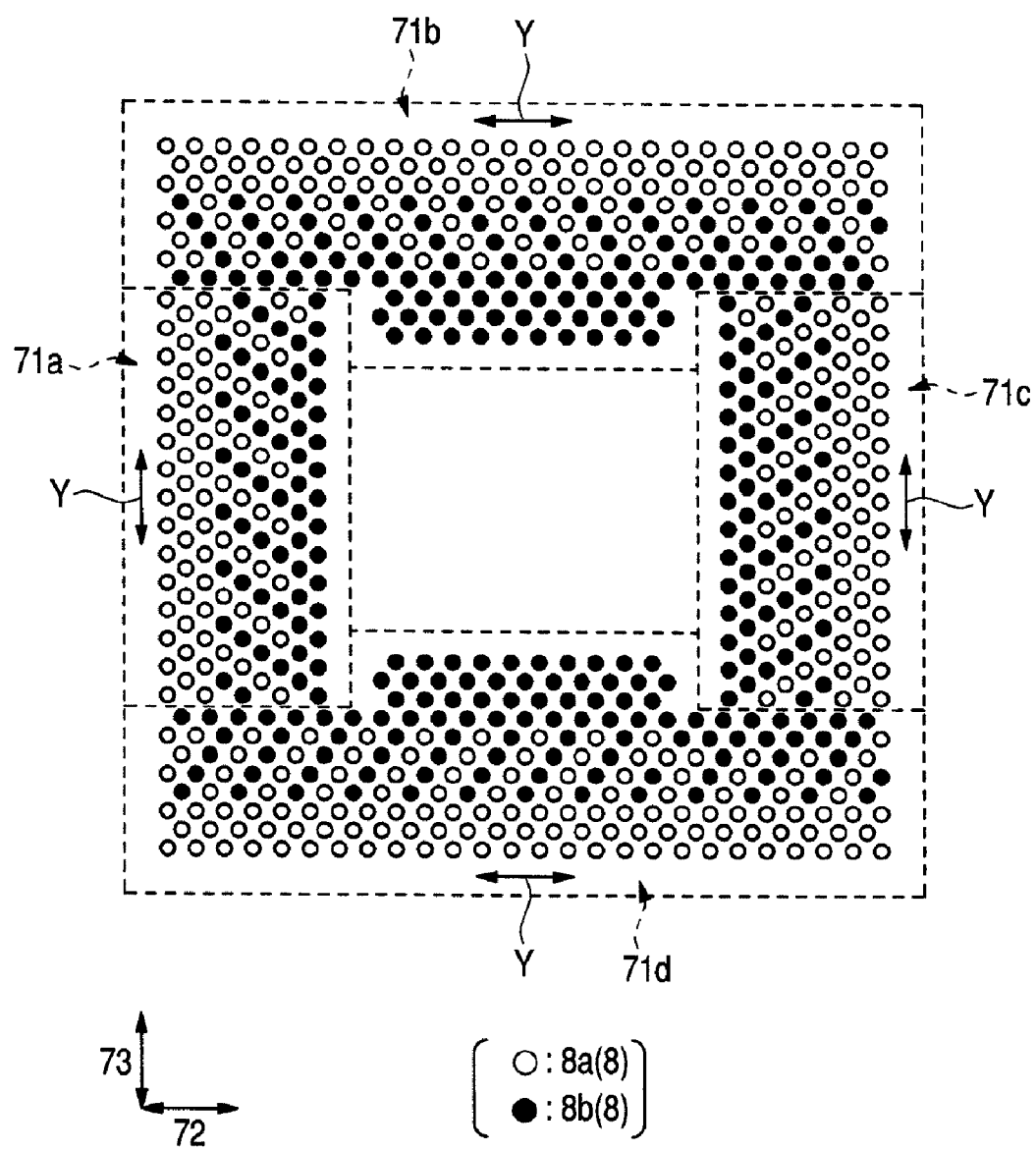
FIG. 27 is a diagram explaining an array of lands in a chip mounting area on an upper surface of the wiring substrate.

FIG. 27 is a diagram explaining an array of lands 8 in the chip mounting area 3a on the upper surface 2a of the wiring substrate 2. The array shown therein is similar to that of FIG. 13.

As described above, in the chip mounting area 3a on the upper surface 2a of the wiring substrate 2, plural lands 8 for flip chip bonding are arranged in six or more rows along the sides of the chip mounting area 3a. In the advancing direction of the rows, the lands 8 are arranged at equal pitches, but the row-to-row pitch in the array of the lands 8 is not made equal, and in land rows which are likely to cause a short-circuit the pitch between adjacent rows is made large, while in land rows which are difficult to cause a short-circuit the pitch between adjacent rows is made small. Therefore, in the chip mounting area 3a on the upper surface 2a of the wiring substrate 2, if the lands 8 are arrayed in six or more rows along the four sides of the chip mounting area, the array becomes complicated at corner areas.

To avoid such an inconvenience, in this embodiment, as shown in FIG. 27, the array of lands 8 in the chip mounting area 3a on the upper surface 2a of the wiring substrate 2 is divided into plural blocks (zones), here blocks 71a, 71b, 71c, and 71d, and lands 8 are arrayed in six or more rows in each of the blocks 71a, 71b, 71c, and 71d. The blocks 71a, 71b, 71c and 71d are arranged along the four sides respectively of the chip mounting area 3a. How to array lands 8 and how to draw out lead-out lines 9 in each of the blocks 71a, 71b, 71c and 71d are as explained above in connection with FIGS. 14 to 24 and therefore explanations thereof will here be omitted.

The advancing direction of rows in the array of lands 8 in each of the blocks 71a, 71b, 71c and 71d is parallel to the side of the chip mounting area 3a which side mainly includes the block concerned. That is, in FIG. 27, the advancing direction Y of rows in the array of lands 8 in block 71a is parallel to the direction 73 shown in FIG. 27. The advancing direction Y of rows in the array of lands 8 in block 71b is parallel to the direction 72 shown in FIG. 27. The advancing direction Y of rows in the array of lands 8 in block 71c is parallel to the direction 73 shown in FIG. 27. The advancing direction Y of rows in the array of lands 8 in block 71d is parallel to the direction 72 shown in FIG. 27. The directions 72 and 73 are each parallel to sides of the chip mounting area 3a, but are orthogonal to each other.

The blocks 71a, 71c and the blocks 71b, 71d are different in the advancing direction of rows, so at a boundary between the blocks 71a and 71b the respective arrays of lands 8 do not coincide with each other. Likewise, at a boundary between the blocks 71b and 71c the respective arrays of lands 8 do not coincide with each other. At a boundary between the blocks 71c and 71d the respective arrays of lands 8 do not coincide with each other. Further, at a boundary between the blocks 71d and 71a the respective arrays of lands 8 do not coincide with each other. By dividing the array of lands in the chip mounting area 3a on the upper surface 2a of the wiring substrate into the blocks 71a, 71b, 71c, and 71d, and arraying lands 8 in each of the blocks 71a, 71b, 71c, and 71d, in such a fashion as explained above in connection with FIGS. 14 to 24, it is possible to arrange lands 8 efficiently in the chip mounting area 3a.

Figure 28:
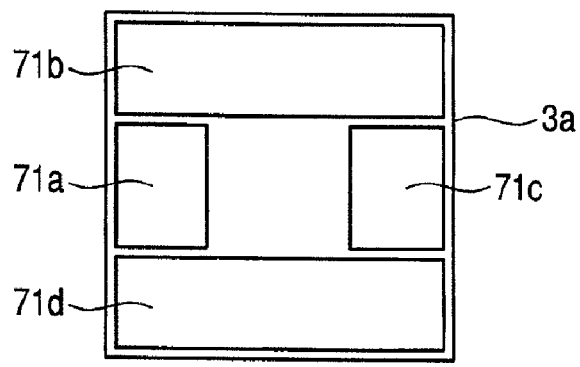
FIG. 28 is an explanatory diagram showing an example of a method for dividing an array of lands into plural blocks in the chip mounting area on the upper surface of the wiring substrate.
Figure 29:
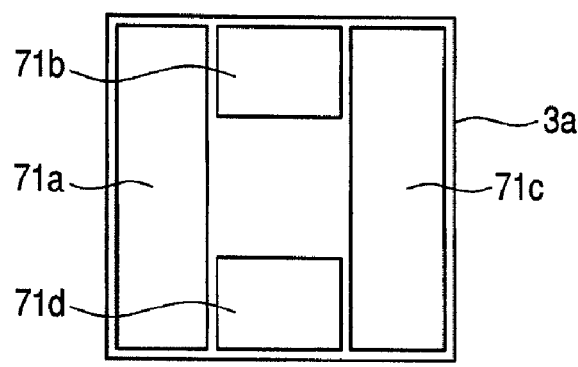
FIG. 29 is an explanatory diagram showing another example of a method for dividing an array of lands into plural blocks in the chip mounting area on the upper surface of the wiring substrate.
Figure 30:
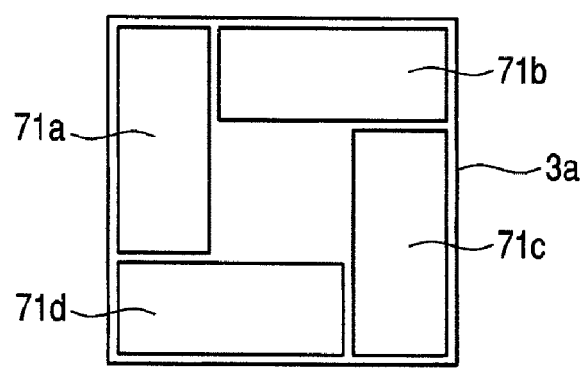
FIG. 30 is an explanatory diagram showing a further example of a method for dividing an array of lands into plural blocks in the chip mounting area on the supper surface of the wiring substrate.

The way of dividing the array of lands 8 into plural blocks in the chip mounting area 3a on the upper surface 2a of the wiring substrate 2 is not limited to the one shown in FIG. 27, but various changes may be made as necessary. FIGS. 28 to 30 are explanatory diagrams showing how to divide the array of lands 8 in the chip mounting area 3a on the upper surface of the wiring substrate 2 into the blocks 71a, 71b, 71c, and 71d. The way of division shown in FIG. 28 corresponds to FIG. 27, but such ways of division as shown in FIGS. 29 and 30 may also be adopted for dividing the array of lands 8 in the chip mounting area 3a into the blocks 71a, 71b, 71c, and 71d. There further may be adopted a dividing method other than those shown in FIGS. 29 and 30 to divide the array of lands in the chip mounting area 3a into plural blocks. In each divided block there may be arranged lands 8 and lead-out lines 9 as described above in connection with FIGS. 14 to 24.

Although in this embodiment a description has been given above about the case of nine rows (the first row a1 to the ninth row a9) in connection with the array of lands 8 in the chip mounting area 3a on the upper surface 2a of the wiring substrate 2, the design concept of layout of lands 8 and lead-out lines 9 described above in this embodiment is also applicable to any other number of rows than nine rows.

In the case where the array of lands 8 comprises five rows or less, the number of lands 8 to be drawn out is small and so is the number of lead-out lines passing between lands 8, so that even if the row-to-row pitch is made an equal pitch, a short-circuit between a land and a lead-out line in adjacent lands is difficult to occur. However, in the case where the number of rows in the array of lands 8 is six rows or more, the number of lands 8 to be drawn out is large and so is the number of lead-out lines passing between lands, so that both prevention of a short-circuit and improvement in the layout density of lands 8 can be attained at a time by application of the design concept of layout of lands 8 and lead-out lines 9 described above in this embodiment.

In the case where the array of lands 8 in the wiring layer M1 comprises nine rows or more, for example lands 8 in the tenth and subsequent rows (corresponding to the inner periphery-side rows more inside than the ninth row a9 can be coupled as second type lands 8b to the lands in the wiring layer M2 through vias V1. When the array of lands 8 in the wiring layer M1 comprises eight rows, for example in the array of the above nine rows which are the first row a1 to the ninth row a9, there may be adopted an array resulting from omitting any one of the fourth row a4 to the ninth row a9. When the array of lands 8 in the wiring layer M1 comprises seven rows, for example in the array of the above nine rows which are the first row a1 to the ninth row a9, there may be adopted an array resulting from omitting any two of the fourth row a4 to the ninth row a9. When the array of lands 8 in the wiring layer M1 comprises six rows, for example in the array of the above nine rows which are the first row a1 to the ninth row a9, there may be adopted an array resulting from omitting any three of the fourth row a4 to the ninth row a9. Further, when the array of lands 8 comprises six rows, there may be adopted a configuration wherein each of the lands 8 in the fourth row a4 to the sixth row a6 is made a first type land 8a and a lead-out line 9 is coupled thereto and drawn out toward the inner periphery of the chip mounting area 3a.

Second Embodiment

Figure 31:
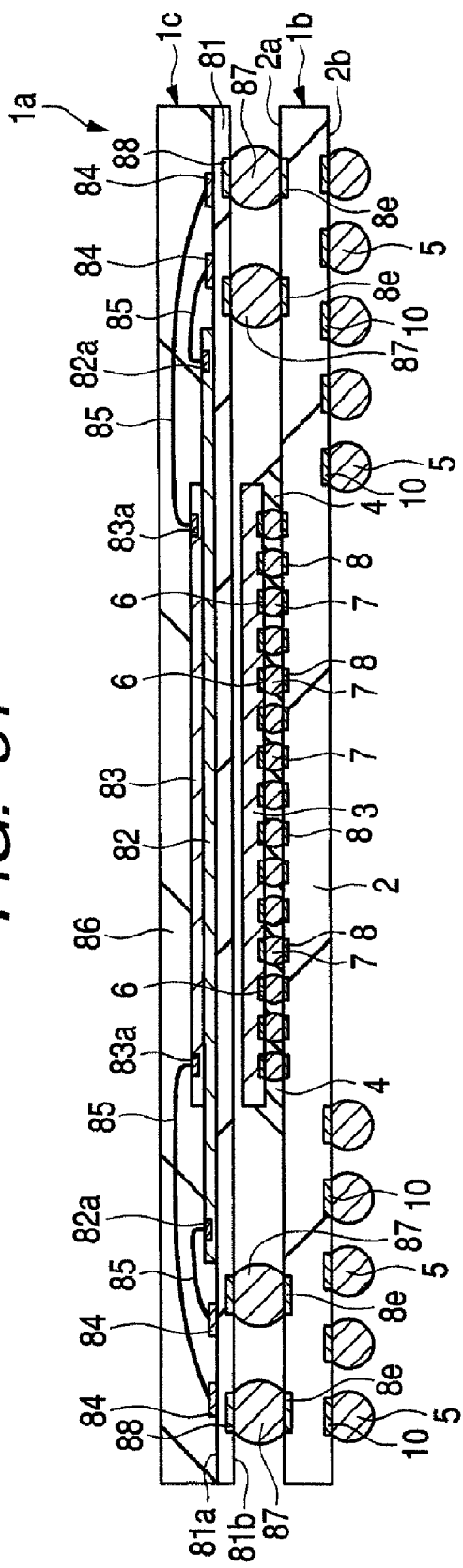
FIG. 31 is a sectional view of a semiconductor device according to a second embodiment of the present invention.
Figure 32:
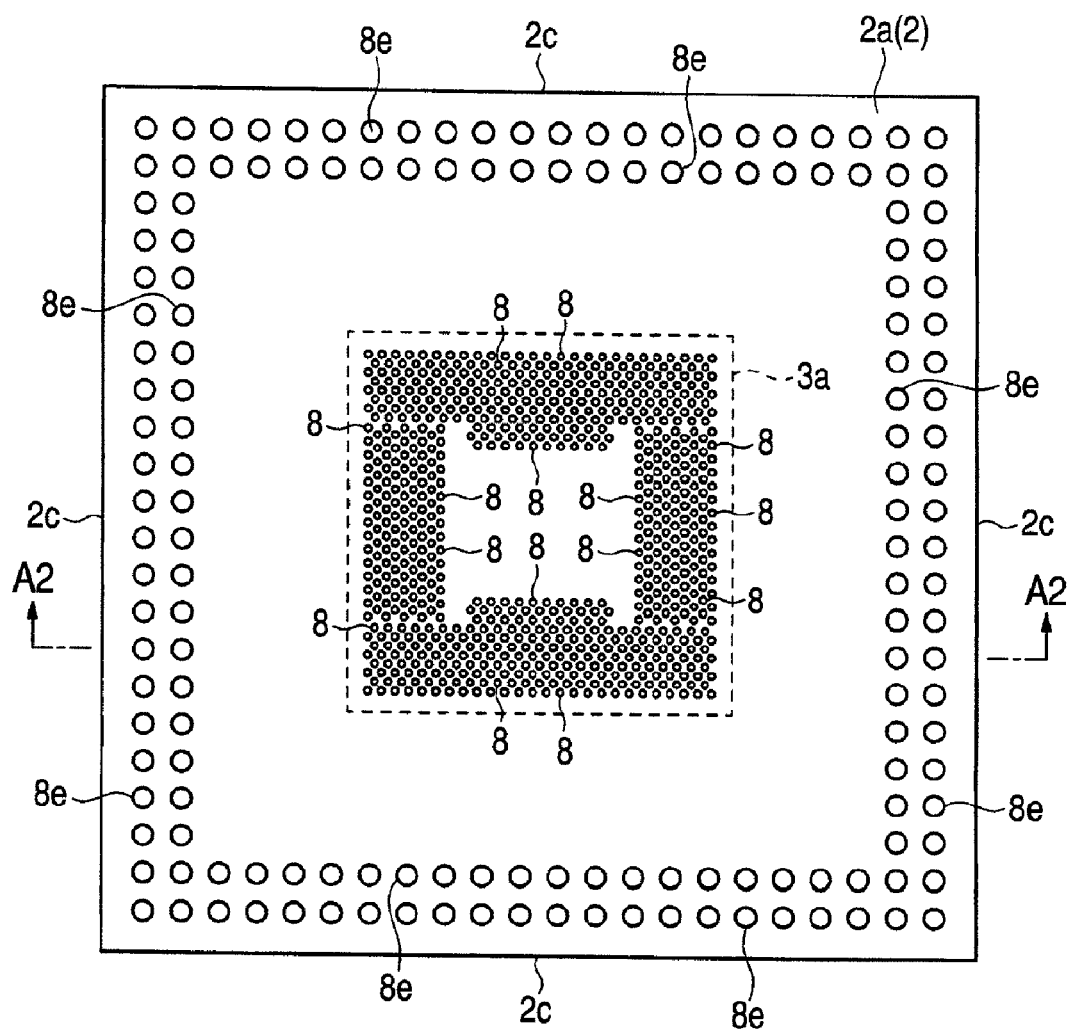
FIG. 32 is a top view of a wiring substrate used in the semiconductor device of the second embodiment.
Figure 33:
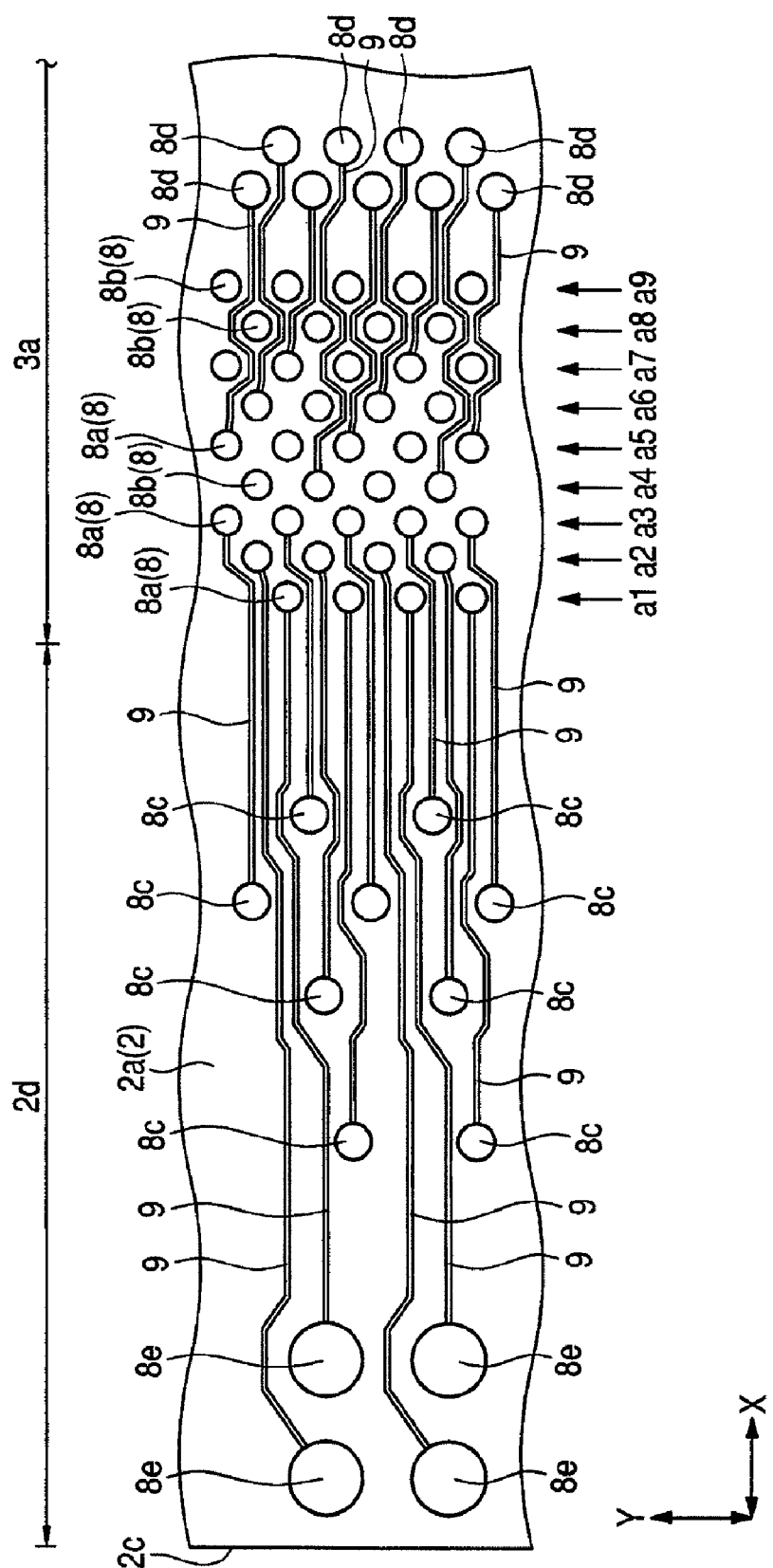
FIG. 33 is a plan view of a principal portion of the wiring substrate used in the semiconductor device of the second embodiment.

FIG. 31 is a sectional view (entire sectional view, side sectional view) of a semiconductor device 1a according to a second embodiment of the present invention, corresponding to FIG. 1 referred to in the first embodiment. FIG. 32 is a top view (plan view) of a wiring substrate 2 used in the semiconductor device 1a of FIG. 31, corresponding to FIG. 5 referred to in the first embodiment. FIG. 33 is a plan view of a principal portion of the wiring substrate 2, corresponding to FIG. 16 referred to in the first embodiment. Also in FIG. 33, like FIG. 16, a solder resist layer SR1 as a top layer of the wiring substrate 2 is seen through, showing a layout of a top wiring layer M1 (here lands 8, 8c, 8d, 8e and lead-out lines 9) out of wiring layers M1 to M6 of the wiring substrate 2. A section of the wiring substrate 2 taken on line A2-A2 in FIG. 32 substantially corresponds to the section of the wiring substrate 2 in the semiconductor device 1a shown in FIG. 31.

The semiconductor device 1a of this embodiment is a so-called POP (Package On Package) type semiconductor device wherein on a semiconductor device 1b corresponding to the semiconductor device 1 of the first embodiment there is packaged (mounted) another BGA type semiconductor device 1c as an upper package to form the semiconductor device 1a of this embodiment.

A description will be given first about a point that a wiring substrate 2 used in the semiconductor device 1b as a lower package is different from the wiring substrate 2 used in the semiconductor device 1 of the previous first embodiment.

More particularly, as shown in FIGS. 31 to 33, plural lands (terminals, substrate-side terminals, electrodes, conductive land portions) 8e as terminals for mounting the semiconductor device 1c serving as an upper package are formed at an upper surface 2a of the wiring substrate 2 which is used in the semiconductor device 1b serving as a lower package. The lands 8e are arranged for example in two rows along a peripheral portion of the upper surface 2a of the wiring substrate 2. In the array of lands 8e at the upper surface 2a of the wiring substrate 2, the number of rows may be changed as necessary. At the upper surface 2a of the wiring substrate 2 the lands 8e are exposed from apertures formed in the solder resist layer SR1. A planar shape of each land 8e is circular, but the diameter (land diameter) of each land 8e is larger than the diameter (land diameter) of each of lands 8, 8c and 8d. This is because the lands 8 are terminals for coupling bump electrodes 7 of the semiconductor chip 3 thereto, whereas the lands 8e are terminals for coupling solder balls 87 of the semiconductor device 1c thereto and the size of each solder ball 87 is larger than that of each bump electrode 7.

At the upper surface 2a of the wiring substrate 2, lead-out lines 9 extended toward the outer periphery after being coupled to lands 8 (first type lands 8a) in three outer periphery-side rows out of the lands 8 arranged in the chip mounting area 3 are coupled to either the lands 8c or 8e arranged in an outer periphery-side area 2d more outside than the chip mounting area 3a on the upper surface 2a of the wiring substrate 2, as shown in FIG. 33. That is, the lands 8 (first type lands 8a) arranged in the chip mounting area 3a and belonging to the first row a1 to the third row a3 and the lands 8c or 8e arranged in the outer periphery-side area 2d with respect to the chip mounting area 3a are coupled together electrically using lead-out lines 9. Like the lands 8, 8c, 8d and the lead-out lines 9, the lands 8e are also formed by the wiring layer M1. Among the lands 8e provided at the upper surface 2a of the wiring substrate 2 there are included those coupled electrically to the wiring layer M2 through vias V1 formed under (just under) the lands 8e and further coupled electrically to terminals 10 formed at a lower surface 2b of the wiring substrate 2 through vias V2-V5 and wiring layers M3-M6 and those with vias V1 not formed thereunder (just thereunder) and not coupled to the terminals 10 at the lower surface 2b of the wiring substrate 2. These lands are arranged as necessary at the upper surface 2a of the wiring substrate 2.

Other constructional points of the wiring substrate 2 used in the semiconductor device 1b as an upper package are the same as those of the wiring substrate 2 used in the semiconductor device 1 of the first embodiment and therefore explanations thereof will here be omitted. Thus, also in this embodiment, the way of arraying lands 8 in the chip mounting area 3a on the upper surface 2a of the wiring substrate 2 and the way of drawing out the lead-out lines 9 from the lands 8 are the same as in the first embodiment. Also as to the configuration of the semiconductor device 1b as a lower package, an explanation thereof will here be omitted because it is the same as that of the semiconductor device 1 of the first embodiment except the aforesaid difference in configuration of the wiring substrate 2.

The configuration of the semiconductor device 1c as an upper package will be described below with reference to FIG. 31.

The semiconductor device 1c as an upper package includes a wiring substrate 81, semiconductor chips 82 and 83 mounted on an upper surface 81a of the wiring substrate 81, plural bonding wires 85 for coupling plural electrodes 82a and 83a formed at surfaces of the semiconductor chips 82 and 83 and plural coupling terminals 84 formed at the upper surface 81a of the wiring substrate 81 electrically with each other, and sealing resin 86 which covers the upper surface 81a of the wiring substrate 81 including the semiconductor chips 82, 83 and the bonding wires 85. Plural solder balls (ball electrodes, salient electrodes, solder bumps) 87 serving as external terminals (external coupling terminals) of the semiconductor device 1c which is an upper package are formed on a lower surface 81b of the wiring substrate 81 which corresponds to the lower surface of the semiconductor device 1c.

In the semiconductor device 1c as an upper package, the semiconductor chip 82 is mounted and bonded onto the upper surface 81a of the wiring substrate 81 through a bonding material (not shown) and the semiconductor chip 83 is mounted and bonded onto the semiconductor chip 82 through a bonding material (not shown). Electrodes (pad electrodes) 82a of the semiconductor chip 82 are coupled electrically to a semiconductor element or a semiconductor integrated circuit formed in the interior or a surface layer portion of the semiconductor chip 82. Likewise, electrodes (pad electrodes) 83a of the semiconductor chip 83 are coupled electrically to a semiconductor element or a semiconductor integrated circuit device formed in the interior or a surface layer portion of the semiconductor chip 83. Plural terminals (lands) 88 are arranged at the lower surface 81b of the wiring substrate 81 and solder balls 87 are coupled to (formed on) the terminals 88 respectively. The electrodes 82a and 83a of the semiconductor chips 82 and 83 respectively are coupled electrically through the bonding wires 85 and a conductor layer (including the coupling terminals 84) of the wiring substrate 81 to the terminals 88 at the lower surface 81b of the wiring substrate 81 and further to the solder balls 87 coupled to the terminals 88.

The following description is now provided about the configuration of the semiconductor device 1a of this embodiment.

In the semiconductor device 1a, the semiconductor device 1c as an upper package is disposed over the semiconductor device 1b as a lower package and the solder balls 87 of the semiconductor device 1c as an upper package are coupled (soldered) to the lands 8e formed at the upper surface 2a of the wiring substrate 2 in the semiconductor device 1b as a lower package. Therefore, the solder balls 87 of the semiconductor device 1c as an upper package are bonded (soldered) and coupled electrically to the lands 8e formed at the upper surface 2a of the wiring substrate 2 in the semiconductor device 1b as a lower package. Since the solder balls 87 of the semiconductor device 1c are bonded to in the semiconductor device 1b, the array of the terminals 88 (and the solder balls 87 coupled thereonto) at the lower surface 81b of the wiring substrate 81 in the semiconductor device 1c corresponds to the array of lands 8e at the upper surface 2a of the wiring substrate 2 in the semiconductor device 1b. The semiconductor device 1a can be manufactured by fabricating the semiconductor devices 1b and 1c, then disposing (mounting) the semiconductor device 1c over the semiconductor device 1b so that the solder balls 87 of the semiconductor device 1c confront the lands 8e of the semiconductor device 1b, and subsequently performing solder reflow to bond the solder balls 87 of the semiconductor device 1c to the lands 8e at the upper surface 2a of the wiring substrate 2 in the semiconductor device 1b.

In the semiconductor device 1a, the electrodes 82a and 83a of the semiconductor chips 82 and 83 respectively are coupled electrically to the lands 8e of the wiring substrate 2 through bonding wires 85, the conductor layer of the wiring substrate 81 and solder balls 87, and are further coupled electrically to the solder balls 5 through vias V1-V5 formed in the wiring substrate 2 and wiring layers M2-M6 or to the bump electrodes 7 of the semiconductor chip 3 through lead-out lines 9 and lands 8 of the wiring substrate 2. In the semiconductor device 1a, the bump electrodes 7 of the semiconductor chip 3 are coupled electrically to the lands 8 of the wiring substrate 2 and further coupled electrically to the solder balls 5 through wiring layers M1-M6 and vias V1-V5 in the wiring substrate 2 or to the electrodes 82a and 83a of the semiconductor chips 82 and 83 respectively through lead-out lines 9 and lands 8e of the wiring substrate 2, solder balls 87, the conductor layer of the wiring substrate 81 and bonding wires 85. Therefore, in the semiconductor device 1a, the electrodes (pad electrodes 6 or bump electrodes 7) of the semiconductor chip 3 and the electrodes 82a, 83a of the semiconductor chips 82, 83 can be coupled together electrically as necessary through lands 8, lead-out lines 9 and lands 8e of the wiring substrate 2, solder balls 87, the conductor layer of the wiring substrate 81 and bonding wires 85.

According to the previous first embodiment, in coupling the lands 8 for flip chip bonding formed at the surface 2a of the wiring substrate 2 electrically to the solder balls 5 formed on the lower surface 2b of the wiring substrate 2, there is made some improvement with respect to the array of lands 8 and the method of drawing out the lead-out lines, as described above. On the other hand, according to this second embodiment, the lands 8 for flip chip bonding formed at the upper surface 2a of the wiring substrate 2 are coupled electrically to the solder balls 5 arranged on the lower surface 2b of the wiring substrate 2 and also to the solder balls 87 arranged on the upper surface 2a of the wiring substrate 2. Also in this case the same effects as in the first embodiment can be obtained by applying such array of lands 8 and way of drawing out the lead-out lines as described in the first embodiment.

Although the present invention has been described above concretely on the basis of embodiments thereof, it goes without saying that the present invention is not limited to the above embodiments, but that various changes may be made within the scope not departing from the gist of the invention.

What is claimed is:

1. A semiconductor device comprising:
a wiring substrate having a first main surface, a plurality of first terminals formed in a chip mounting area over the first main surface, a first back surface positioned on the side opposite to the first main surface, and a plurality of lands formed over the first back surface; and a semiconductor chip having a second main surface, a plurality of first electrodes formed over the second main surface, and a plurality of salient electrodes formed over the first electrodes, the semiconductor chip being mounted over the first main surface of the wiring substrate through the salient electrodes such that the second main surface confronts the first main surface of the wiring substrate, wherein the first terminals have a first terminal group comprising the first terminals arrayed in a row, a second terminal group comprising the first terminals arrayed in a row, the second terminal group being disposed at a more inside position of the chip mounting area than the first terminal group, and a third terminal group comprising the first terminals and disposed at a more inside position of the chip mounting area than the second terminal group, wherein the first terminals of the first terminal group correspond to first-row terminals, the first terminals of the second terminal group correspond to second-row terminals, and the first terminals of the third terminal group correspond to third-row terminals, wherein the second-row terminals in the second terminal group are each positioned between the first-row terminals adjacent each other in the first terminal group, wherein the third-row terminals in the third terminal group are each positioned between the second-row terminals adjacent each other in the second terminal group, and wherein the distance between the first terminal group and the second terminal group is larger than the distance between the second terminal group and the third terminal group.

2. The semiconductor device according to claim 1, wherein the distance between the first-row terminals adjacent each other in the first terminal group is equal to the distance between the second-row terminals adjacent each other in the second terminal group and also equal to the distance between the third-row terminals adjacent each other in the third terminal group.

3. The semiconductor device according to claim 2,
wherein a plurality of lead-out lines are coupled to the first terminals respectively, and
wherein the lead-out lines extend outwards of the chip mounting area respectively from the first-, second- and third-row terminals.

4. The semiconductor device according to claim 3, wherein the lead-out lines are formed between the first- and second-row terminals, but are not formed between the second- and third-row terminals.

5. The semiconductor device according to claim 4,
wherein the first electrodes of the semiconductor chip are coupled electrically to the first terminals of the wiring substrate respectively through the salient electrodes, and
wherein the first terminals are coupled electrically to the lands respectively through wiring lines and vias formed in the wiring substrate.

6. The semiconductor device according to claim 5,
wherein the first terminals further have a fourth terminal group comprising the first terminals arrayed in a row and being disposed at a more inside position of the chip mounting area than the third terminal group,
wherein the first terminals of the fourth terminal group correspond to fourth-row terminals, wherein the fourth-row terminals in the fourth terminal group are each positioned between the third-row terminals adjacent each other in the third terminal group, and
wherein the fourth-row terminals are coupled electrically to the lands through vias formed in the wiring substrate.

7. The semiconductor device according to claim 6,
wherein the lead-out lines coupled to the fourth-row terminals extend inwards of the chip mounting area, and
wherein the fourth-row terminals are coupled electrically to the lands through the lead-out lines and the vias disposed inside the chip mounting area.

8. A semiconductor device comprising:
a wiring substrate having a first main surface with a plurality of first terminals disposed thereover; and
a semiconductor chip having a second main surface with a plurality of first electrodes disposed thereover, the semiconductor chip being mounted over the first main surface of the wiring substrate through a plurality of salient electrodes,
wherein the first electrodes of the semiconductor chip are coupled electrically to the first terminals respectively through the salient electrodes,
wherein the wiring substrate has a plurality of wiring layers including a first wiring layer and a second wiring layer underlying the first wiring layer,
wherein the first terminals are provided in the first wiring layer, the first terminals are arrayed in six or more rows regularly in an advancing direction of the rows, the arrays of adjacent rows being deviated from each other,
wherein the first terminals include first type terminals to which first lead-out lines provided in the first wiring layer are coupled and second type terminals with first vias formed thereunder respectively, the second type terminals being coupled electrically to the second wiring layer through the first vias,
wherein a row-to-row pitch of the first terminals arrayed in six or more rows is such that the pitch between adjacent rows which are in a second relation or a third relation is larger than the pitch between adjacent rows which are in a first relation,
wherein in the adjacent rows which are in the first relation the first lead-out lines do not each pass between the first terminals adjacent each other in between the two adjacent rows, and the second type terminals are not present in at least one of two adjacent rows,
wherein in the adjacent rows which are in the second relation the first lead-out lines each pass between the first terminals adjacent each other in between the two adjacent rows, and
wherein in the adjacent rows which are in the third relation the second type terminals are present in both the two adjacent rows.

9. The semiconductor device according claim 8, wherein in the first terminals arrayed in six or more rows, between the first terminals belonging to each of the rows and adjacent each other a corresponding one of the first terminals belonging to a row adjacent to that row is positioned, when looking in a direction orthogonal to the advancing direction of the rows.

10. The semiconductor device according to claim 9, wherein the first terminals arrayed in six rows or more are arrayed in such a manner that the first terminals in adjacent rows are deviated half pitch from each other.

11. The semiconductor device according to claim 10, wherein the first terminals arranged in six or more rows are arrayed at equal pitches in an advancing direction of the rows, but the pitch between adjacent rows is not equal.

12. The semiconductor device according to claim 11, wherein the advancing direction of the rows of the first terminals arrayed in six or more rows is a direction parallel to a side of the semiconductor chip.

13. The semiconductor device according to claim 12,
wherein the second type terminals are coupled electrically through the first vias to second terminals provided in the second wiring layer,
wherein the first type terminals, the second type terminals and the second terminals have each a circular plane shape, and
wherein the diameter of each of the second terminals is larger than the diameter of each of the second type terminals.

14. The semiconductor device according to claim 13, wherein two or more of the first lead-out lines do not pass between the first terminals adjacent each other in between adjacent rows of the first terminals arrayed in six or more rows.

15. The semiconductor device according to claim 14, wherein the second type terminals are not present in three outer periphery-side rows of the first terminals arrayed in six or more rows.

16. The semiconductor device according to claim 15, wherein the first lead-out terminals are coupled to the first type terminals belonging to the three outer periphery-side rows and extend toward an outer periphery of the wiring substrate from the first type terminals.

17. The semiconductor device according to claim 16, wherein three or more of the first lead-out terminals do not pass between the first terminals adjacent each other in the advancing direction of the rows within each of the rows of the first terminals arrayed in six or more rows.

18. The semiconductor device according to claim 17, wherein the second type terminals are present in inner periphery-side rows more inside than the three outer periphery-side rows of the first terminals arrayed in six or more rows.

19. The semiconductor device according to claim 18, wherein the first lead-out terminals coupled to the first type terminals belonging to the inner periphery-side rows more inside than the three outer periphery-side rows extend toward the inner periphery side of the wiring substrate from the first type terminals.

20. The semiconductor device according to claim 19, wherein in the first terminals arrayed in six or more rows, the first and second rows from the outer periphery side are in the second relation, the second and third rows from the outer periphery side are in the first relation, the third and fourth rows from the outer periphery side are in the first relation, and fourth and fifth rows from the outer periphery side are in the third relation, and in the fifth and subsequent rows from the outer periphery side adjacent rows satisfy both the second relation and the third relation.

21. The semiconductor device according to claim 20, wherein in the first terminals arrayed in six or more rows, the pitch between the second and third rows from the outer periphery side and the pitch between the third and fourth rows from the outer periphery side are each smaller than the pitch between the other adjacent rows.

22. The semiconductor device according to claim 21, wherein in three or more rows from the fourth row from the outer periphery side of the first terminals arrayed in six or more rows the first and second type terminals are arranged alternately in the advancing direction of the rows.

23. The semiconductor device according to claim 22, wherein in three or more rows from the fourth row from the outer periphery side of the first terminals arrayed in six or more rows the second type terminals are arranged side by side in an oblique direction relative to the advancing direction of the rows.

24. The semiconductor device according to claim 23,
wherein the second type terminals arranged side by side in the oblique direction relative to the advancing direction of the rows in three or more rows from the fourth row from the outer periphery side are coupled electrically through vias to the second terminals provided in the second wiring layer,
wherein second lead-out lines provided in the second wiring layer are coupled to the second terminals, and
wherein the second lead-out lines extend from the second terminals toward the outer periphery of the wiring substrate.

25. The semiconductor device according to claim 8,
wherein the second type terminals are coupled electrically through the first vias to second terminals provided in the second wiring layer, and
wherein the second terminals include third type terminals to which second lead-out terminals provided in the second wiring layer are coupled and fourth type terminals with second vias formed thereunder, the fourth type terminals being coupled electrically through the second vias to a third wiring layer underlying the second wiring layer.

26. The semiconductor device according to claim 8, further comprising a plurality of external terminals disposed over a third main surface of the wiring substrate on the side opposite to the first main surface, the external terminals being coupled electrically to the first terminals respectively,
wherein the first type terminals included in the first terminals are coupled electrically to the external terminals through the first lead-out lines, and
wherein the second type terminals included in the first terminals are coupled electrically to the external terminals through the first vias.

27. A method for manufacturing a semiconductor device, comprising the steps of:
(a) providing a wiring substrate having a first main surface with a plurality of first terminals disposed thereover and a semiconductor chip having a second main surface with a plurality of salient electrodes disposed thereover; and
(b) mounting the semiconductor chip over the first main surface of the wiring substrate through the salient electrodes and coupling the salient electrodes of the semiconductor chip electrically to the first terminals respectively of the wiring substrate;
wherein the wiring substrate provided in the step (a) has a plurality of wiring layers including a first wiring layer and a second wiring layer underlying the first wiring layer, the first terminals being provided in the first wiring layer,
wherein the first terminals are arrayed in six or more rows regularly in an advancing direction of the rows, the arrays of adjacent rows being deviated from each other,
wherein the first terminals include first type terminals to which first lead-out lines provided in the first wiring layers are coupled and second type terminals with first vias formed thereunder respectively, the second type terminals being coupled electrically to the second wiring layer through the first vias, wherein a row-to-row pitch of the first terminals arrayed in six or more rows is such that the pitch between adjacent rows which are in a second relation or a third relation is larger than the pitch between adjacent rows which are in a first relation, wherein in the adjacent rows which are in the first relation the first lead-out lines do not each pass between the first terminals adjacent each other in between the two adjacent rows, the second type terminals are not present in at least one of the two adjacent rows, wherein in the adjacent rows which are in the second relation the first lead-out lines each pass between the first terminals adjacent each other in between the two adjacent rows, and wherein in the adjacent rows which are in the third relation the second type terminals are present in both the two adjacent rows.

* * * * *